(12) United States Patent  
Manning et al.

(10) Patent No.: US 8,587,989 B2  
(45) Date of Patent: Nov. 19, 2013

(54) NRAM ARRAYS WITH NANOTUBE BLOCKS, NANOTUBE TRACES, AND NANOTUBE PLANES AND METHODS OF MAKING SAME

(75) Inventors: H. Montgomery Manning, Eagle, ID (US); Thomas Rueckes, Rockport, MA (US); Claude L. Bertin, Venice, FL (US); Jonathan W. Ward, Fairfax, VA (US); Garo Derderian, Manassas, VA (US)

(73) Assignee: Nantero Inc., Woburn, MA (US)

(*) Notice: Subject to any disclaimer, the term of this patent is extended or adjusted under 35 U.S.C. 154(b) by 720 days.

(21) Appl. No.: 12/486,602

(22) Filed: Jun. 17, 2009

(65) Prior Publication Data

US 2010/0001267 A1 Jan. 7, 2010

Related U.S. Application Data

(60) Provisional application No. 61/074,241, filed on Jun. 20, 2008.

(51) Int. Cl.  
*G11C 13/00* (2006.01)

(52) U.S. Cl.  
USPC .......................... 365/151; 365/148; 977/943

(58) Field of Classification Search  
USPC .................................. 365/148, 151; 977/943  
See application file for complete search history.

(56) References Cited

U.S. PATENT DOCUMENTS

| | | | |
|---|---|---|---|
| 4,527,181 A | 7/1985 | Sasaki | |
| 6,057,637 A | 5/2000 | Zettl et al. | |
| 6,128,214 A | 10/2000 | Kuekes et al. | |
| 6,256,767 B1 | 7/2001 | Kuekes et al. | |
| 6,277,318 B1 | 8/2001 | Bower et al. | |
| 6,314,019 B1 | 11/2001 | Kuekes et al. | |
| 6,342,276 B1 | 1/2002 | You | |
| 6,409,567 B1 | 6/2002 | Amey, Jr. et al. | |

(Continued)

FOREIGN PATENT DOCUMENTS

| GB | 2364933 | 2/2002 |
|---|---|---|
| JP | 2000-203821 | 7/2000 |

(Continued)

OTHER PUBLICATIONS

Ago, H.et al., "Workfunction of Purified and Oxidised Carbon Nanotubes," Synthetic Metals 103 (1999), 2494-2495.

(Continued)

*Primary Examiner* — Harry W Byrne  
*Assistant Examiner* — Lance Reidlinger  
(74) *Attorney, Agent, or Firm* — Nantero Inc.

(57) ABSTRACT

NRAM arrays with nanotube blocks, traces and planes, and methods of making the same are disclosed. In some embodiments, a nanotube memory array includes a nanotube fabric layer disposed in electrical communication with first and second conductor layers. A memory operation circuit including a circuit for generating and applying a select signal on first and second conductor layers to induce a change in the resistance of the nanotube fabric layer between the first and second conductor layers is provided. At least two adjacent memory cells are formed in at least two selected cross sections of the nanotube fabric and conductor layers such that each memory cell is uniquely addressable and programmable. For each cell, a change in resistance corresponds to a change in an informational state of the memory cell. Some embodiments include bit lines, word lines, and reference lines. In some embodiments, $6F^2$ memory cell density is achieved.

11 Claims, 47 Drawing Sheets

(56) References Cited

U.S. PATENT DOCUMENTS

| | | | |
|---|---|---|---|
| 6,423,583 | B1 | 7/2002 | Avouris et al. |
| 6,445,006 | B1 | 9/2002 | Brandes et al. |
| 6,495,116 | B1 | 12/2002 | Herman |
| 6,495,258 | B1 | 12/2002 | Chen et al. |
| 6,515,339 | B2 | 2/2003 | Shin |
| 6,528,020 | B1 | 3/2003 | Dai et al. |
| 6,548,841 | B2 | 4/2003 | Frazier et al. |
| 6,630,772 | B1 | 10/2003 | Bower et al. |
| 6,645,628 | B2 | 11/2003 | Shiffler, Jr. et al. |
| 6,706,402 | B2 | 3/2004 | Rueckes et al. |
| 6,707,098 | B2 | 3/2004 | Hofmann et al. |
| 6,759,693 | B2 | 7/2004 | Vogeli et al. |
| 6,806,840 | B2 | 10/2004 | Hung et al. |
| 6,808,746 | B1 | 10/2004 | Dai et al. |
| 6,809,465 | B2 | 10/2004 | Jin |
| 6,833,558 | B2 | 12/2004 | Lee et al. |
| 6,858,197 | B1 | 2/2005 | Delzeit |
| 6,863,942 | B2 | 3/2005 | Ren et al. |
| 6,899,945 | B2 | 5/2005 | Smalley et al. |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,924,538 | B2 | 8/2005 | Jaiprakash et al. |
| 6,946,410 | B2 | 9/2005 | French et al. |
| 6,990,009 | B2 | 1/2006 | Bertin et al. |
| 6,995,649 | B2 | 2/2006 | Nugent |
| 7,015,500 | B2 | 3/2006 | Choi et al. |
| 7,057,402 | B2 | 6/2006 | Cole et al. |
| 7,115,901 | B2 | 10/2006 | Bertin et al. |
| 7,115,960 | B2 | 10/2006 | Bertin et al. |
| 7,161,403 | B2 | 1/2007 | Bertin |
| 7,365,385 | B2 | 4/2008 | Abbott |
| 7,566,478 | B2 | 7/2009 | Ward et al. |
| 7,667,999 | B2 * | 2/2010 | Herner et al. ............. 365/148 |
| 7,745,894 | B2 * | 6/2010 | Asao et al. ............. 257/421 |
| 7,961,506 | B2 * | 6/2011 | Liu ............. 365/163 |
| 2001/0004979 | A1 | 6/2001 | Han et al. |
| 2001/0023986 | A1 | 9/2001 | Mancevski |
| 2002/0160111 | A1 | 10/2002 | Sun et al. |
| 2002/0175390 | A1 | 11/2002 | Goldstein et al. |
| 2003/0004058 | A1 | 1/2003 | Li et al. |
| 2003/0122111 | A1 | 7/2003 | Glatkowski |
| 2003/0177450 | A1 | 9/2003 | Nugent |
| 2003/0200521 | A1 | 10/2003 | DeHon et al. |
| 2004/0005723 | A1 | 1/2004 | Empedocles et al. |
| 2004/0007528 | A1 | 1/2004 | Bakajin et al. |
| 2004/0023253 | A1 | 2/2004 | Kunwar et al. |
| 2004/0041154 | A1 | 3/2004 | Watanabe et al. |
| 2004/0043527 | A1 | 3/2004 | Bradley et al. |
| 2004/0071949 | A1 | 4/2004 | Glatkowski et al. |
| 2004/0099438 | A1 | 5/2004 | Arthur et al. |
| 2004/0104129 | A1 | 6/2004 | Gu et al. |
| 2004/0181630 | A1 | 9/2004 | Jaiprakash et al. |
| 2004/0253167 | A1 | 12/2004 | Silva et al. |
| 2004/0265550 | A1 | 12/2004 | Glatkowski et al. |
| 2005/0053525 | A1 | 3/2005 | Segal et al. |
| 2005/0056877 | A1 | 3/2005 | Rueckes et al. |
| 2005/0095938 | A1 | 5/2005 | Rosenberger et al. |
| 2006/0237537 | A1 | 10/2006 | Empedocles et al. |
| 2006/0267537 | A1 | 11/2006 | Baumann et al. |
| 2007/0004191 | A1 | 1/2007 | Gu et al. |
| 2007/0268742 | A1 | 11/2007 | Liu |
| 2008/0070162 | A1 | 3/2008 | Ufert |

FOREIGN PATENT DOCUMENTS

| | | |
|---|---|---|
| JP | 2001-035362 | 2/2001 |
| JP | 2004-090208 | 3/2004 |
| WO | WO-98/39250 | 9/1998 |
| WO | WO-99/65821 A1 | 12/1999 |
| WO | WO-00/48195 | 8/2000 |
| WO | WO-0103208 | 1/2001 |
| WO | WO-02/45113 A1 | 6/2002 |
| WO | WO-0248701 | 6/2002 |
| WO | WO-03/016901 | 2/2003 |
| WO | WO-03/034142 | 4/2003 |

OTHER PUBLICATIONS

Ajayan, P.I M.et al., "Applications of Carbon Nanotubes." Topics in Applied Physics, vol. 80, pp. 391-425, 2001.

Avouris, P. et al., "Carbon nanotube electronics," Chemical Physics (2002) 429-445.

Bachtold, A. et al., "Logic circuits based on carbon nanotubes," Physica E 16 (2003) 42-46.

Banerjee, Sarbajit and Stanislaus S. Wong. "Functionalization of Carbon Nanotubes with a Metal-Containing Molecular Complex." Nano Letters (2001); 0, A-E.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. et al., "Monodisperse Multiwall Carbon Nanotubes Obtained with Ferritin as Catalyst," Nano Letters, 2002, vol. 2, No. 6, 665-667.

Cassell, Alan M. et al. "Large Scale CVD Synthesis of Single-Walled Carbon Nanotubes." American Chemical Society, pp. 6484-6492, 1999.

Chen, B., et al., "Heterogeneous Single-Walled Carbon Nanotube Catalyst Discovery and Optimization." Chem. Mater., vol. 14, pp. 1891-1896, 2002.

Cheng, H.M. et al., "Large-scale and low-cost snythesis of single-walled carbon nanotubes by the catalytic pyrolysis of hydrocarbons," Applied Physics Letters, vol. 72, No. 25, Jun. 22, 1998, pp. 3283-3284.

Chen, J. et al., "Self-aligned carbon nanotube transistors with charge transfer doping," Applied Physics Letters 86, 123108 (2005).

Chen, J. et al., "Self-aligned Carbon Nanotube Transistors with Novel Chemical Doping," IEEE 2004, pp. 29.4.1-29.4.4.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

International Search Report and Written Opinion for corresponding International Patent Application No. PCT/US2009/047683, Aug. 3, 2009.

Dai, H. et al, "Controlled Chemical Routes to Nanotube Architectures, Physics and Devices," *J. Phys. Chem. B*, Dec. 7, 1999, vol. 103, pp. 111246-111255.

Delzeit et al., "Mulilayered Metal Catalysts for Controlling the Density of Single-Walled Carbon Nanotubes Growth," Chemical Physics Letters, vol. 348, pp. 368-374, Nov. 16, 2001.

Derycke, V. et al., "Carbon Nanotube Inter- and Intramolecular Logic Gates," Nano Letters, vol. 1, No. 9, Sep. 2001, pp, 453-456.

Derycke, V. et al., "Controlling doping and carrier injection in carbon nanotube transistors," Applied Physics Letters, vol. 80, No. 15, Apr. 15, 2002, 2773-2775.

Desai et al., "Freestanding Carbon Nanotube Specific Fabrication", *Proc. of 2005, 5th IEEE Conf., Nanotech*, Nagoya, Japan, pp. 1-4, Jul. 2005.

Duan, X. et al., "Nonvolatile Memory and Programmable Logic from Molecular-Gated Nanowires," Nano Letters, xxxx, vol. 0, No. 0, A-D, 2002.

Franklin, N. R. et al, "An Enhanced CVD Approach to Extensive Nanotube Networks with Directionality", Advanced Materials, pp. 890-894, 2002.

Haddon et al., "Purification and Separation of Carbon Nanotubes," MRS Bulletin, pp. 252-259, Apr. 2004.

Hafner, J. H. et al., "Catalytic growth of single-wall carbon nanotubes from metal particles", Chemical Physics Letters, vol. 296, pp. 195-202, Oct. 30, 1998.

Heinze, S. et al., "Carbon Nanotubes as Schottky Barrier Transistors," Physical Review Letters, vol. 89, No. 10, Sep. 2, 2002, pp. 106801-1-106801-4.

(56) References Cited

OTHER PUBLICATIONS

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-L91, 2002.

Huang, Y. et al., "Logic Gates and Computation from Assembled Nanowire Building Blocks," Science, vol. 294, Nov. 9, 2001, pp. 1313-1317.

Javey, A. et al., "Carbon Nanotube Field-Effect Transistors with Integrated Ohmic Contacts and High-κ Gate Dielectrics," Nano Letters, 2004, vol. 4, No. 3, pp. 447-450.

Javey, A. et al., "Carbon Nanotube Transistor Arrays for Multistage Complementary Logic and Ring Oscillators," Nano Letters, xxxx, vol. 0, No. 0, A-D, 2002.

Javey, A. et al., "High-κ dielectrics for advanced carbon-nanotube transistors and logic gates," Nature Materials, vol. 1, Dec. 2002, pp. 241-246.

Jeong et al., "A New Purification Method of Single-Wall Carbon Nanotubes Using H2S and O2 Mixutre Gas," chemical Physics Letters, vol. 344, pp. 18-22, Aug. 17, 2001.

Joselevich, Ernesto, et al., "Vectorial Growth of Metallic and Semiconducting Single-Wall Carbon Nanotubes" vol. 0, No. 0, A-E, Aug. 13, 2002.

Kahn, Michael G. C., et al., "Solubilization of Oxidized Single-Walled Carbon Nanotubes in Organic and Aqueous Solvents through Organic Derivation" (2002) 2(11) 1215-1218.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors", Science, vol. 287, pp. 622-625, Jan. 28, 2000.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 12, p. 1008, 2001.

Lin, Y. et al., "Novel Carbon Nanotube FET Design with Tunable Polarity," IEEE 2004, pp. 29.2.1-29.2.4.

Martel, R. et al., "Carbon Nanotube Field-Effect Transistors and Logic Circuits," DAC 2002, Jun. 10-14, 2002, New Orleans, Lousiana, USA.

Nerushev, O. A., et al., "Carbon nanotube films obtained by thermal chemical vapour deposition", J. Mater. Chem., vol. 11, pp. 1122-1132, 2001.

Niu, C. et al., "High power electrochemical capacitors based on carbon nanotube electrodes," Appl. Phys. Lett. 70 (11), Mar. 17, 1997.

Onoa et al., "Bulk Production of Singly Dispersed Carbon Nanotubes with Prescribed Lengths", Nanotechnology, vol. 16, p. 2799-2803, 2005.

Parikh, K. et al., "Flexible vapour sensors using single walled carbon nanotubes", Sensors and Actuators B, vol. 113, pp. 55-63, 2006.

Peigney, A. et al. "A Study of the Formation of Single- and Double-Walled Carbon Nanotubes by a CVD Method", Journal of Physical Chemistry B, vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Radosavljevic, M. et al., "Nonvolatile Molecular Memory Elements Based on Ambipolar Nanotube Field Effect Transistors," Nano Letters 2002, vol. 2, No. 7, pp. 761-764.

Rueckes, T. et al., "Carbon Nanotube-Based Nonvolatile Random Access Memory for Molecular Computing," Science, vol. 289, Jul. 7, 2000, pp. 94-97.

Shelimov, Konstantin B., et al., "Purification of single-wall carbon nanotubes by ultrasonically assisted filtration" Chemical Physics Letters (1998) 282: 429-434.

Sotiropoulou, S. et al., "Carbon nanotube array-based biosensor", Anal Bioanal Chem, vol. 375, pp. 103-105, 2003.

Valentini, L. et al., "Sensors for sub-ppm $NO_2$ gas detection based on carbon nanotube thin films", Applied Physics Letters, vol. 82, No. 6, pp. 961-963, Feb. 10, 2003.

Wind, S. et al., "Fabrication and Electrical Characterization of Top Gate Single-Wall Carbon Nanotube Field-Effect Transistors," IBM T.J. Watson Research Center, 2002, 14 pages.

Wind, S.J. et al., "Vertical scaling of carbon nanotube field-effect transistors using top-gate electrodes," Applied Physics Letters, vol. 80, No. 20, May 20, 2002, pp. 3817-3819.

Zhang, Y. et al. "Metal coating on suspended carbon nanotubes and its implication to metal-tube interaction." Chemical Physics Letters (Nov. 24, 2000): 35-41.

Zhang, Y., "Formation of metal nanowires on suspended single-walled carbon nanotubes," Applied Physics Letters. Nov. 6, 2000, vol. 77, pp. 3015-3017.

Zhang, Z. et al.,"Select Pathways to Carbon Nanotube Film Growth", Advanced Materials, 4 pages, Jun. 19, 2001.

Zhao, Y.-P. et al. "Frequency-dependent electrical transport in carbon nanotubes." Physical Review B (2001); 64, 201402(4).

\* cited by examiner

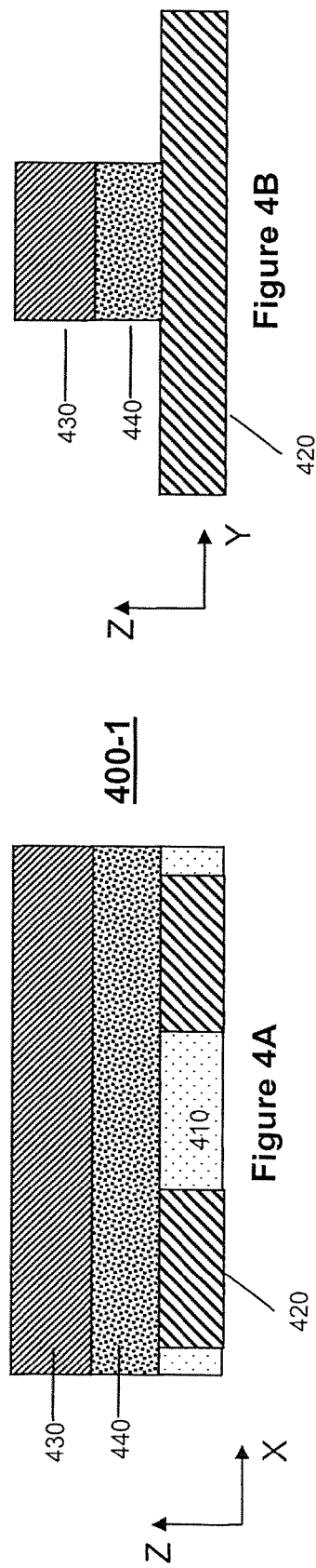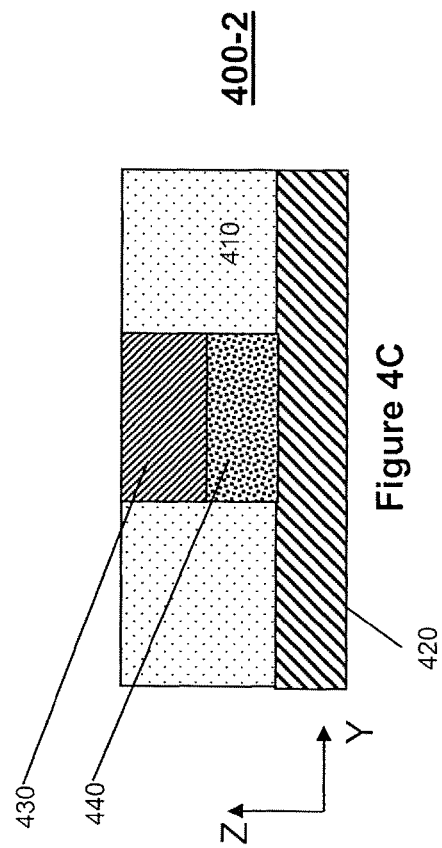

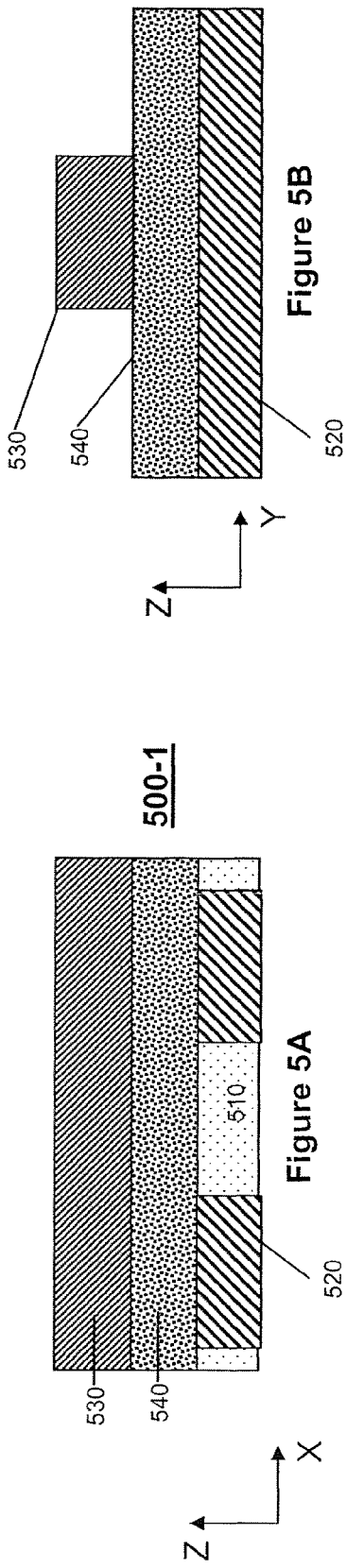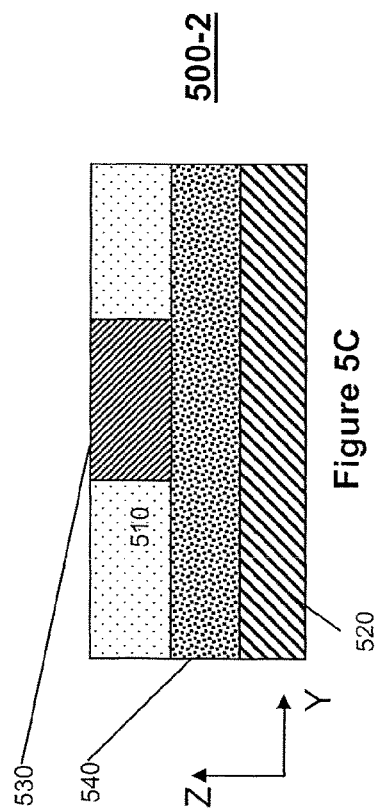

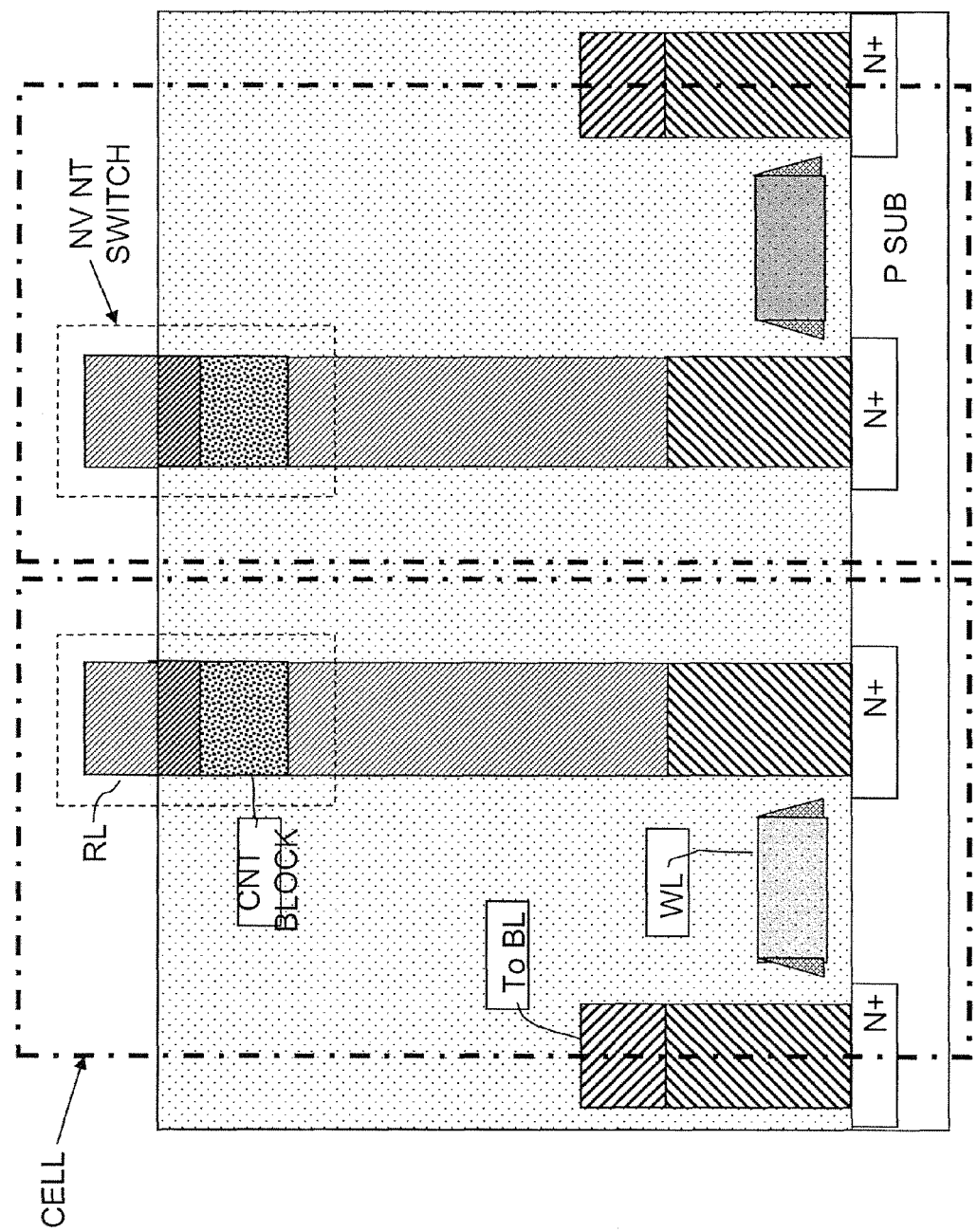

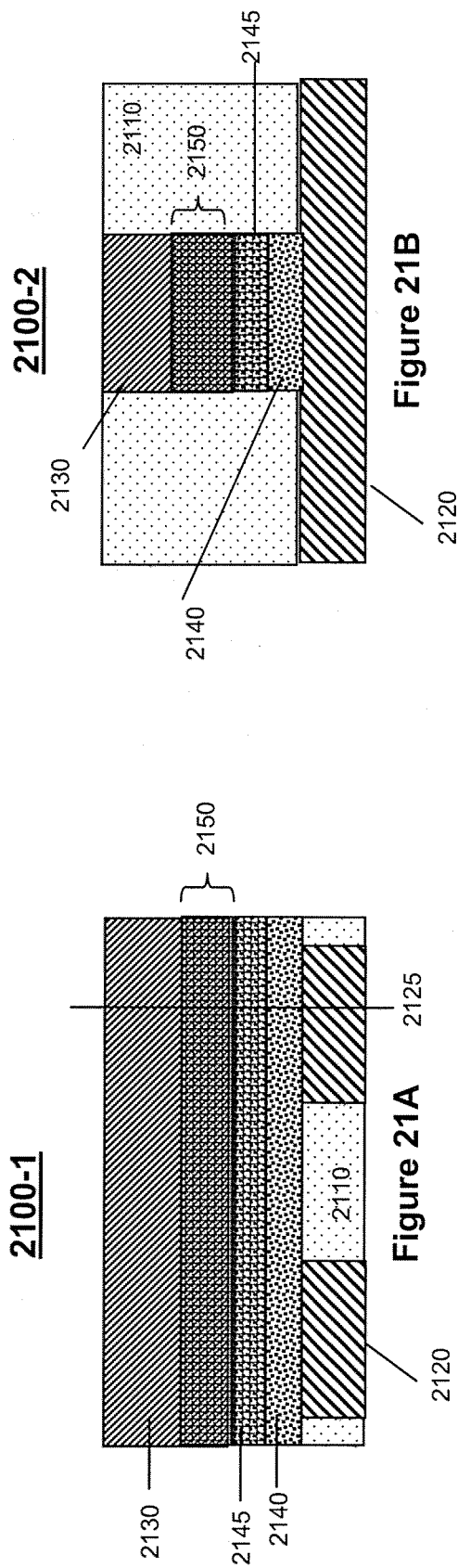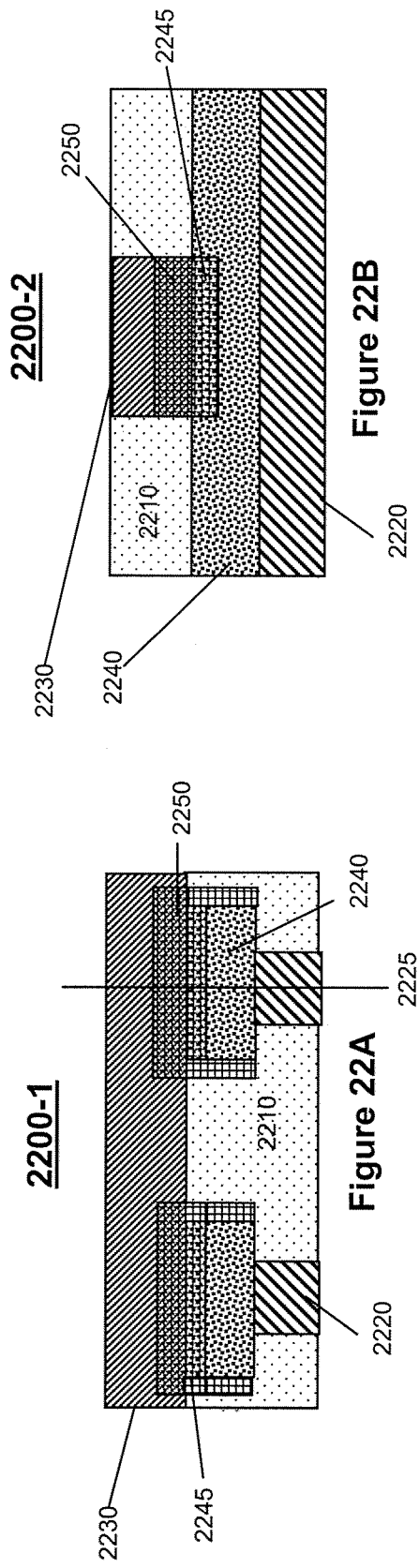

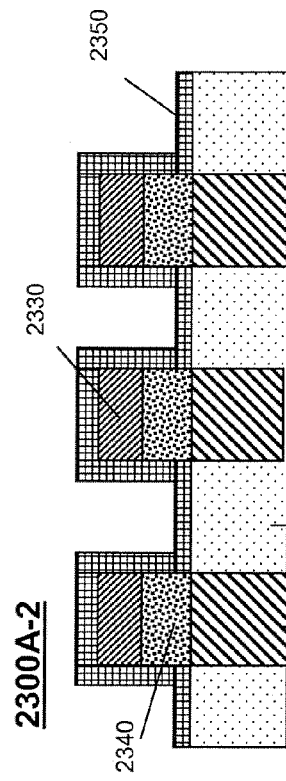
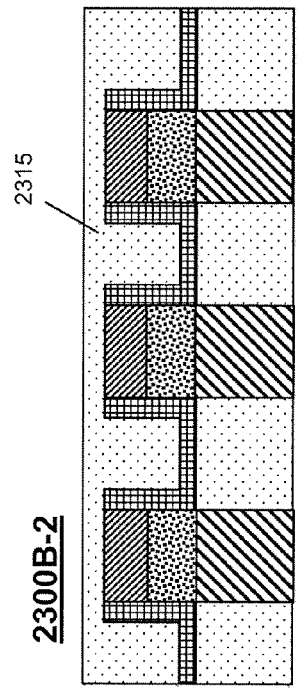
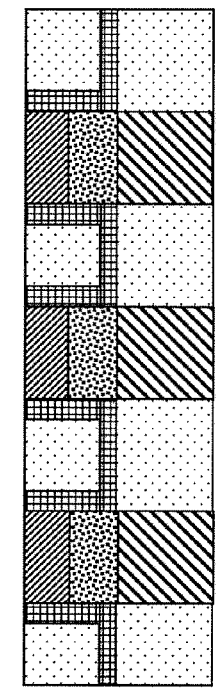
Figure 23A(1)  Figure 23A(2)
Figure 23B(1)  Figure 23B(2)
Figure 23C(1)  Figure 23C(2)

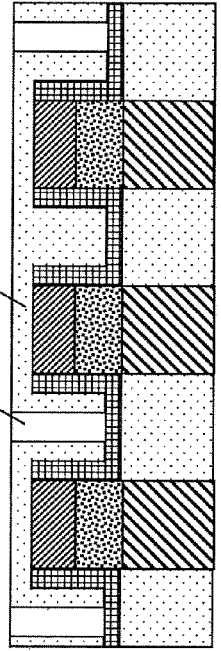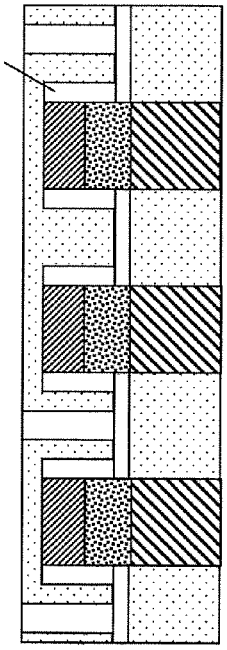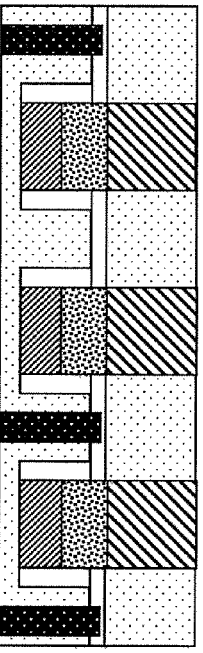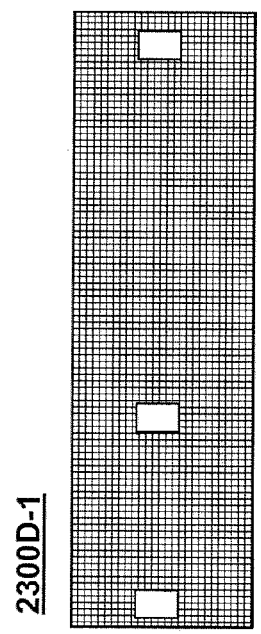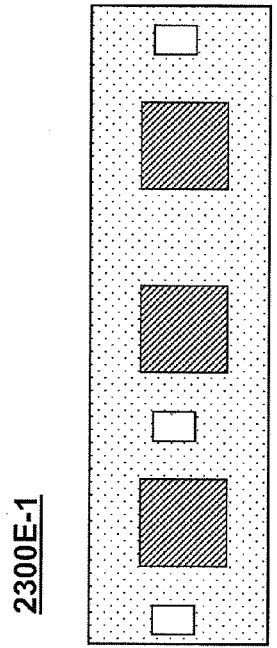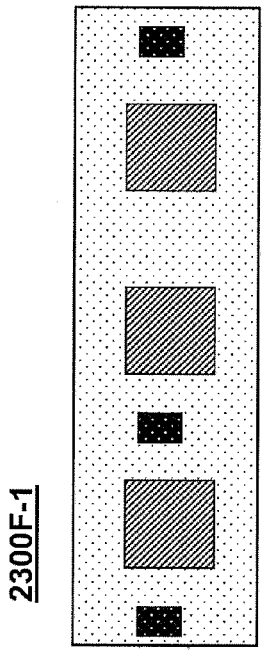

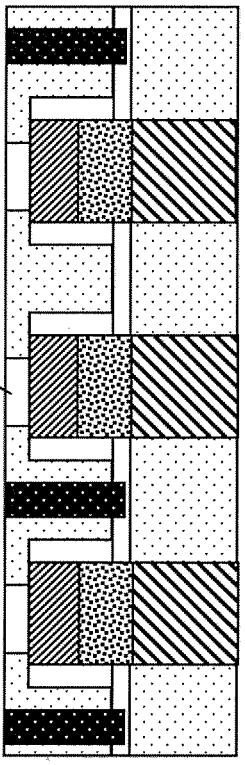
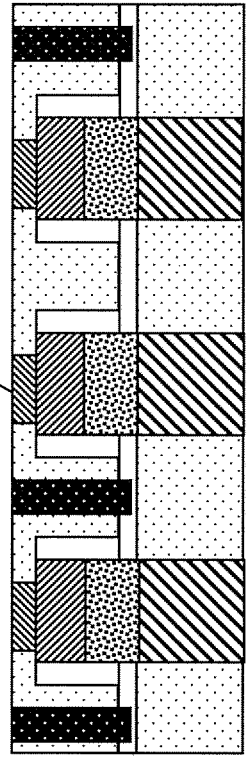
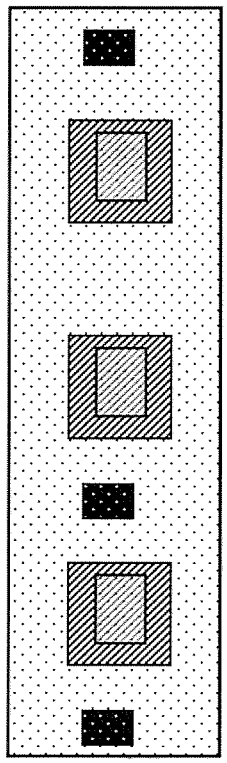
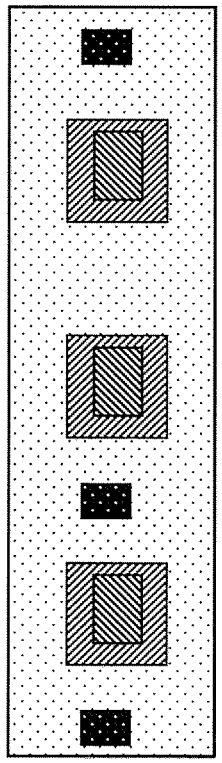

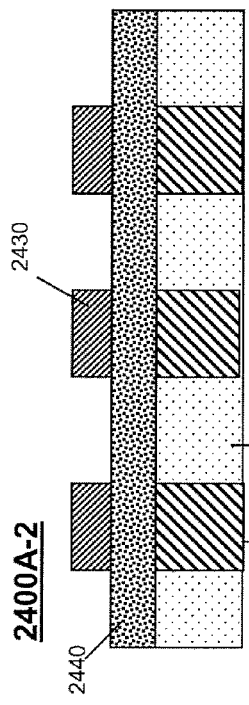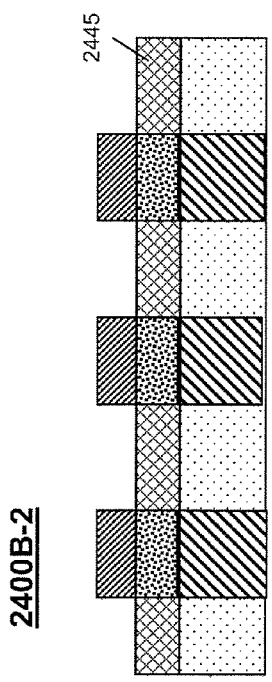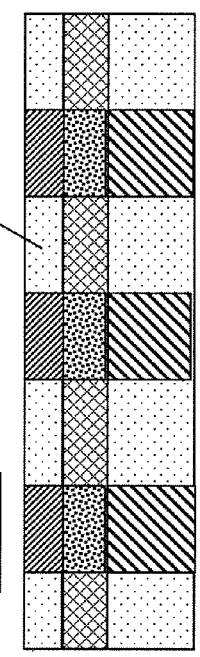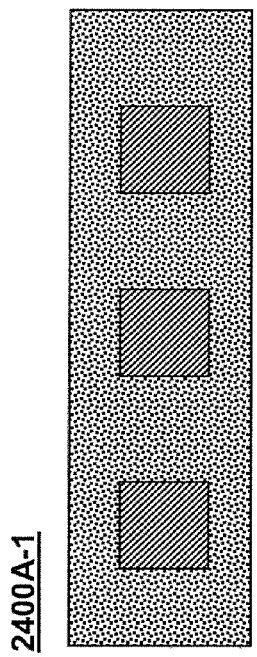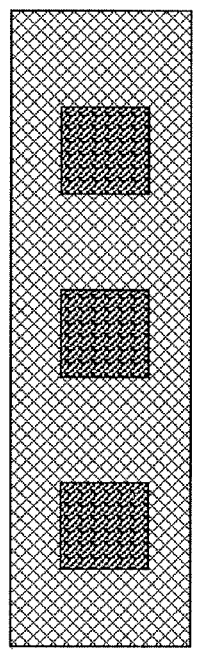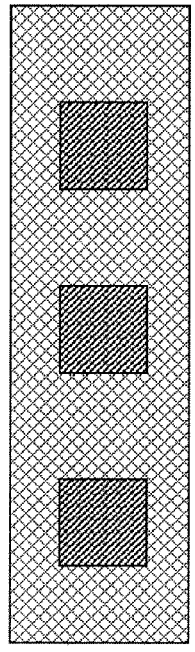

NRAM ARRAYS WITH NANOTUBE BLOCKS, NANOTUBE TRACES, AND NANOTUBE PLANES AND METHODS OF MAKING SAME

CROSS REFERENCE TO RELATED APPLICATIONS

This application claims priority under 35 U.S.C. §119(e) to U.S. Provisional Patent Appl. No. 61/074,241, filed on Jun. 20, 2008, entitled NRAM Arrays with Nanotube Blocks, Nanotube Traces, and Nanotube Planes and Methods of Making Same, which is herein incorporated by reference in its entirety.

This application is related to the following applications, all of which are incorporated herein by reference in their entireties:

U.S. Pat. No. 6,706,402, filed 23 Apr. 2002, entitled Nanotube Films and Articles;

U.S. Pat. No. 6,835,591, filed 23 Apr. 2002, entitled Methods of Nanotube Films and Articles;

U.S. patent application Ser. No. 11/280,786, filed 15 Nov. 2005, entitled Two-Terminal Nanotube Devices and Systems and Methods of Making Same;

U.S. patent application Ser. No. 11/274,967, filed 15 Nov. 2005, entitled Memory Arrays Using Nanotube Articles with Reversible Nanoswitches;

U.S. patent application Ser. No. 11/835,583, filed 8 Aug. 2007, entitled Latch Circuits and Operation Circuits Having Scalable Nonvolatile Nanotube Switches as Electronic Fuse Replacement Elements;

U.S. patent application Ser. No. 11/835,612, filed 8 Aug., 2007, entitled Nonvolatile Resistive Memories Having Scalable Two-Terminal Nanotube Switches;

U.S. patent application Ser. No. 11/835,865, filed 8 Aug., 2007, entitled Nonvolatile Nanotube Diodes and Nonvolatile Nanotube Blocks and Systems Using Same and Methods of Making Same;

U.S. patent application Ser. No. 11/835,613, filed 8 Aug., 2007, entitled Memory Elements and Cross Point Switches and Arrays of Same Using Nonvolatile Nanotube Blocks; and U.S. patent application Ser. No. 12/274,033, filed 19 Nov., 2008, entitled Improved Switching Materials Comprising Mixed Nanoscopic Particles and Carbon Nanotubes and Method of Making and Using Same.

BACKGROUND

1. Technical Field

This invention relates generally to carbon nanotube blocks, traces, layers and articles, and in particular to memory circuits using carbon nanotube blocks, traces, layers and articles.

2. Discussion of Related Art

There is an ever-increasing demand for ever-denser memories that enable larger memory functions, both stand alone and embedded, ranging from 100's of kbits to memories in excess of 1 Gbit. These required larger memories require increasingly higher densities, sold in increasing volumes, and at lower cost per bit, are operating at higher speed and dissipating less power. These requirements challenging the semiconductor industry to rapidly reduce geometries using improved process features. Increased memory density requires smaller cells which include smaller select transistors and smaller storage nodes. Power dissipation per bit is reduced by using smaller cell sizes. Such demands may drive photolithography technology to smaller line and spacing dimensions with corresponding improved alignment between layers, improved process features/structures such as smaller transistors and storage elements, but also including increased chip size required to accommodate larger memory function, or combined memory and logic function. Sensitivity to smaller defect size increases due to the smaller geometries, while overall defect densities must be significantly reduced.

When transitioning to a new denser technology node, lithography and corresponding process changes typically result in insulator and conductor dimensional reduction of 0.7× in the X and Y directions, or an area reduction of 2× for logic circuits and memory support circuits. Process features unique to the memory cell are typically added, resulting in an additional typical 0.7× area reduction beyond the area reduction resulting from photolithographic improvements, such that the memory cell achieves a cell area reduction of approximately 2.8×. In DRAMs, for example, a process feature change such as a buried trench or stacked storage capacitor is introduced with corresponding optimized cell contact means between one capacitor plate and the source of a cell select field effect transistor (FET) formed in the semiconductor substrate. The tradeoffs described with respect to DRAM memories are similar to those for other memory types such as EPROM, EEPROM, and Flash.

Memory efficiency is determined by comparing the bit storage area and the corresponding overhead of the support circuit area. Support circuit area is minimized with respect to array storage area. For 2-D memories, that is memories in which a cell select transistor is formed in a semiconductor substrate, for a transition to a denser new technology node (technology generation) the bit area may be reduced by more than the support circuit area as illustrated further above with respect to a memory example where the bit area is reduced by 2.8× while the support circuit area is reduced by 2×. In order to preserve memory efficiency, memory architecture may be changed such that larger sub-arrays are fabricated, that is sub-arrays with more bits per word line and more bits per bit line. In order continue to improve memory performance while containing power dissipation, new memory architectures use global and local (segmented) word line and global and local (segmented) bit line architectures to accommodate larger sub-arrays with more bits per word and bit lines as described for example in U.S. Pat. No. 5,546,349, the entire contents of which are incorporated herein by reference.

In addition to the growth in memory sub-array size, chip area may grow as well. For example, if the memory function at a new technology node is to have 4× more bits, then if the bit area reduction is 2.8×, chip area growth will be at least 1.4-1.5×.

Continuing with the memory example described above, if the chip area of a memory at the present technology node is 60% bit area array and 40% support circuit area, if chip architecture is not changed, and if bit area efficiency for a new technology node is improved by 2.8× while support circuit layout is improved by 2×, then bit area and support circuit areas will both be approximately 50% of chip area. Architecture changes and circuit design and layout improvements to increase the number of bits per word and bit lines, such as global and local segmented word and bit lines described in U.S. Pat. No. 5,546,349, incorporated by reference, may be used to achieve 60% bit area and 40% support circuits for a new 4× larger memory function chip design at a new technology node. However, the chip area will be 1.4× to 1.5× larger for the 4× the memory function. So for example, if the present chip area is 100 mm$^2$, then the new chip area for a 4× larger memory will be 140 to 150 mm$^2$; if the present chip area is 70 mm$^2$, then the new chip area for a 4× larger memory function will be at least 100 mm$^2$.

From a fabrication (manufacturing) point of view, transition to high volume production of a new 4× larger memory function at a new technology node does not occur until the cost per bit of the new memory function is competitive with that of the present generation. Typically, at least two and sometimes three new chips are designed with incremental reductions in photolithographic linear dimensions (shrinks) of 10 to 15% each, reducing chip area of the 4× memory function to 100 mm$^2$ or less to increase the number of chips per wafer and reduce the cost per bit of memory to levels competitive with the present generation memory.

Roesner, U.S. Pat. No. 4,442,507, the entire contents of which are incorporated herein by reference, discloses a one-time-programmable (OTP) field-programmable memory using a 3-dimensional (3-D) memory cell and corresponding process, design, and architecture to replace the 2-dimensional (2-D) memory approach of increasing chip area while reducing individual component size (transistors) and interconnections for each new generation of memory. U.S. Pat. No. 4,442,507 illustrates an EPROM (one-time-programmable) memory having a 3-D EPROM array in which cell select devices, storage devices, and interconnect means are not fabricated in or on a semiconductor substrate, but are instead formed on an insulating layer above support circuits formed in and on a semiconductor substrate with interconnections between support circuits and the 3-D EPROM memory array. Such a 3-D memory approach significantly reduces lithographic and process requirements associated with denser larger memory function.

While U.S. Pat. No. 4,442,507 introduces the concept of 3-D EPROM memory arrays having all cell components and interconnections decoupled from a semiconductor substrate, and above support circuits, the approach is limited to OTP memories.

U.S. Pat. No. 5,670,803, the entire contents of which are incorporated herein by reference, to co-inventor Bertin, discloses a 3-D SRAM array structure with simultaneously defined sidewall dimensions. This structure includes vertical sidewalls simultaneously defined by trenches cutting through multiple layers of doped silicon and insulated regions in order avoid (minimize) multiple alignment steps. These trenches cut through multiple semiconductor and oxide layers and stop on the top surface of a supporting insulator (SiO$_2$) layer between the 3-D SRAM array structure and an underlying semiconductor substrate. U.S. Pat. No. 5,670,803 also teaches in-trench vertical local cell interconnect wiring within a trench region to form a vertically wired 3-D SRAM cell. U.S. Pat. No. 5,670,803 also teaches through-trench vertical interconnect wiring through a trench region to the top surface of a 3-D SRAM storage cell that has been locally wired within a trench cell.

Digital logic circuits are used in a wide variety of applications. Digital logic circuits include logic and memory functions that may be stand-alone or may be combined (integrated) on the same chip. Ever-increasing amounts of logic and memory are required. Important characteristics for logic circuit design are short time-to-market, brief error-free design cycles, and the ability to modify logic functions in a field environment to better match application requirements. Cross point switch matrices have been useful in meeting such these requirements. However, cross point switch matrix densities need to be higher and ease of integration needs to be improved.

Integrated circuits constructed from either bipolar or FET switching elements are typically volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Pat. No. 6,919,592, entitled "Electromechanical Memory Array Using Nanotube Ribbons and Method for Making Same" discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon includes one or more nanotubes. The ribbons are typically formed from selectively removing material from a layer or matted fabric of nanotubes.

For example, as disclosed in U.S. Pat. No. 6,919,592, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As disclosed in U.S. Pat. No. 6,911,682, entitled "Electromechanical Three-Trace Junction Devices," three-trace architectures may be used for electromechanical memory cells, in which the two of the traces are electrodes to control the deflection of the ribbon.

The use of an electromechanical bi-stable device for digital information storage has also been suggested (See U.S. Pat. No. 4,979,149, entitled "Non-volatile Memory Device Including a Micro-Mechanical Storage Element", the entire contents of which are herein incorporated by reference).

The creation and operation of bi-stable, nano-electro-mechanical switches based on carbon nanotubes (including mono-layers constructed thereof) and metal electrodes has been detailed in earlier patent applications having a common assignee as the present application, for example in the incorporated patent references listed below.

SUMMARY

The invention provides NRAM arrays with nanotube blocks, nanotube trace, and nanotube planes and methods of making the same.

Under one aspect, a nanotube memory array includes a substrate, a first conductor layer disposed on the substrate, the first conductor layer having a defined pattern, and a nanotube fabric layer disposed over and in electrical communication with the first conductor layer. The array further includes second conductor layer disposed over, and in electrical communication with the nanotube fabric layer and a memory operation circuit including a circuit for generating and applying a select signal on the second and first conductor layers to induce a change in the resistance of the nanotube fabric layer between the second and first conductor layers. At least two adjacent memory cells are formed in at least two selected cross sections of the first conductor layer, nanotube fabric layer, and second conductor layer such that each memory cell is uniquely addressable and programmable by said memory operation circuit. For each memory cell, a change in the resistance between second and first conductor layers corresponds to a change in an informational state of the memory cell.

One or more embodiments include one or more of the following features. The first conductor layer comprises a plurality of substantially parallel first conductive traces and the second conductor layer comprises a plurality of substantially parallel second conductive traces. The first conductive traces and the second conductive traces are orthogonally disposed with respect to one another. The first conductive traces and the second conductive traces are non-orthogonally disposed with respect to another. The nanotube fabric layer comprises a plurality of patterned nanotube blocks, each nanotube block interposed between and positioned at a corresponding intersection of one first conductive trace and one second conductive trace.

One or more embodiments include one or more of the following features. The nanotube fabric layer and the second conductor layer are conformally disposed and have a corresponding defined pattern. The nanotube fabric layer and the second conductor layer form a conductor-on-nanotube trace. The nanotube fabric layer and the second conductor layer form a conductor-on-nanotube plane. The defined pattern of the first conductor layer comprises an array of discrete first electrodes. The memory operation circuit comprises select diodes, each discrete first electrode disposed over and in electrical communication with a select diode. The defined pattern of the first conductor layer comprises a plurality of traces.

One or more embodiments include one or more of the following features. The change in resistance of the nanotube fabric layer comprises a change between a first resistance state and a second resistance state, the first resistance state being a substantially higher resistance than the second resistance state. The first resistance state comprises a first information state and the second resistance state comprises a second information state. For said at least two adjacent memory cells, a change of resistance in a first memory cell is substantially unaffected by a change of resistance in a second memory cell. The nanotube fabric layer comprises a plurality of unaligned nanotubes providing a plurality of conductive pathways through the nanotube fabric layer. The first conductor layer is partially embedded in the substrate.

Under another aspect, a memory array includes a plurality of memory cells, each memory cell receiving a bit line, a word line, and a reference line, each memory cell having a first electrode in electrical communication with said bit line. A nanotube article is electrically interposed between at least one first electrode and at least one reference line corresponding to the plurality of memory cells. A memory operation circuit is in electrical communication with the bit line, the word line, and the reference line of each cell to activate a selected cell. The operation circuit includes circuitry to program an informational state in at least a portion of the nanotube article, the circuitry applying electrical stimulus to at least one of the bit line, word line, and reference line, in which said electrical stimulus changes the resistance of at least a portion of the nanotube article between the first electrode and reference line. A relatively high resistance of the nanotube article corresponds to a first informational state of the memory cell and a relatively low resistance of the nanotube article corresponds to a second informational state of the memory cell.

One or more embodiments include one or more of the following features. Each of the bit line, word line and reference line comprise traces having a width defined as F and the memory array has a density of $6F^2$. Each of the reference lines corresponding to the plurality of memory cells is substantially parallel to each of the word lines corresponding to the plurality of memory cells. Each of the reference lines corresponding to the plurality of memory cells is substantially parallel to each of the bit lines corresponding to the plurality of memory cells. Each of the bit lines corresponding to the plurality of memory arrays is substantially orthogonal to each of the word lines corresponding to the plurality of memory cells. Each of the bit lines corresponding to the plurality of memory arrays is positioned at a substantially non-orthogonal angle with respect to each of the word lines corresponding to the plurality of memory cells. The selected angle is approximately 76 degrees.

One or more embodiments include one or more of the following features. The nanotube article comprises a plurality of nanotube blocks, each block corresponding to a memory cell, each block programmable with an informational state. The nanotube article comprises a plurality of nanotube traces and each reference line is substantially conformally disposed over and aligned with a corresponding nanotube trace. A region of each nanotube trace corresponds to a memory cell, the region programmable with said informational state. The nanotube article comprises a nanotube plane disposed over the word lines and the bit lines corresponding to the plurality of memory cells. Each reference line includes a trace conformally disposed over a portion of the nanotube plane such that each of a plurality of regions of the nanotube plane corresponding to the plurality of memory cells is programmable with an information state. The reference line comprises a conductor plane disposed over and conformally to the nanotube plane and a plurality of regions of the nanotube plane corresponding to the plurality of memory cells is each programmable with said information state. For each memory cell, the region is the portion of the nanotube plane disposed over the corresponding first electrode.

One or more embodiments include one or more of the following features. The first and second informational states are nonvolatile. The resistance of the relatively high resistance state is several times greater than the relatively low resistance state. The array further includes a cell selection circuit for each memory cell, the cell selection circuit electrically interposed between the first electrode and the bit line.

The cell selection circuit includes a transistor with a gate, a source, and a drain, and wherein the gate is in electrical contact with the first word line, the source is in electrical contact with the first electrode, and the drain is in electrical contact with the bit line. The operation circuit reads an informational state of the memory cell by activating one of the bit line and the word line and applying a read stimulus to the bit line.

One or more embodiments include one or more of the following features. The first electrode comprises at least one of metallic carbon nanotubes, Ti, TiN, Al, Ta, TaN, Cu, Ru, RuO, Pd, Co, $CoSi_x$, Ni, $NiSi_x$, $TiSi_x$, Si, Pt, $PtSi_x$, Au, Ag, and combinations thereof. An intermediate resistance of the nanotube article corresponds to a third informational state of the memory cell. The nanotube article is disposed over the bit lines. The bit lines are disposed over the nanotube article.

Under another aspect, a method of making a memory array includes providing a plurality of bit lines and word lines and providing a plurality of first electrodes, each first electrode in communication with a bit line and each corresponding to a memory cell. The method includes forming a nanotube fabric over and in electrical communication with the first electrodes, the nanotube fabric comprising a network of unaligned nanotubes, and providing a reference article over and in electrical communication with the nanotube fabric. The method includes providing a memory operation circuit in electrical communication with the bit line, the word line, and the reference article to activate one or more selected memory cells. The operation circuit includes circuitry to program an informational state in at least a portion of the nanotube fabric by applying electrical stimulus to at least one of the bit line, word line, and reference article, in which said electrical stimulus changes the resistance of at least a portion of the nanotube fabric between the first electrode and reference article. A relatively high resistance in said portion of the nanotube fabric corresponds to a first informational state of the memory cell in the array. A relatively low resistance of the nanotube article corresponds to a second informational state of the memory cell in the array.

One or more embodiments include one or more of the following features. Each bit line and each word line is patterned to have a width of F and wherein the memory array has a density of $6F^2$. A selected portion of the memory array is active and a selected portion of the memory array is inactive. The inactive portion of the memory array includes memory cells in which an informational state is not programmed into corresponding portions of the nanotube fabric. The patterned reference article comprises a plurality of reference lines, the reference lines substantially parallel to either the bit lines or the word lines. The patterned reference article comprises a reference electrode plane carrying a single reference voltage. The method further includes patterning the nanotube fabric and the reference article to form conductor-on-nanotube traces. The conductor-on-nanotube traces are substantially parallel to either the bit lines or the word lines. The method further includes patterning the nanotube fabric into a plurality of nanotube blocks, each nanotube block corresponding to a memory cell. The method further includes embedding the first electrodes and the nanotube fabric in an insulating substrate. Providing a plurality of first electrodes includes forming a plurality of semiconductor devices, the first electrodes being one node of the semiconductor devices. The semiconductor devices are MOS access devices. The semiconductor devices are select diodes.

One or more embodiments include one or more of the following features. The nanotube fabric is disposed over the bit lines. The bit lines are disposed over the nanotube fabric. A protective material is applied over an external surface of the nanotube fabric to protect the nanotube fabric during one or more fabrication steps, the protective material comprising at least one of silicon dioxide, silicon nitride, hafnium oxide, zirconium oxide, and aluminum oxide, amorphous silicon, W, Al, Ti, TiN, Ta, spin-on-glasses (SOGs), thermally decomposed polymers, and photoresists. Forming the nanotube fabric further includes forming a nanoparticle layer, the nanoparticle layer selected to adjust the resistance of at least a portion of the nanotube fabric between the first electrode and reference article. The nanoparticle layer comprises at least one of amorphous carbon, alumina, bismuth, cadmium, selenide, gallium nitride, gold, gallium phosphide, germanium, silicon, indium phosphide, magnesium oxide, manganese oxide, nickel, palladium, silicon carbide, titanium, zinc oxide, and silicon germanium.

BRIEF DESCRIPTION OF THE DRAWING

In the Drawings:

FIGS. 4 A-C illustrate cross sectional views of conductor-on-nanotube traces, according to certain embodiments of the invention;

FIGS. 5 A-C illustrate cross sectional views of conductor-on-nanotube planes, according to certain embodiments of the invention;

FIGS. 21A-B illustrate cross sectional views of NRAM cells having silicate on nanotube traces, according to certain embodiments of the invention;

FIGS. 22A-B illustrate cross sectional views of NRAM cells having silicate on nanotube traces, according to certain embodiments of the invention;

FIGS. 23A-H illustrate top views (1) and cross sectional views (2) of NRAM cells at various processing stages, according to certain embodiments of the invention; and FIGS. 24A-C illustrate top views (1) and cross sectional views (2) of NRAM cells at various processing stages, according to certain embodiments of the invention.

DETAILED DESCRIPTION

The creation and operation of bi-stable, nanotube memory cells (including mono-layer and multi-layered nanotube fabrics) with metal electrodes in various configurations are disclosed. Conventionally, there is a trade-off in the industry between memory density and fabrication process complexity. As memory cell size is decreased (and correspondingly, memory density is increased), the fabrication process used to achieve these memory cells is complicated with additional and lengthier process steps. This conventional trade-off can be overcome with a variety of new NRAM structures, disclosed below. In fact, the new variety of NRAM structures achieves smaller, more densely packed memory arrays, while preserving a relatively simple fabrication process flow typically used only to produce larger memory cells. Retaining a simplified fabrication process flow brings many advantages—for example, a high yield may be maintained if there are fewer error-prone steps and energy savings may be maximized by using certain simplified process flows.

The new variety of NRAM structures disclosed below provide denser memory using techniques with high yield and comparatively simple fabrication process flows. These NRAM structures build upon concepts disclosed in the various incorporated references, particularly, U.S. patent application Ser. No. 11/835,865, entitled Nonvolatile Nanotube Diodes and Nonvolatile Nanotube Blocks and Systems Using Same and Methods of Making Same. Various embodiments of the NRAM structures disclosed below provide these advantages through the use of several structural features.

Figure 2:
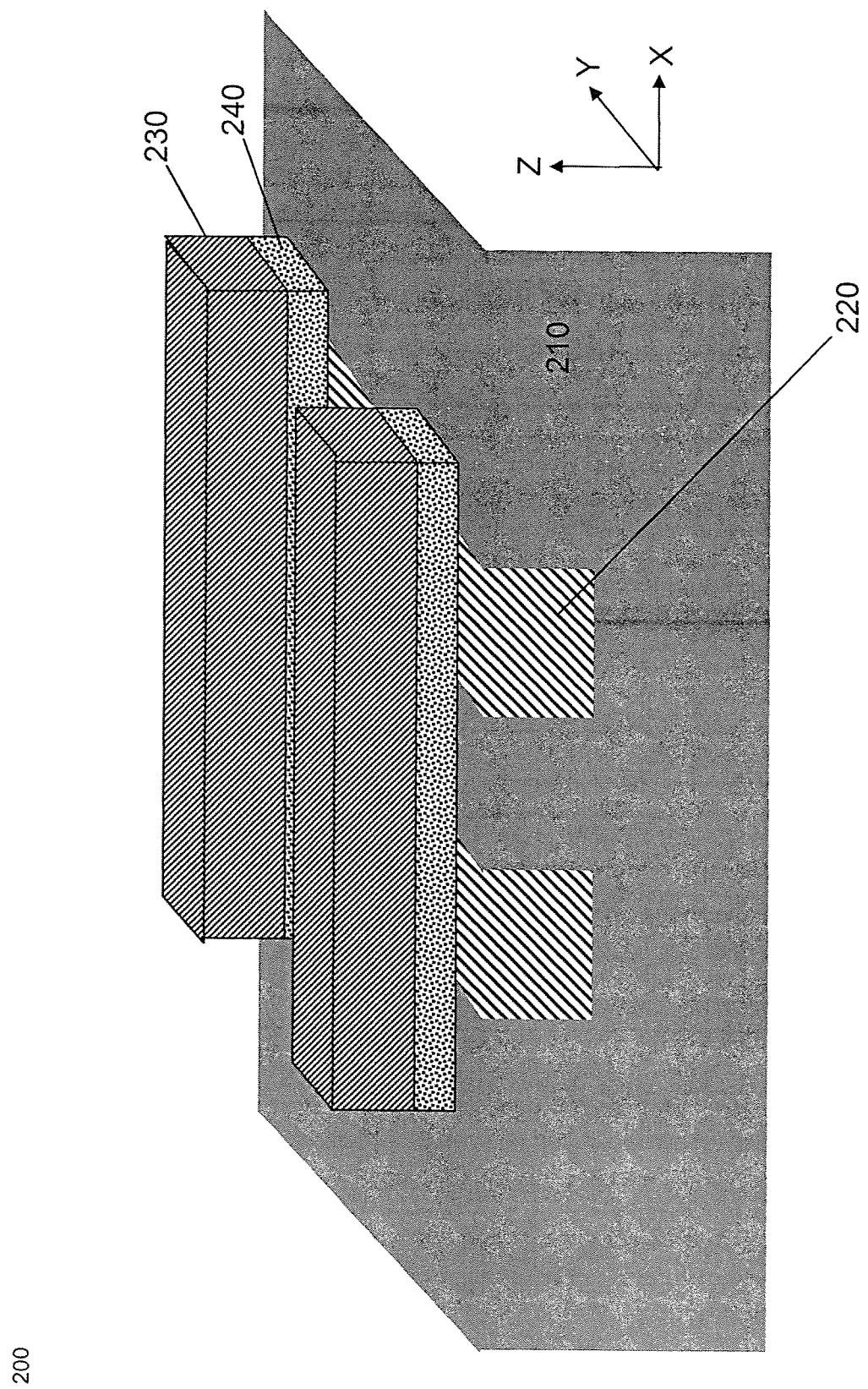
FIG. 2 illustrates a perspective view of an NRAM array area with conductor-on-nanotube trace on bottom traces, according to certain embodiments of the invention.
Figure 3:
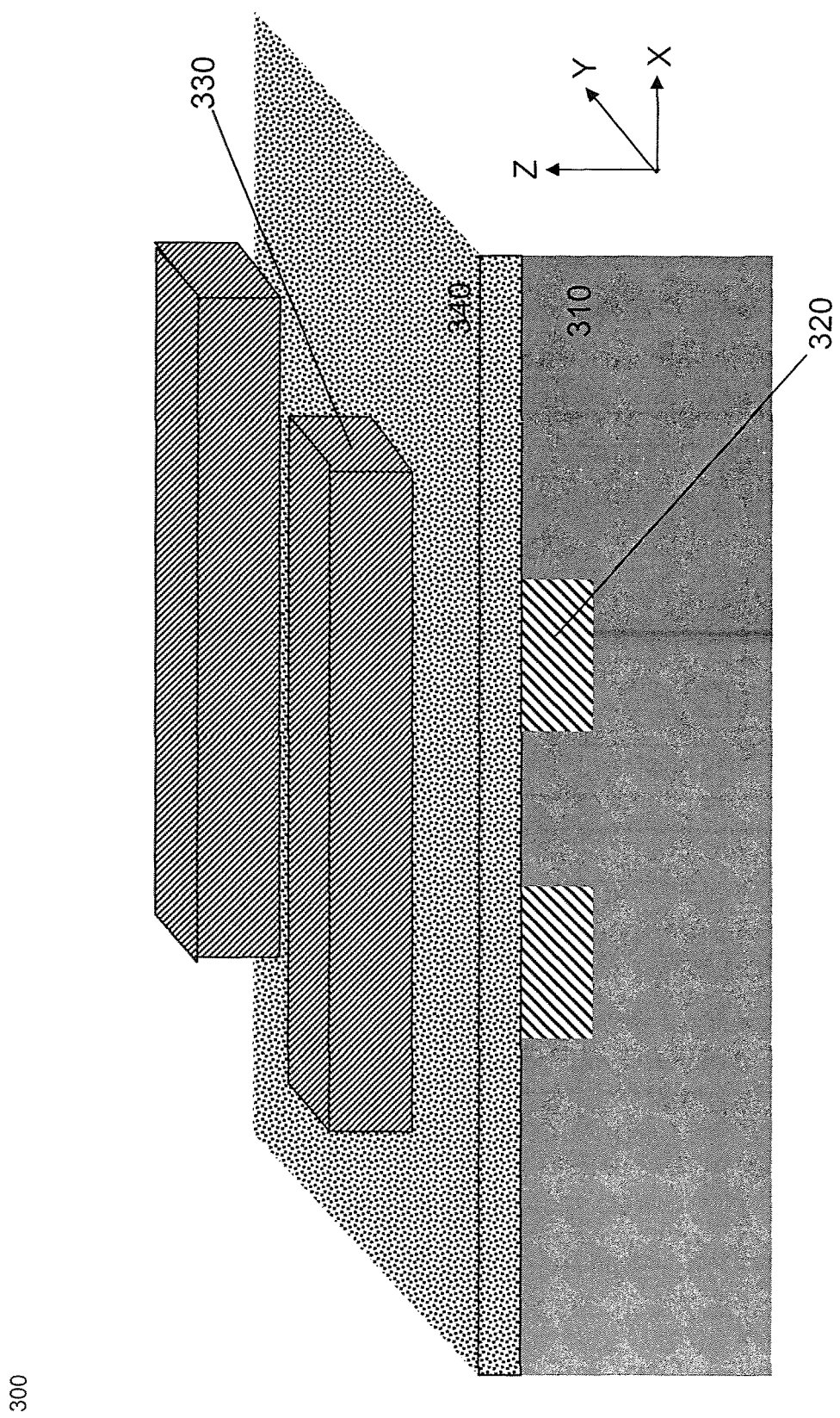
FIG. 3 illustrates a perspective view of an NRAM array area with a conductor trace on a nanotube plane on bottom traces, according to certain embodiments of the invention.

The disclosure below extends the concept of the nanotube block, described in the incorporated references, to include nanotube traces and nanotube planes. Memory arrays using nanotube traces and nanotube planes are illustrated in FIGS. 2 and 3, described at length below. With the appropriate select mechanisms, adjacent memory cells (bits) can be formed along a continuous trace composed of a nanotube fabric. These adjacent memory bits can be independently switched without one bit's state disturbing the state of an adjacent bit on the shared nanotube fabric trace. Similarly, an array of memory cells may be formed in a continuous plane of nanotube fabric, e.g. a nanotube sheet, such that individual bits may be selected at any discrete point on the plane. The adjacent memory bits can be independently switched without one bit's state disturbing the state of the adjacent bits (e.g. in each of the x and y directions) on the shared nanotube fabric plane. The various NRAM structures use traces and planes to simplify the memory array structure, while preserving many of the advantages that accompany the NRAM block structures disclosed previously. One advantage of the simplified nanotube trace and plane structures is that fewer alignment and etching steps are needed to provide a finished, operational array of independently selectable memory cells. Furthermore, the nanotube trace and plane structures are highly scalable. The continual reduction in feature sizes places increasing demands on the fabrication techniques used to form the features. Photolithography techniques, for instance, are generally used, with pitch-multiplication providing one way to provide $1F^2$ and smaller cells sizes. See, for example, U.S. Pat. No. 7,253,118 entitled, "Pitch reduced patterns relative to photolithography features," the contents of which are incorporated by reference, for a thorough description of pitch-doubling.

Furthermore, the disclosure below provides a variety of structures in which metal traces or planes are disposed overlying and conformal to the nanotube blocks, traces, and planes. The metal trace or planes may be used to form bit lines overlaying nanotube fabric elements for providing bit line signals to individual memory cells. Whereas before, the cell size-fabrication complexity tradeoff limited memory cells to those in which the nanotube portion was fabricated above the bit lines, the present structures include NRAM cells with a bit line above the nanotube element.

As described in detail below, the bitline-above-nanotube arrangement may be used to very high density memory arrays through a very rapid fabrication process (e.g. short turn-around time). In certain variations, the bit line constitutes a metal trace overlaying a nanotube fabric plane; in others the metal bit line overlays a nanotube fabric trace and the two layers align to form a single multilayer trace. In yet other variations, the bit line constitutes a metal conducting plane which is conformally disposed over a nanotube fabric plane. These structures provide certain advantages by, for example, reducing the number of alignment and etching steps involved in the fabrication process. The high density memory may be achieved by implementing memory layouts with non-orthogonal elements. For example, bit lines may be disposed at angles non-orthogonal to word lines to allow highly packed cells of $6F^2$ dimensions and smaller. Numerous variations on this non-orthogonality concept are disclosed, each variation providing certain layout advantages.

While the NRAM structures disclosed below advantageously overcome the conventional trade-off between NRAM cell density and simplicity/expediency of fabrication process flow, there are many other advantages to their use. For example, the disclosed NRAM structures may be used in conjunction with a variety of select mechanisms and devices (e.g. diodes, FETs) constructed from a broad selection of materials. The following discussion elaborates on each NRAM structure and its advantages, key features, and use.

Figure 1:
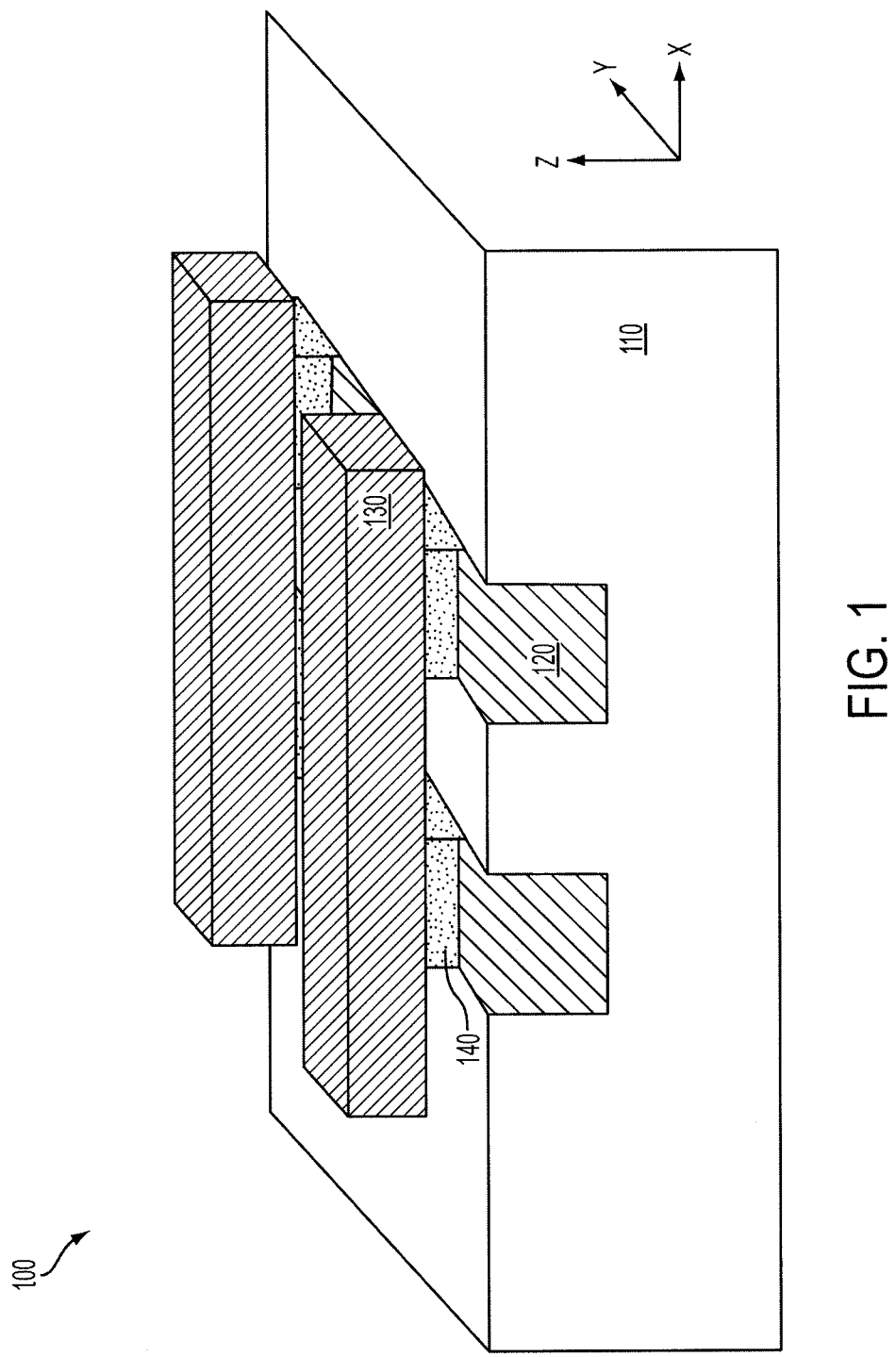
FIG. 1 illustrates a perspective view of an NRAM array area with discrete nanotube blocks, according to certain embodiments of the invention.

FIG. 1 illustrates a perspective view of an NRAM array area with discrete nanotube blocks, according to certain embodiments of the invention. The NRAM array 100 comprises a substrate structure or block 110 in which bottom conductive traces 120 are imbedded. The bottom conductive traces may comprise, for example, word lines (WL) or bit lines (BL). Disposed above the bottom conductive traces are upper conductive traces 130 which may comprise, for example WLs or BLs. In NRAM array 100, the bottom and upper conductive traces 120, 130, are arranged perpendicularly, with respect to the x-y plane (shown), but any number of other configurations may be suitable in other contexts. In the present example, each of the bottom and upper conductive traces 120, 130, intersect in a vertical region (along z-axis) where a discrete nanotube block 140 is disposed. The discrete nanotube block 140, at each such intersection, forms an active region between the bottom and upper conductive traces 120, 130, providing a vertical conductive pathway between the bottom and upper conductive traces. This vertical conductive pathway can be formed and unformed (corresponding to a low and high resistance path) between conductive traces.

Switching mechanisms for the vertical conductive pathway are described fully in U.S. patent application Ser. Nos. 11/835,865 and 11/835,613, which are herein incorporated by reference in their entireties. Each bit line-word line combination (e.g. bottom and top conductive trace) selects a discrete nanotube block 140, thereby selecting a discrete nanotube memory cell in the NRAM array. The resistance state of each nanotube block 140 may thus be programmed to represent a memory state of each NRAM memory cell. Multi-resistance states (values) may be used to represent multiple bit logic states programmed into the same nonvolatile nanotube block. As an example, one low resistance state and one high resistance state may be used to represent one bit as a logical 1 state or a logical 0 state. Alternatively, three low resistance states and one high resistance state may be used to store two bits represented as logical 00, logical 01, logical 10, and logical 11 states. In yet another example, seven low resistance states and one high state may be used to represent three bits; and so on. U.S. patent application Ser. Nos. 11/835, 583 and 11/835,612] incorporated, by reference in their entireties, illustrate NRAM memories with multi-resistance states per nonvolatile nanotube storage location. The electrical signals for programming (e.g. writing, reading, erasing) each memory cell by altering the resistance state for each nanotube block are described fully in the incorporated references and may be selected according the various requirements of the particular application.

FIG. 2 illustrates a perspective view of an NRAM array area with conductor-on-nanotube traces on bottom traces, according to certain embodiments of the invention. The NRAM array 200 comprises a substrate structure or block 210 in which bottom conductive traces 220 are imbedded. The bottom conductive traces 220 may comprise, for example, word lines (WL) or bit lines (BL). Disposed above the bottom conductive traces are upper conductive traces 230 disposed over a nanotube trace layer 240. The upper conductive trace and nanotube trace layer are, in NRAM array 200, substantially aligned, resulting in a conductor-on-nanotube trace. The upper conductive traces may comprise, for example WLs or BLs and the nanotube trace layer 240 may comprise a region of nanotube fabric. Nanotube fabrics are described in detail in the incorporated references. In NRAM array 200, the bottom and upper conductive traces 220, 230, are arranged perpendicularly, with respect to the x-y plane (shown), but any number of other configurations may be suitable in other contexts. In the present example, each of the bottom and upper conductive traces 220, 230, intersect in a vertical region (along z-axis) forming an active region of the nanotube trace 240 between the bottom and upper conductive traces 220, 230.

The active region of the nanotube trace 240 provides a vertical conductive pathway between the bottom and upper conductive traces. This vertical conductive pathway can be formed and unformed (corresponding to a low and high resistance path) between conductive traces. Switching mechanisms for the vertical conductive pathway are described fully in U.S. patent application Ser. Nos. 11/835,865 and 11/835, 613. Each bit line-word line intersection (e.g. bottom and top conductive trace) selects an active region of the nanotube trace layer 240, thereby forming and selecting a discrete nanotube memory cell in the NRAM array. The resistance state of each nanotube block 240 may thus be programmed to represent a memory state of each NRAM memory cell. The electrical signals for programming (e.g. writing, reading, erasing) each memory cell by altering the resistance state for each nanotube block are described fully in the incorporated references and may be selected according the various requirements of the particular application.

NRAM array 200 has a plurality of active regions along each nanotube trace layer 240, each active region corresponding to a selected bottom conductive trace 220. Each nanotube trace layer is fabricated such that one active region may be controllably switched between resistance states (e.g. varying the resistance path between top and bottom conductive traces in the z-direction) without altering the resistance states of adjacent active regions. Multi-resistance states (values) may be used to represent multiple bit logic states programmed into the same nonvolatile nanotube block. So for example, one low resistance state and one high resistance state may be used to represent one bit as a logical 1 state or a logical 0 state. Alternatively, three low resistance states and one high resistance states may be used to store two bits represented as logical 00, logical 01, logical 10, and logical 11 states. Alternatively, seven low resistance states and one high state may be used to represent three bits. In this manner, each bit of memory, corresponding to an active region of the nanotube trace layer 240, may be programmed and reprogrammed without disturbing adjacent bits.

In certain applications, the NRAM array 200 has fabrication advantages. As memory array technology is scaled down to smaller dimensions the etching processes used to provide each element of the memory array become critical. In the present example, the upper conductive traces 230 are substantially aligned with the corresponding nanotube trace layers 240, resulting in a conductor-on-nanotube trace. To achieve this arrangement, a single top conductor mask may be used to etch a continuous conductor strip and continuous nanotube strip, in a single step. This arrangement may, in certain embodiments, simplify the fabrication process used to provide NRAM memory cells (as compared, for example, to the multi-step fabrication process used to produce discrete nanotube blocks 140). If boundaries between each etched region are too close, those etched boundaries may be poorly defined and the dimensions of each element may not be individually controlled. By simplifying the fabrication process by providing a structure that requires fewer etching steps, the cumulative errors in etched boundaries may be reduced, resulting in better-defined elements. A single etch step or multiple etch steps may be used to provide the conductor-on-nanotube trace.

Various fabrication processes may be used to provide the NRAM arrays described above. At the time of the present application, the inventors utilize the following process. First a hardmask layer such as silicon nitride is provided on top of a conductor. One possible conductive material is TiN, though other suitable materials may also be used. Subsequently, photoresist patterns may be applied using conventional methods, widely known in the art. Then, the SiN layer may be etched using a CF4/Ar process. The etch selectively removes the SiN without appreciably attaching the underlying TiN. After etching the exposed SiN, the resist may be removed using an $O_2$ Ash and Solvent Strip. Next, the TiN may be etched using a $BCl_3/Cl_2$ chemistry. The previously etched SiN may act as a mask for the TiN etch (and later for the carbon nanotube etch). The carbon nanotube (CNT) layer may then be etched by using an $O_2$/Ar RIE (reactive ion etch) process, as described in detail in the incorporated references. This fabrication process ends with a solvent strip to clean the wafers, prior to passivation. At the time of the application, the inventors are developing this fabrication process, evaluating alternative fabrication steps. The above-described process should be construed as non-limiting and illustrative of one example embodiment. Other methods and materials are contemplated and may be employed by one skilled in the art.

FIG. 3 illustrates a perspective view of an NRAM array area with a conductor trace on a nanotube plane on bottom traces, according to certain embodiments of the invention. NRAM array 300 is similar to the arrays depicted in FIGS. 1 and 2, with the exception that the nanotube layer comprises a continuous sheet that has not be partitioned into discrete traces or blocks. The NRAM array 300 comprises a substrate structure or block 310 in which bottom conductive traces 320 are imbedded. The bottom conductive traces may comprise, for example, word lines (WL) or bit lines (BL). Disposed over the bottom conductive traces is a continuous sheet of nanotubes 340. The sheet forms a plane approximately conformal to the upper surface of the substrate structure or block 310 and the upper surfaces of the bottom conductive traces 320. In certain embodiments, the nanotube sheet 340 may comprise a nanotube fabric having a network of unaligned carbon nanotubes. Disposed over the nanotube sheet 340 are upper conductive traces 330 which may comprise, for example WLs or BLs. In NRAM array 300, the bottom and upper conductive traces 320, 330, are arranged perpendicularly, with respect to the x-y plane (shown), but any number of other configurations may be suitable in other contexts. In the present example, each of the bottom and upper conductive traces 320, 330, intersect in a vertical region (along z-axis) to form a physical NV NT block bit location and are separated by an active region of the nanotube sheet 340, interposed between the traces 320 and 330 in this vertical region.

Each active region of the nanotube sheet 340, between the bottom and upper conductive traces 320, 330, provide a vertical conductive pathway between the conductive traces. Other orientations for the active region and conductive pathway are envisioned and consistent with the concepts described here. This vertical conductive pathway can be formed and unformed (corresponding to a low and high resistance path) between conductive traces. Multiple low resistance states and a high resistance state may be stored in each physical bit location as described further above with respect to FIGS. 1 and 2.

Switching mechanisms for the vertical conductive pathway are described fully in patent application Ser. Nos. 11/835,865 and 11/835,613. Each bit line-word line intersection or combination (e.g. bottom and top conductive trace) selects a discrete active region of the nanotube sheet 340, thereby selecting a discrete nanotube memory cell in the NRAM array. The resistance state of each active region of the nanotube sheet 340 may thus be programmed to represent a memory state of each NRAM memory cell. The electrical signals for programming (e.g. writing, reading, erasing) each memory cell by altering the resistance state for each active region of the nanotube sheet are described fully in the incorporated references and may be selected according the various requirements of the particular application. The NRAM array 300 is constructed and arranged to enhance current flow in the vertical conduction pathway while minimizing horizontal conduction along the plane of the nanotube sheet 340 (x-y plane, in this example).

The present NRAM array depicted in FIG. 3 enables high density memory wherein the spacing between cells is limited by the dimensions of the upper and lower conductive traces 320 and 330 and the spacing between those traces. Fabrication constraints (e.g. boundaries between etched regions, masking dimensions) help to determine the spacing between the cells and the size of the memory cells themselves. Because a single mask may be used to etch upper conductive traces and no etching step is required to define the nanotube sheet 340, the fabrication process is simplified over those processes described with respect to FIGS. 1 and 2. The simplified fabrication process may be advantageous in certain applications. As is well known to those skilled in the art, a shallower etch and reduced processing steps would result in less topography, lower stresses, reduced costs (due to the fewer etch steps), and lower particulates, ultimately providing a lower cost and higher yielding process.

FIGS. 4 A-C illustrate cross sectional views of conductor-on-nanotube traces, according to certain embodiments of the invention. FIG. 4A depicts a x-z plane cross sectional view of a portion of NRAM memory array 400-1, such as that described in reference to FIG. 2. Two bottom conductive traces 420 are embedded in substrate 410. Nanotube trace 440 overlays the bottom conductive traces 420 and substrate 410. Upper conductive trace 430 overlays and is substantially aligned with the nanotube trace 440, rendering a conductor-on-nanotube trace. FIG. 4B depicts a y-z plane cross sectional view of a portion of NRAM memory array 400-1. Conductor-on-nanotube trace 430 and 440 overlay bottom conductive trace 420. FIG. 4C depicts a y-z plane cross sectional view of a portion of NRAM memory array 400-2 in which an insulator such as tetraethyl orthosilicate (TEOS), for example, has been deposited and planarized. Conductor-on-nanotube trace 430 and 440 overlay bottom conductive trace 420 and insulator 410 is disposed adjacent to the conductor-on-nanotube trace. In addition to TEOS, other insulators may be used such as: Silicon Nitride, Silicon Carbide Nitride, Silicon Oxynitride, Aluminum Oxide, Low-k dielectrics such as fluorinated SiO2, spin on low-k, air gaps, or any layered combination or mixture of the aforementioned materials. Various other materials are possible, the primary criteria for their use being that the resulting region provides insulation between the adjacent CNT blocks and metal traces.

FIGS. 5 A-C illustrate cross sectional views of conductor-on-nanotube planes, according to certain embodiments of the invention. FIG. 5A depicts a x-z plane cross sectional view of a portion of NRAM memory array 500-1, such as that described in reference to FIG. 3. Two bottom conductive traces 520 are embedded in substrate 510. Nanotube sheet layer 540 overlays the bottom conductive traces 520 and substrate 510. Upper conductive trace 530 overlays and is substantially conformal to the nanotube sheet layer 540, rendering a conductor-on-nanotube plane arrangement. FIG. 5B depicts a y-z plane cross sectional view of a portion of NRAM memory array 500-1. Conductor-on-nanotube plane arrangement 530 and 540 overlay bottom conductive trace 520. FIG. 5C depicts a y-z plane cross sectional view of a portion of NRAM memory array 500-2 in which an insulator such as TEOS, for example, has been deposited and planarized forming insulator region 510. Conductor-on-nanotube plane arrangement 530 and 540 overlay bottom conductive trace 520 and insulator 510 is disposed adjacent to the upper conductive trace 530. In addition to TEOS, other insulators may be used such as: Silicon Nitride, Silicon Carbide Nitride, Silicon Oxynitride, Aluminum Oxide, Low-k dielectrics such as fluorinated SiO2, spin on low-k, air gaps, or any layered combination or mixture of the aforementioned materials. As noted above, various other materials are possible, the primary criteria for their use being that the resulting region provides insulation between the adjacent CNT blocks and metal traces.

Various methods for forming the structure depicted in FIG. 5B are contemplated. In one example, the conductor 530 may be formed without etching (removing) the regions of the underlying nanotube plane 540. Also, because the nanotube plane 540 is planar, the conductor 530 may be formed without etching unwanted regions of underlying conductor 520. At the time of this application, the inventors have found that when using the etching steps described above, the TiN etch portion does not attack the carbon nanotubes (e.g. nanotube plane 540). In fact, the etch portion appears to alter the carbon nanotubes in such a way that it becomes more difficult to remove the nanotubes using $O_2$ plasmas. In this particular method, for example, etching the TiN with a $BCl_2/Cl_2$ chemistry provides an etch selective to the underlying carbon nanotube fabric. Since the conductive layer 520 is disposed underneath the carbon nanotube fabric (e.g. 540) it is expected that the conductive layer 520 will not be attached by the etch. In other words, the carbon nanotube fabric (e.g. 540) will protect the underlying conductor 520. In the previous embodiments, the chemistry used for etching the carbon nanotube fabric is $O_2$/Ar which does not attack conductors or dielectrics, so the underlying conductors would not be affected in those embodiments either. The above-described example for forming the NRAM structure should be construed as illustrative and not limiting; the inventors envision various other methods of fabrication for the present structures.

FIGS. 6 A-D illustrate cross sectional views of a nanotube-trace on conductor structure, according to certain embodiments of the invention. FIG. 6A depicts a x-z plane cross sectional view of a portion of a NRAM memory array. The nanotube trace is above the corresponding conductor. Two bottom conductive traces 620 are embedded in substrate 610. Nanotube traces 640 overlay and are substantially aligned with the bottom conductive traces 620 forming nanotube-on-conductor traces. FIG. 6B depicts a y-z plane cross sectional view of the portion of a NRAM memory array described with reference to FIG. 6A. FIG. 6C depicts a x-z plane cross sectional view of a portion of a NRAM memory array 600-1 where an upper conductive trace 630 is disposed over the nanotube-on-conductor traces described with reference to FIGS. 6A and 6B. FIG. 6D depicts a y-z plane cross sectional view of a portion of NRAM memory array 600-2. FIG. 6D shows, in addition to the elements depicted in FIG. 6C, an insulator such as tetraethyl orthosilicate (TEOS), for example, is deposited and planarized to form insulator region 610 on either side of the upper conductive trace 630. In addition to TEOS, other insulators may be used such as those described above with reference to FIGS. 4A-C and FIGS. 5A-C.

Figure 6A:
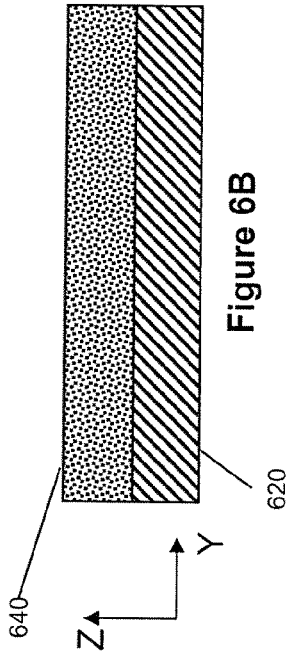
FIGS. 6 A-D illustrate cross sectional views of nanotube-on-conductor traces, according to certain embodiments of the invention.
Figure 6B:
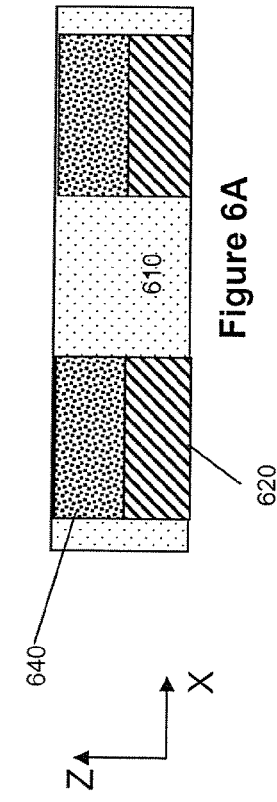
Figure 6C:
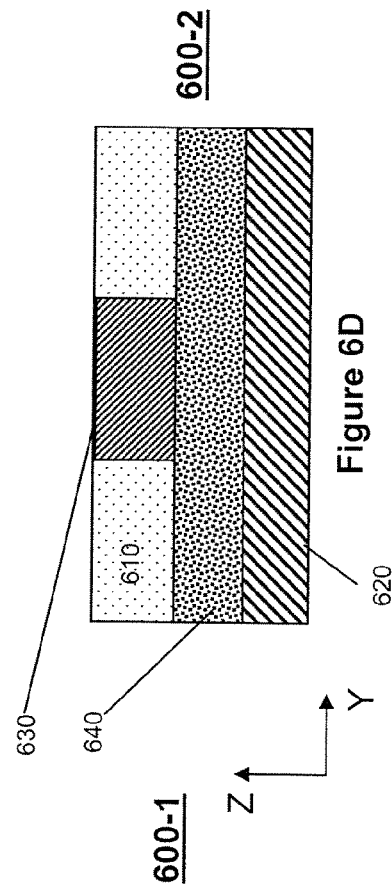
Figure 6D:
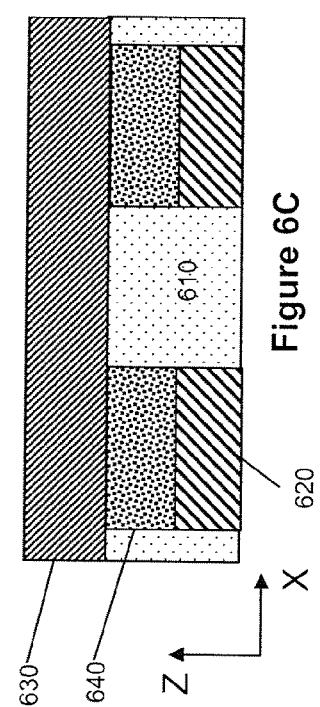

The structures depicted in FIGS. 6A-B may be fabricated according to various methods. Forming a nanotube trace on an underlying conductor can be achieved by several means, one exemplary variation being described in the following steps. First, a conductor may be deposited, followed by deposition of a carbon nanotube fabric region (from which nanotube traces 640 may be formed). A final sacrificial material may then be deposited such that the sacrificial material fills the small spaces and/or voids within the nanotube fabric. This renders a carbon nanotube-sacrificial material-fill layer. Example sacrificial materials include ALD, $Al_2O_3$, or CVD Ti, or some other suitable material that may be selectively removed without attacking either the carbon nanotubes, the underlying conductor(s) or the dielectric layers disposed below the conductor(s). Next the carbon nanotube-sacrificial material-fill (CNT/Fill) may be etched selectively down to the underlying conductor. The underlying conductor layer may be subsequently etched using the CNT/Fill layer as a hard mask. The resist may then be removed. Next, the spaces between the carbon nanotube layer and conductors is filled with a dielectric material such as those described above, and chemical mechanical polishing processes (CMP), typically employed for semiconductor fabrication, may be employed to expose the carbon nanotube fabric. The top conductor may be deposited and patterned, at which time the sacrificial material may be removed using a wet chemistry techniques, well-known in the art. Inventors envision alternate fabrication methods and the above example should be construed as illustrative and not limiting.

FIGS. 7 A-E illustrate cross sectional views of nanotube-on-conductor traces with top metal contacts, according to certain embodiments of the invention. FIG. 7A illustrates a x-z plane cross sectional view of a portion of NRAM memory array. Nanotube traces 740 overlay and are substantially aligned with the two bottom traces 720. Top metal contact 750 overlay and are substantially aligned with the nanotube traces and two bottom traces, rendering nanotube-on-conductor traces with top metal contacts. While top contact 750 is described as being metal in this particular example, the top contact 750 can comprise any other suitable material (e.g. metallic nanotube fabric, etc.) Various conductors, alloys, and semiconductors may be used, including but not limited to: metallic CNT's, Ti, TiN, Al, Ta, TaN, Cu, Ru, RuO, Pd, Co, $CoSi_x$, Ni, $NiSi_x$, $TiSi_x$, Si(doped), Pt, $PtSi_x$, Au, Ag, or any layered combination or alloys of the above. The aforementioned traces are embedded in substrate 710. FIG. 7B depicts a y-z plane cross sectional view of the structure described with reference to FIG. 7A.

Figure 7B:
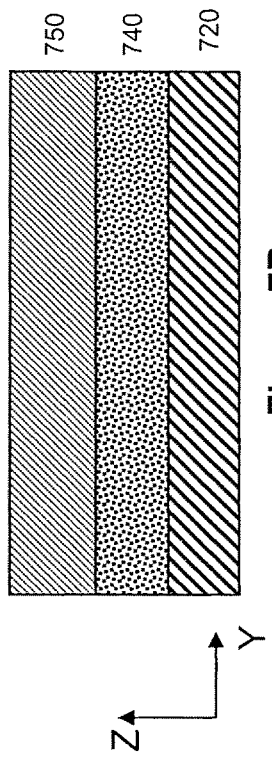
FIGS. 7 A-E illustrate cross sectional views of nanotube-on-conductor traces with top metal contacts, according to certain embodiments of the invention.
Figure 7D:
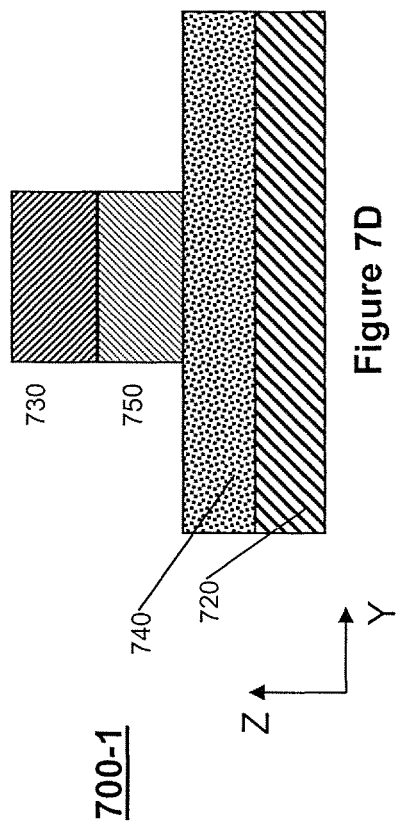
Figure 7A:
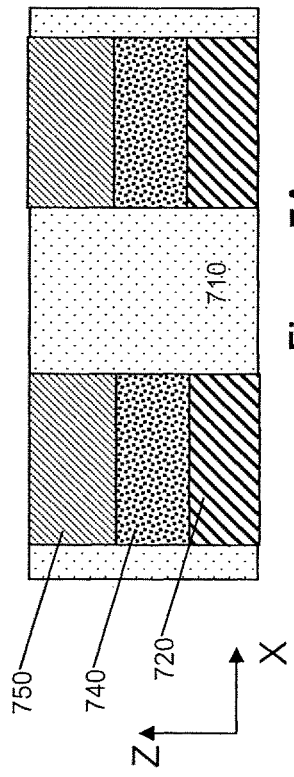
Figure 7C:
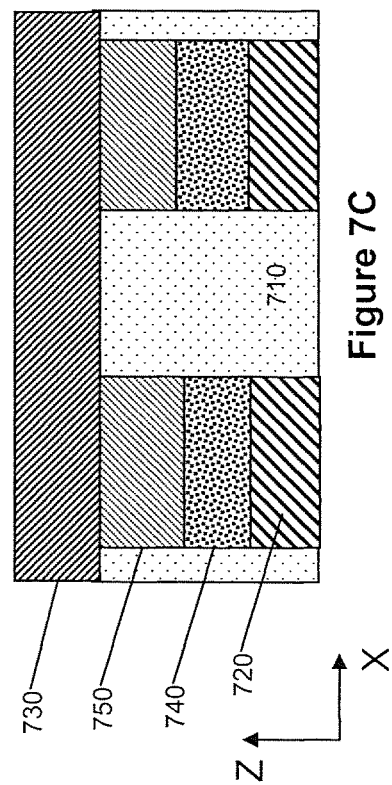
Figure 7E:
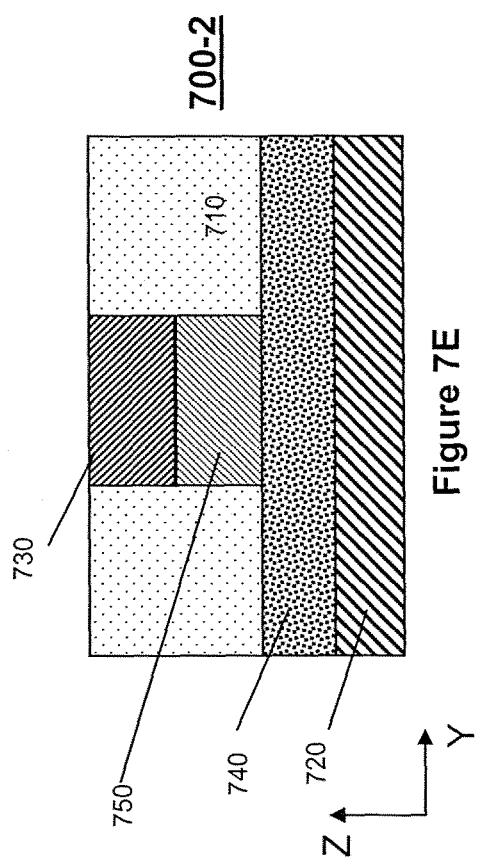

FIG. 7C depicts a x-z plane cross sectional view of the structure described with reference to FIG. 7A but shows an upper conductive trace 730 disposed over top metal contact 750, conformal to an upper surface of the structure formed by the top metal contact 750 and the surrounding substrate material 710. In FIG. 7C, the active region in which vertical conduction can be variably controlled comprises the region where the aforementioned traces (720, 740, 750) intersect the upper conductive trace (730). FIG. 7D depicts a y-z plane cross sectional view with two intersecting trace elements. The first of the intersecting trace elements comprises nanotube trace 740 overlaying and substantially aligned with bottom conductive trace 720. The second of the intersecting trace elements comprises upper conductive trace 730 overlaying and substantially aligned with top metal contact 750. In FIG. 7D, the active region in which vertical conduction can be variably controlled comprises the region where the aforementioned traces intersect. FIG. 7E depicts a y-z plane cross sectional view of a NRAM array 700-2. The structure is similar to that described with reference to FIG. 7D but additionally includes insulator regions 710 disposed on the sides of the second of the intersecting trace elements. Insulator 710 is similar to insulator regions 510 and 610 described further above in reference to FIGS. 5 and 6, respectively.

The structure depicted in FIGS. 7A-D may be fabricated according to the various methods described above, in the previous embodiments. At the time of this application, the inventors have found the following variations on the above-disclosed fabrication methods to be useful. The top conductor of the structure may be deposited as a bi-layer stack. This stack may then be etched using chemistries typically associated with the etching of those materials (the corresponding etches appropriate to a selected material may be chosen by one of skill in the art). The carbon nanotube fabric having voids filled with the sacrificial material (CNT/Fill, described above) may then provide an adequate etch stop. The sacrificial material may then be removed and the spaces between the top bi-layer conductor may be filled with a dielectric such as those describe above in other embodiments.

Figure 8:
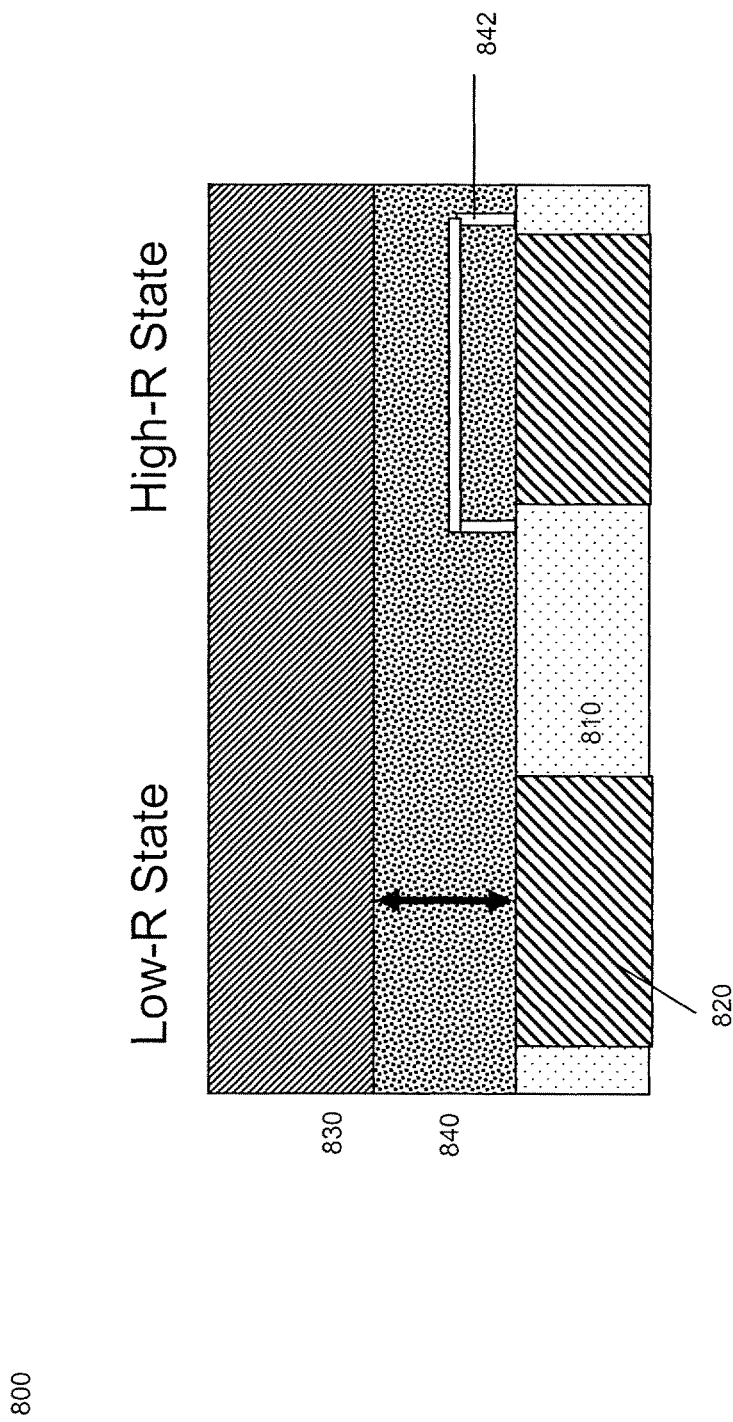
FIG. 8 illustrates a cross sectional view of conductor-on-nanotube traces or planes showing schematic representations of electrical states of two adjacent bits, according to certain embodiments of the invention.

FIG. 8 illustrates a cross sectional view of conductor-on-nanotube traces or planes showing schematic representations of electrical states of two adjacent bits, according to certain embodiments of the invention. The schematic representation of FIG. 8 shows a first physical bit location (left) in one or more low-resistance states (low-R states) and a second bit (right) in a high-resistance state (high-R state). Multiple low resistance states and a high resistance state may be stored in each physical bit location as described further above with respect to FIGS. 1 and 2.

Figure 19:
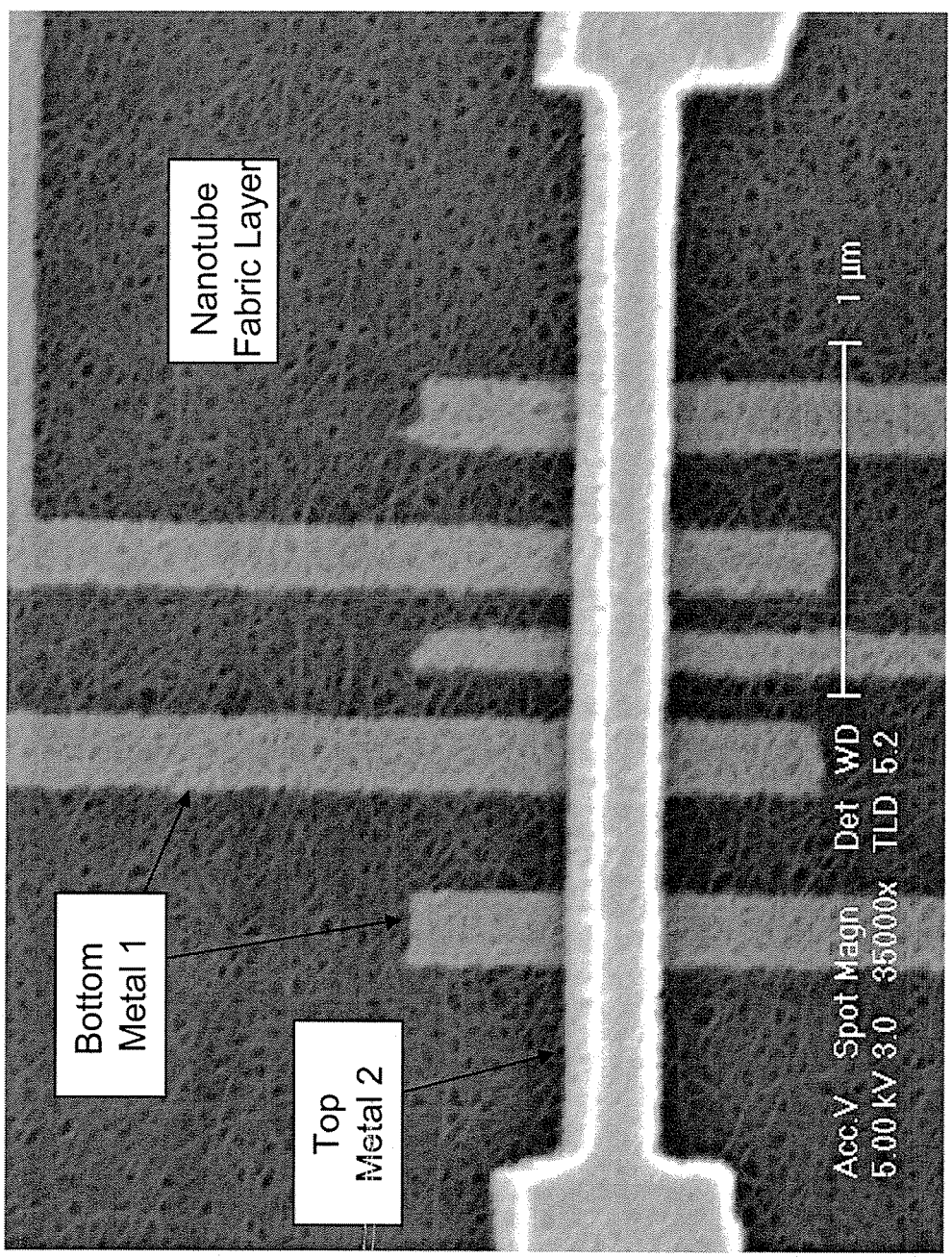
FIG. 19 illustrates an SEM image of a test structure having a top conductor-on-nanotube layer on bottom conductors, according to certain embodiments of the invention.

The section of the NRAM array 800 comprises left and right bottom conductive traces or contacts 820 disposed in substrate 810. Nanotube layer 840 (which comprises either a nanotube trace or nanotube plane) is disposed over the substrate and bottom conductive traces 820. Upper conductive trace 830 is disposed over nanotube layer 840 resulting in a conductor-on-nanotube trace/plane arrangement. Conduction along the x-y plane may be controlled such that the first and second bit may have a dominant electrical flow path along the z-direction. The first and second bit may be substantially independently switched without the resistance state of one bit affecting the resistance state of the other bit. This is because the fringing effect of a resistance state in a selected portion of the nanotube layer 840 may be substantially minimized. FIG. 19, described below, illustrates a test structure that uses the present NRAM bit array arrangement and switching mechanism detailed in FIG. 8. Resulting switching data for the test structure, shown in FIG. 20, corresponds to bits stored as shown in the FIG. 8 structure.

The first bit in a low-resistance state provides a predominantly vertical conductive pathway along which electrical stimulus flows between the bottom and upper conductive traces 820, 830 through the nanotube layer 840, as indicated by the vertically oriented arrow in FIG. 8. Current will flow within the nanotube layer 840 along the path of least resistance—in the present embodiment, the array is constructed and arranged such that this path of least resistance is along the z-direction. As described in detail in U.S. Pat. No. 6,706,402, U.S. patent application Ser. Nos. 11/835,583, 11/835,612, 11/835,865, 11/835,613, as well as U.S. patent application Ser. No. 11/546,103, which is incorporated by reference in its entirety, the nanotube layer may comprise a nonwoven multi-layer fabric having a plurality of controllably conductive pathways formed by the intersecting and crossing nanotubes. In low resistance states, the nonwoven multi-layer fabric is predominantly conductive along the plurality of nanotube pathways.

The second bit in a high-resistance state provides a predominantly resistive electrical pathway between the bottom and upper conductive traces 820 830 through the nanotube layer 840, as indicated by the channel or via 842. The channel or via forms a highly resistive region in the nanotube layer 840 around the bottom contact 820, thereby electrically isolating the bottom conductive trace from the upper conductive trace. In other embodiments, the channel or via 842 may be formed in nanotube layer 840 around the upper conductive trace 830. To form the high-resistance state and channel or via 840, the electrical stimulus applied to the bottom and top conductive traces is selected such that the nanotube layer 840 in the selected bit is erased (in a high resistance state) and the networks of nanotubes are rendered substantially non-conductive. Nanotube switching behavior, channel forming/unforming, and fuse/antifuse switching are described in detail in the incorporated references, especially, U.S. patent application Ser. Nos. 11/280,786, 11/835,583, 11/835,612, and 11/835,613. Various switching mechanisms are contemplated and described in the incorporated references.

Figure 9:
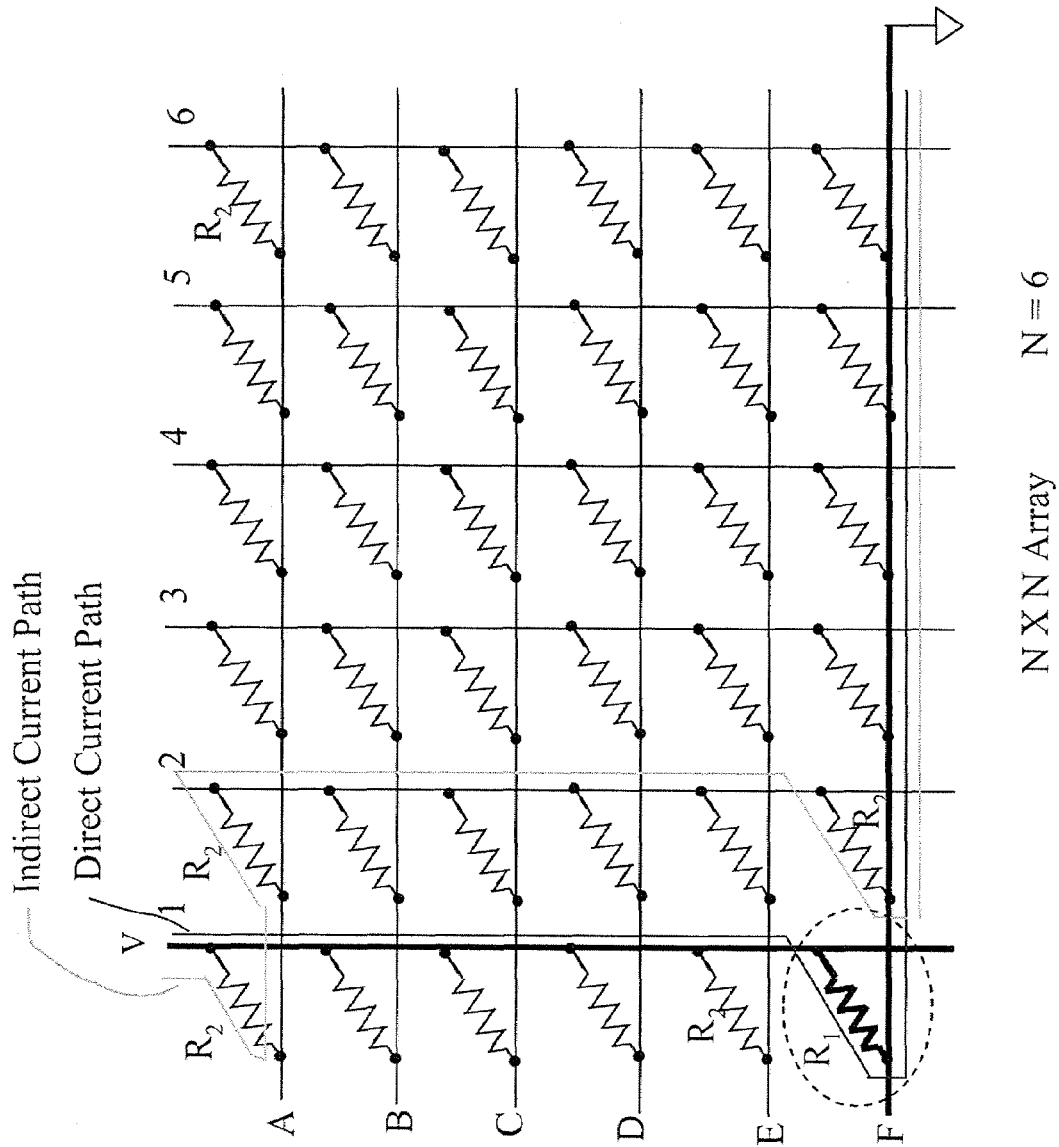
FIG. 9 illustrates a schematic representation of a nonlinear resistor array showing selected bit and "sneak" paths, according to certain embodiments of the invention.

FIG. 9 illustrates a schematic representation of cross point nonlinear resistor array 900 formed using the intersection of orthogonal array lines. The intersection of the orthogonal array lines forms NV NT blocks at corresponding intersections. Such cross point arrays can achieve a bit physical location density of $4F^2$. If multiple resistance values such as those discussed above with reference to FIGS. 1 and 2 are used, then even greater bit density is possible. For example, if two bits are stored at each physical bit location using four resistance states, an effective bit density of $2F^2$ is realized; four bits per location results in an effective bit density of $1F^2$; and so on.

The nonlinear cross point resistor array 900 shows a selected bit with nonlinear resistor R1 and "sneak" paths through unselected bit locations through nonlinear resistors R2, according to certain embodiments of the invention. In the present example, an N by N array of bits comprises a 6×6 array 900 of nanotube nonlinear resistor switches. Each nanotube nonlinear resistor switch may be individually switched between first and second resistance states. For example, a first resistance state may be a low resistance state and a second resistance state may be high resistance state. In array 900, nonlinear resistor R1 represents a selected bit location at the intersection of column array line 1 and row array line F. When voltage V is applied to column array line 1 and row array line F is grounded, current may flow in a direct current path between column array line 1 and row array line F through nonlinear resistor R1. However, indirect current may also flow through resistors R2 in multiple paths between column array line 1 and row array line F as illustrated in array 900. Because of indirect current path flow between column array line 1 and row array line F, it may be difficult to determine whether a selected bit location with nonlinear resistor R1 is in low resistance state or a high resistance state unless the array size is small.

There are many possible combinations of nonlinear resistance values in array 900. In this example, assume first that resistor R1 is in a low resistance state. Nonlinear resistors R2 at various array locations may be at low or high resistance values and any combination of direct and indirect current path flow results in a low resistance state reading between column array line 1 and row array line F. However, if resistor R1 is in a high resistance state, and some or even all nonlinear resistors R2 at various array locations are in a low resistance states, then the combination of indirect current path flow also results in low resistance state reading between column array line 1 and row array line F. This applies unless the array is small is size, less than 10×10 bits, for example. For large arrays, a FET cell select device may be included to form NRAM array cells as described in incorporated reference, U.S. patent application Ser. No. 11/835,613. Alternatively, a diode steering device may be included to form NT diode memory arrays as described in incorporated reference, U.S. patent application Ser. No. 11/835,865.

Figure 10:
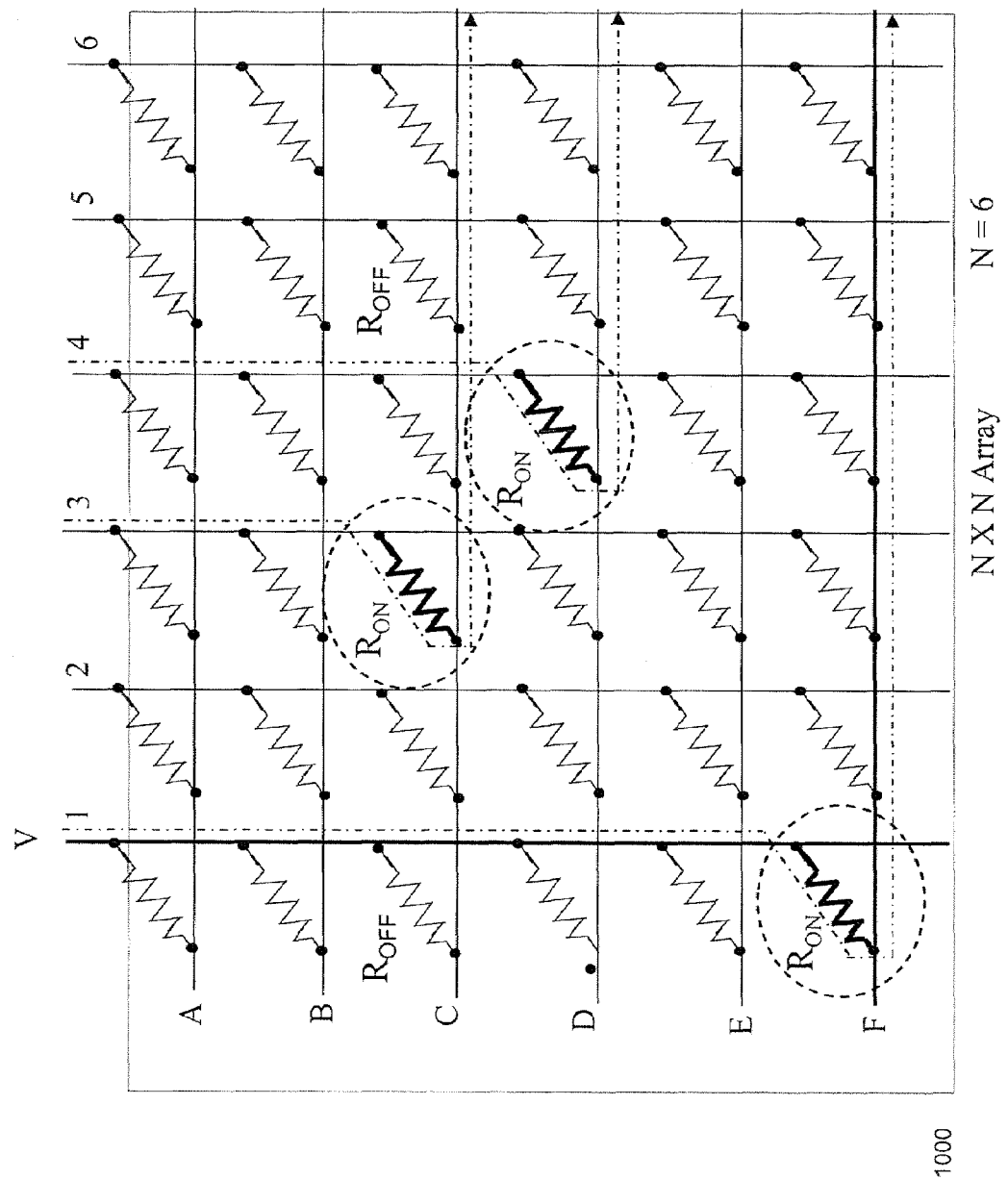
FIG. 10 illustrates a schematic representation of a nonlinear resistor array used as a logic routing switch, according to certain embodiments of the invention.

FIG. 10 illustrates a schematic representation of cross point nonlinear resistor array 1000 used as a logic routing switch, according to certain embodiments. In the present example, an N by N array of bits comprises a 6×6 array of nanotube resistor switches. Series and array formations of resistors may be selectively switched between high and low resistance states. Each NV NT block corresponds to a resistor switch may be discretely switched or modulated. A select mechanism distinguishes among word or bit lines having a discrete resistor element(s) in a low resistance state. As noted above, each resistor element in the array may comprise a nanotube switching element such as those described with reference to FIG. 9 and preceding Figures. The nonlinear resistor arrays may be constructed to comprise dense nanotube switching networks used in logic routing switch applications. An algorithm may be used to minimize or eliminate the effects of indirect current paths and enable large cross point nonlinear resistor array 1000 for logic switch applications without requiring the addition of FET select devices or diode steering devices at each cross point cell location.

As is evident from the illustrations in FIGS. 9 and 10, a NRAM array may be paired with an access device to specifically target individual cells in the array. Typically, the "sneak" paths of indirect current flow place practical limits on the size of an NRAM array. Current leakage occurs due to series-parallel resistances in an array-along such sneak paths-creating the need for a selective access device. FIG. 9 specifically illustrates cross-point switches forming nonvolatile nanotube nonlinear switches (resistors) at a high array density. The high array density is substantially the maximum realizable array density, as measured by both physical density of $4F^2$ and multibit storage density criteria. FIG. 10 illustrates a cross-point logic matrix switch without any logical matrix size limitation. FIG. 10 illustrates the substantially densest realizable cross-point logic matrix. In some embodiments, the high density array can be controlled to have an active region and an inactive region. In such cases, the active region can have individual memory cells that are each programmable as discussed above, while the inactive region retains either an invariantly high resistance state or an invariantly low resistance state. In such an embodiment, a memory array may be operated to reduce power consumption when only a portion of the memory array is under use.

Figure 11A:
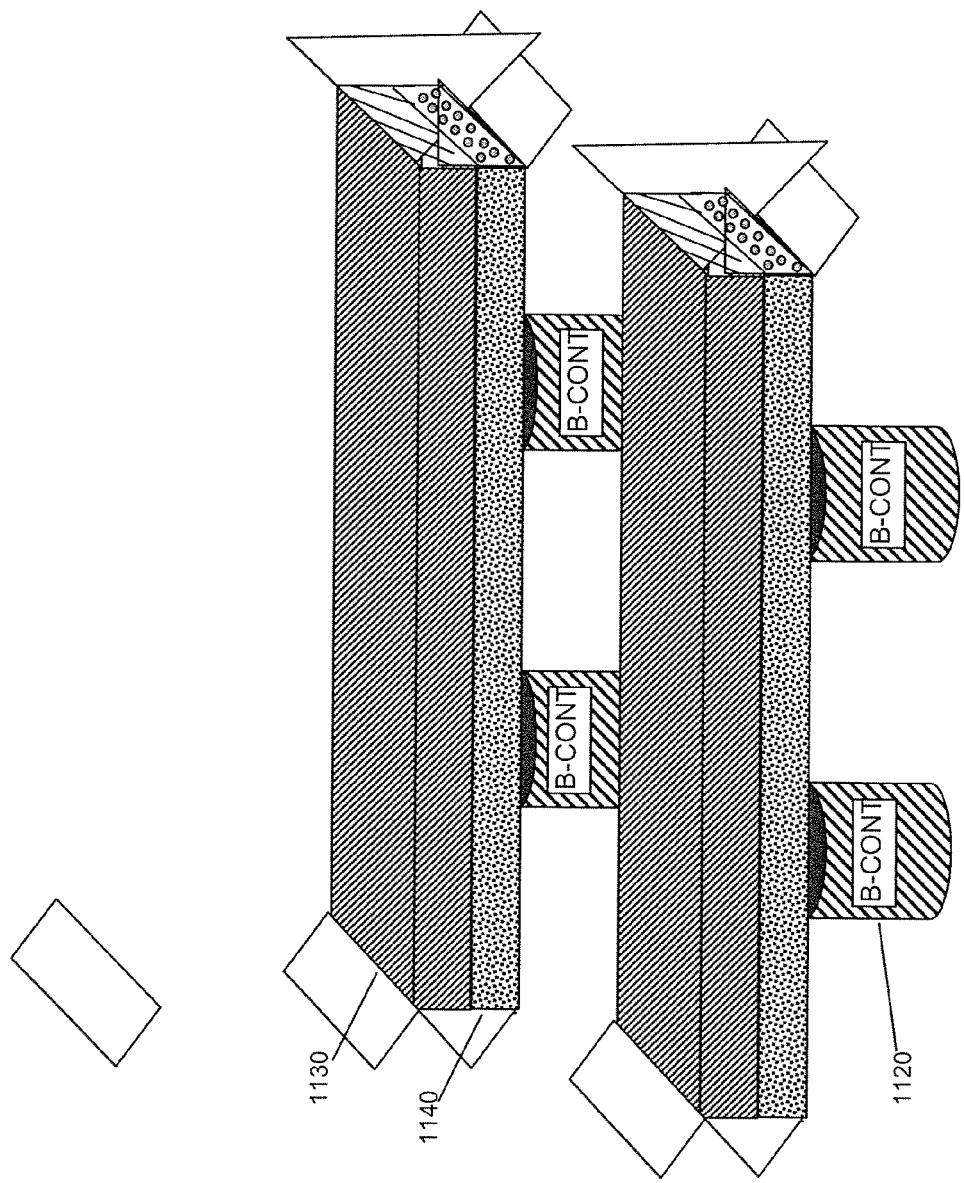
FIGS. 11A-B illustrate perspective views of conductor-on-nanotube traces on bottom contacts, according to certain embodiments of the invention.

FIG. 11A illustrates a perspective view of conductor-on-nanotube traces on bottom contacts, according to certain embodiments of the invention. An array of discrete bottom contacts 1120 may replace the bottom traces that were described above with reference to FIG. 2, etc. An upper conductive trace layer 1130 is disposed over and substantially aligned with a nanotube trace layer 1140 to form a conductor-on-nanotube trace. The conductor-on-nanotube trace is disposed over, aligned, and in contact with the array of discrete bottom contacts 1120 to form an array of nanotube memory cells. Each nanotube memory cell comprises a switching mechanism whereby the resistance state of the nanotube layer 1140 between the bottom contact 1120 and the upper conductive trace 1130 is controllably varied. Each bottom contact 1120 may be interconnected with a select access device (not shown) such as a CMOS-type access device, a PN or NP diode, a bipolar device, or any suitable generic select access device.

Figure 11B:
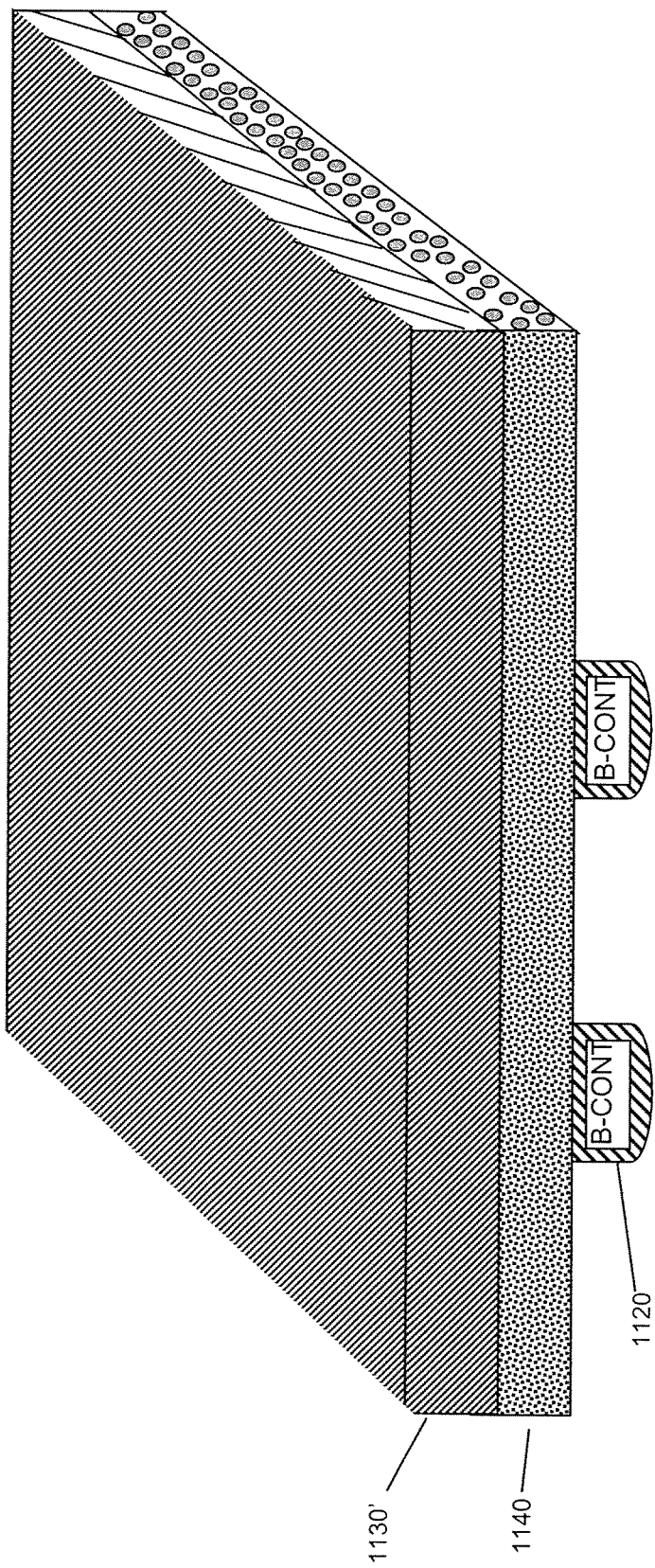

FIG. 11B illustrates a perspective view of conductor-on-nanotube planes on bottom contacts, according to certain embodiments of the invention. An array of discrete bottom contacts 1120 may replace the bottom traces that were described above with reference to FIG. 3, etc. An upper conductive layer 1130' is disposed over and substantially aligned with a nanotube layer 1140' to form a conductor-on-nanotube plane. The conductor-on-nanotube plane is disposed over and in contact with the array of discrete bottom contacts 1120 to form an array of nanotube memory cells. Each nanotube memory cell comprises a switching mechanism whereby the resistance state of the nanotube layer 1140' between the bottom contact 1120' and the upper conductive layer 1130' is controllably varied. While FIG. 11B features a continuous nanotube sheet with discrete bottom contacts, the switching mechanism for each cell is similar to that described in incorporated reference NAN-116, which has discretely etched diodes and switching blocks.

In certain applications, there may be fabrication advantages to creating discrete bottom contacts, as shown in FIGS. 11A and 11B, instead of bottom conductive traces. In such applications there may also be performance advantages whereby the adjacent cells may be closely aligned without one cell disturbing the switching state of the next cell (e.g. signal diffusion may be reduced). The switching mechanism between resistance states is that which has already been described above with reference to the preceding Figures.

Figure 12:
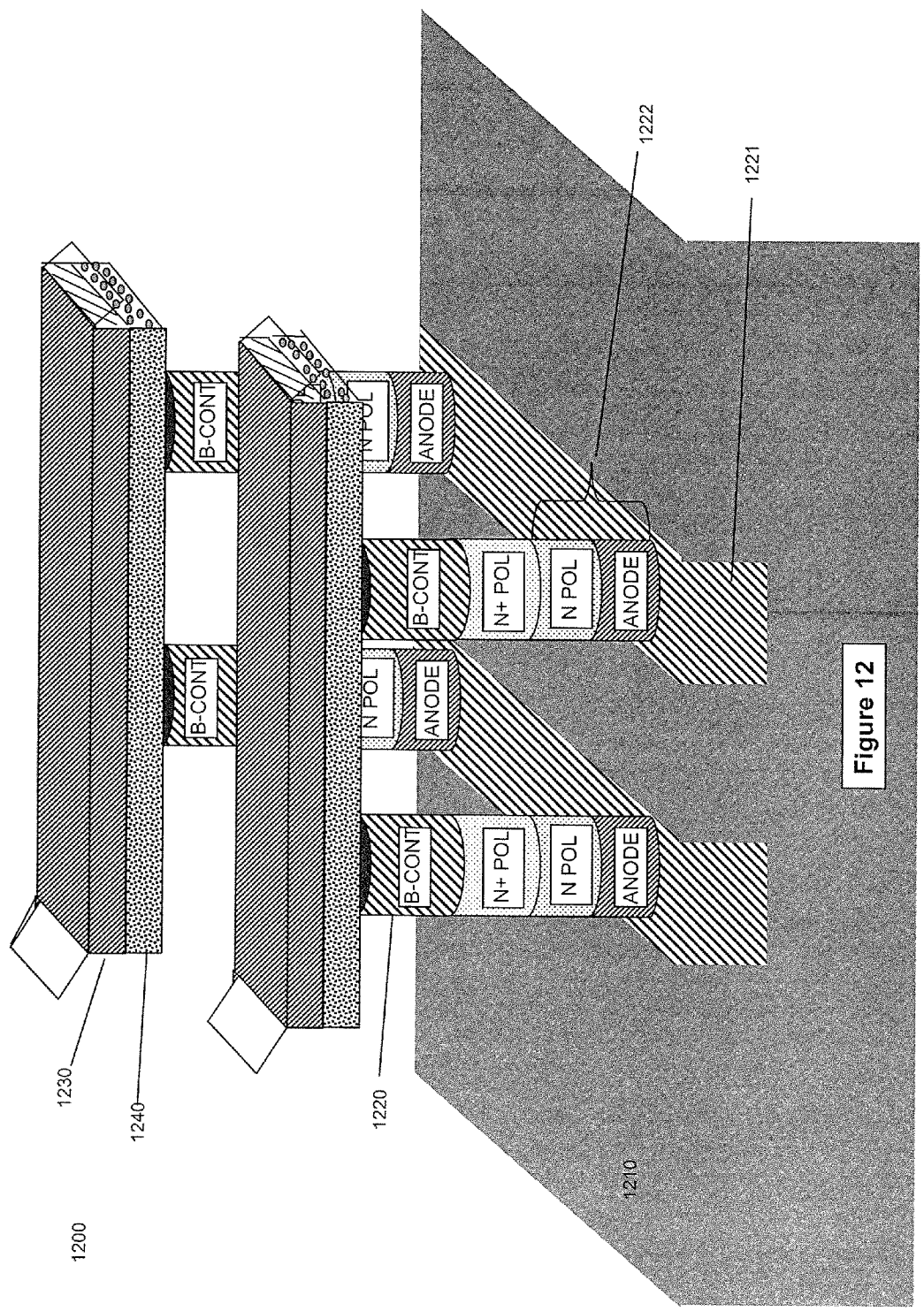
FIG. 12 illustrates a perspective view of conductor-on-nanotube traces on bottom contacts, steering diodes, and bottom traces, according to certain embodiments of the invention.

FIG. 12 illustrates a perspective view of conductor-on-nanotube traces on bottom contacts, steering diodes, and bottom traces, according to certain embodiments of the invention. An array of discrete bottom contacts 1220 may replace the bottom traces that were described above with reference to FIG. 2, etc. An upper conductive trace layer 1230 is disposed over and substantially aligned with a nanotube trace layer 1240 to form a conductor-on-nanotube trace. The conductor-on-nanotube trace is disposed over, aligned, and in contact with the array of discrete bottom contacts 1220 to form an array of nanotube memory cells. Each nanotube memory cell comprises a switching mechanism whereby the resistance state of the nanotube layer 1240 between the bottom contact 1220 and the upper conductive trace 1230 is controllably varied.

Each bottom contact 1220 is interconnected with a select access device—in this case, a diode 1222. Various other select devices e.g. FET devices may alternately be used. The select diodes 1222 are interposed between a substrate 1210 and the corresponding discrete bottom contacts 1220. The select diodes 1222 are disposed in an array in contact with select traces 1221 which are disposed in the substrate 1210. Each diode comprises an anode and cathode region—the materials that form these regions may be selected according to the particular fabrication constraints and operation requirements of the particular application and as described in U.S. patent application Ser. No. 11/835,865. Shown in FIG. 12 are select diodes having an anode in contact with the select traces 1221 and form a Schottky barrier diode between an anode (ANODE) and an N doped polysilicon region (N POL). An N+ doped polysilicon region is used to form an ohmic contact to the N POL cathode and to contact bottom contact (B-CONT). An N+ region may be selected to ensure a good ohmic contact with B-CONT conductor and also with the NPOL region. A direct contact between B-CONT and N POL may, in certain embodiments, be problematic because it may form a Schottky diode (as is the case between N POL and ANODE conductor) and the desired diode steering behavior would be inhibited. This effect is well known in the industry and elaborated upon in the incorporated references. The cathode (N POL) is formed so as to optimize the Schottky diode characteristics between N POL and the anode (ANODE) region. The contact (B-CONT) is chosen to form a near-ohmic low resistance contact with the nanotube fabric region (via the bottom contact 1220), while also forming a low resistance contact with the cathode (N POL). In certain embodiments, the select diode 1222 may be a metallic junction Schottky diode. Note that select diode 1222 is formed at the surface between ANODE and N POL. Alternatively, select diode 1222 may include the ANODE, N POL, and N+ POL.

Various constructions of the select diodes 1222 are envisioned by the inventors and disclosed in detail in incorporated reference, U.S. patent application Ser. No. 11/835,865. Select diodes may include semiconductor materials, metallic materials, and, in certain embodiments, nanotube materials. A variety of example materials and constructions are described in the following paragraphs.

N+ polysilicon patterned layer semiconductor may be used as one Schottky diode 1222 contact and as an array interconnect line. N+ polysilicon semiconductor may be silicon or germanium, for example, and is typically doped to $10^{20}$ dopant atoms/cm$^3$ with a resistance of 0.04 Ω/square. While the semiconductor may be used as an array line, a lower resistance array line may be formed by depositing N+ polysilicon semiconductor on a molybdenum silicide conductor between the N+ semiconductor layer and the surface of an insulator layer. A second N-polycrystalline silicon or germanium semiconductor patterned layer (semiconductor), in contact with the first semiconductor, is typically doped in the range of $10^{14}$ to $10^{17}$ dopant atoms/cm$^3$, with a resistance of 15 Ω/square and forms the cathode terminal of Schottky diode 1222 which is used as a cell selection device. Dopants may be arsenic, phosphorous, and antimony for example. Polysilicon conductors and are typically 400 nm thick and 2 um in width.

One or more embodiments of the select diode 1222 include one or more of the following features. The anode includes a conductor material and the cathode includes a semiconductor material. The anode material includes at least one of Al, Ag, Au, Ca, Co, Cr, Cu, Fe, Ir, Mg, Mo Na, Ni, Os, Pb, Pd, Pt, Rb, Ru, Ti, W, Zn, $CoSi_2$, $MoSi_2$, $Pd_2Si$, $PtSi$, $RbSi_2$, $TiSi_2$, $WSi_2$ and $ZrSi_2$. The anode may include a semiconductor material of a first type and the cathode region may include a semiconductor material of a second type. The semiconductor material of the first type may be positively doped, the semiconductor material of the second type may be negatively doped, and the semiconductor element forms a PN junction. In yet other embodiments a nanotube fabric layer may be used to form the cathode terminal of the select diode 1222. The nanotube fabric element forming the cathode may be substantially vertically or horizontally disposed and may include a nonwoven multilayered fabric with a thickness between approximately 20 nm and approximately 200 nm. In yet other embodiments, the select element 1222 is not a diode but a field effect transistor.

In each such embodiment, the select device is constructed to be suitable for contact with bottom conductive contact 1220, which, in turn is constructed to be suitable for contact with nanotube layer 1240. In certain embodiments, bottom conductive contact 1220 comprises a bilayer material with a bottom portion selected for contact with the selection device 1222 and an upper portion selected for contact with the nanotube layer 1240. The material selections in this instance could be chosen to minimize resistance between the select device 1222 and the nanotube layer 1240.

FIGS. 13 A-D illustrate plan views and cross sectional views of NRAM cells having nanotube blocks, top and bottom contacts and nanotube-above-bit line configurations, according to certain embodiments of the invention.

Figure 13A:
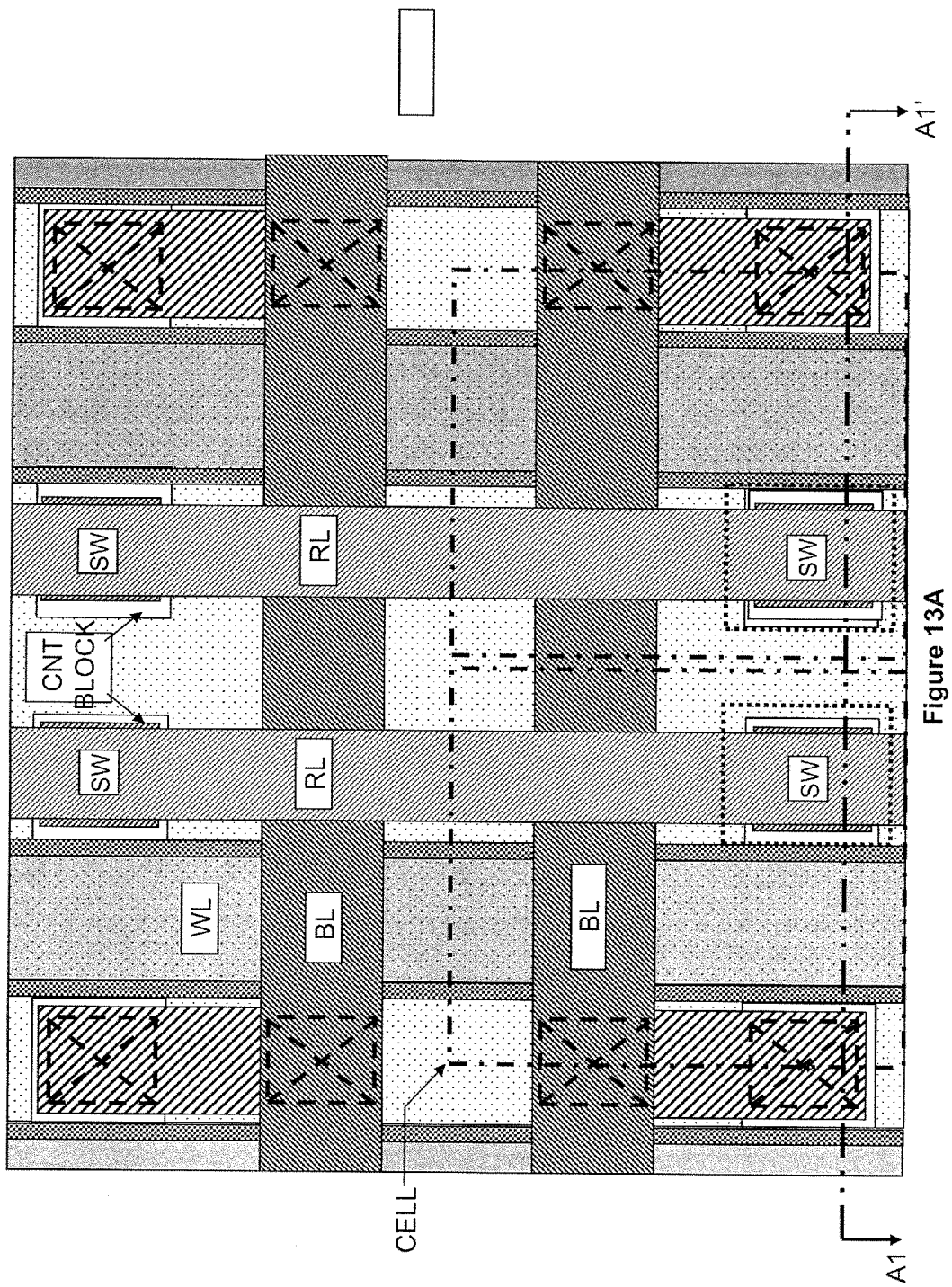
FIGS. 13 A-D illustrate plan views and cross sectional views of NRAM cells having nanotube blocks, top and bottom contacts and nanotube-above-bit line configurations, according to certain embodiments of the invention.

FIG. 13A illustrates a plan view of NRAM memory array showing four memory cells that use NV NT block switches as nonvolatile storage devices at or near the top of the memory array structure. FIG. 13A specifically shows an NRAM cells in an array in which the reference lines (RL) and word lines (WL) are substantially parallel. The bit lines (BL) are substantially perpendicular to the RL and WL, the joint intersection defining a single NRAM cell in the array, as noted by the bold dashed line outlining left and right bottom cells. Discrete carbon nanotube blocks or posts (CNT BLOCK) define the active switching region (SW) and are delineated in the Figure by the bold dotted line outlining left and right bottom cells.

FIG. 13B shows a cross sectional view of the NRAM cell array structure of FIG. 13A. FIG. 13B illustrates corresponding memory array cross section taken along segment A1-A1'. The left and right memory cells and are mirror images of one another. Each memory cell uses insulated NV NT block switch illustrated in further detail above. The NRAM cells in an array have reference lines (RL) and word lines (WL) that are substantially parallel. The bit lines (BL) are substantially perpendicular to the RL and WL. The nanotube layers (e.g. CNT blocks) are disposed above the bit lines. Discrete carbon nanotube blocks or posts (CNT BLOCK) define the active switching region (SW) of the nonvolatile nanotube switches (NV NT SWITCH) delineated by the fine dotted lines. Each NRAM cell in the array, containing the NV NT SWITCH is delineated by the bold dashed line outlining left and right cells.

In certain embodiments of the structure shown in FIGS. 13A and B, a cell select transistor may be used. A cell select transistor includes source and drain formed in silicon substrate (N+ and PSUB regions, respectively). A gate fabricated with sidewall spacers, is part of array word line that forms gate regions and array interconnections and controls channel region ON and OFF states using well known FET device operating methods. Alternatively, a separate word line conductor (not shown) may be used to interconnect gate regions of select devices such as cell select transistor illustrated in FIGS. 13A and 13B. The conductive column embedded in a dielectric substrate, provides a conductive path which forms a first bottom contact terminal to NV NT block of NV NT block switch. A second top contact terminal RL to NV NT block is used as a top contact terminal and may be used as a mask when defining self-aligned NV NT block side surfaces as described further in the incorporated patent references. In certain embodiments, top contact terminal RL contacts a secondary word line. The left NV NT block switch is a mirror image of the right NV NT block switch.

The drain of each cell select transistor contacts the conductive column, which in turn contacts the NV NT switch. A conductive segment also contacts memory array bit line connecting the drain diffusion with the bit line. The drain is shared with an adjacent cell (not visible in FIG. 13A or 13B). Memory cells such as those forming the NRAM memory array with NV NT block switches as NV NT storage nodes form dense cells because of the compact 3-dimensional top and bottom contact NV NT block switch geometry (structure). In some embodiments, memory cell area (footprint) is estimated to be approximately 12-15 $F^2$ in area, where F is a minimum technology node dimension. It is further assumed that self-aligned vertical conductive columns are used when forming the cell structure. Such stacked contacts and filled via holes (vertical conductors) are illustrated in detail in the incorporated references. If vertical conductors are not self-aligned, the cell area is estimated in some embodiments to grow by more than 2× in size (footprint), to greater than 30$F^2$.

Figure 13C:
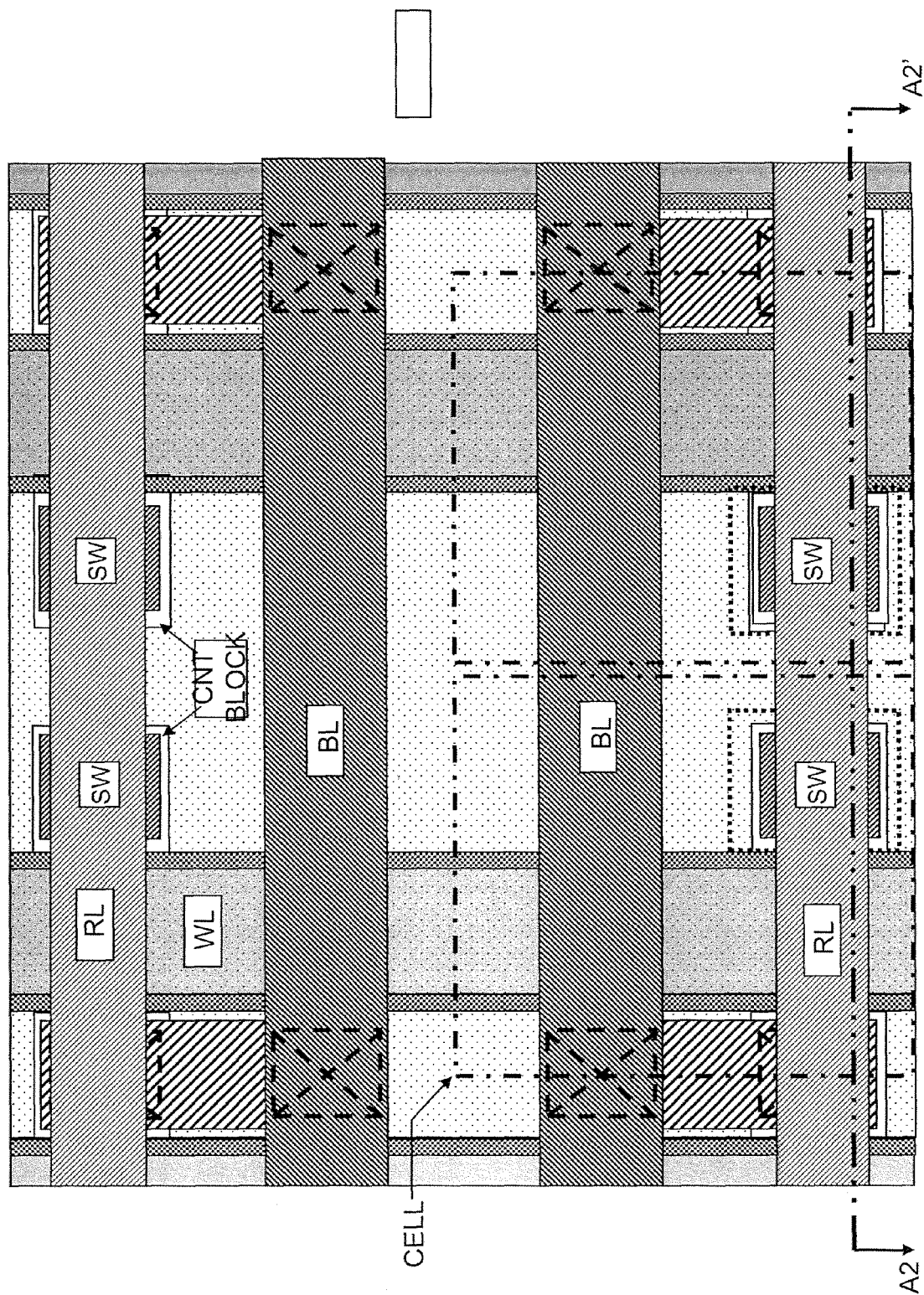

FIG. 13C illustrates a plan view of NRAM memory array showing four memory cells that use NV NT block switches as nonvolatile storage devices at or near the top of the memory array structure. FIG. 13C specifically shows an NRAM cells in an array in which the reference lines (RL) and bit lines (BL) are substantially parallel. The word lines (WL) are substantially perpendicular to the RL and BL, the intersection defining a single NRAM cell in the array, as noted by the bold dashed line outlining left and right bottom cells. Discrete carbon nanotube blocks or posts (CNT BLOCK) define the active switching region (SW) and are delineated in the Figure by the bold dotted line outlining left and right bottom cells.

Figure 13D:
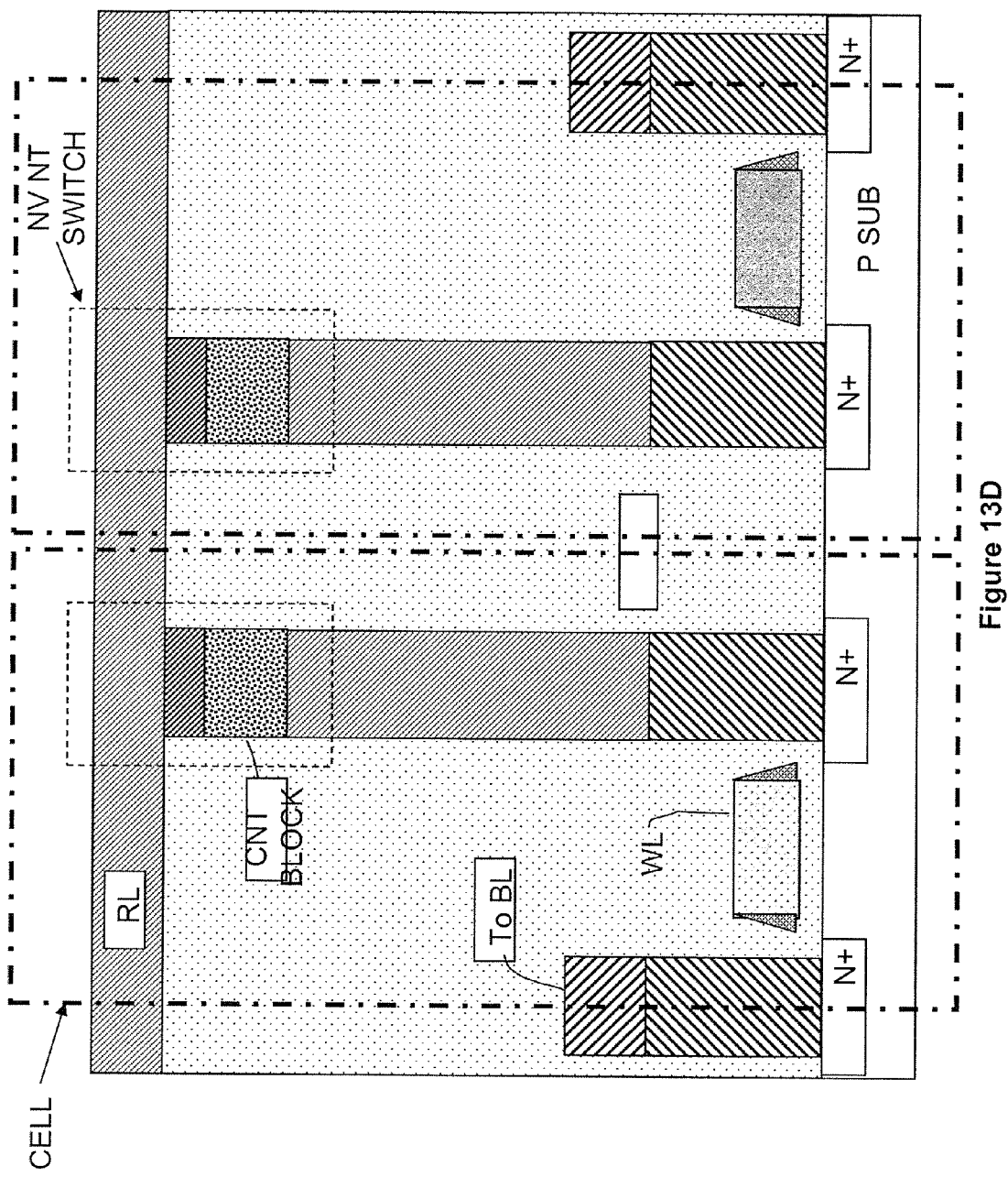

FIG. 13D shows a cross sectional view of the NRAM cell array structure of FIG. 13C. FIG. 13D illustrates corresponding memory array cross section taken along segment A2-A2'. The left and right memory cells and are mirror images of one another. Each memory cell uses insulated NV NT block switch illustrated in further detail above. The NRAM cells in an array have reference lines (RL) and bit lines (BL) that are substantially parallel. The word lines (WL) are substantially perpendicular to the RL and BL. The nanotube layers (e.g. CNT blocks) are disposed above the bit lines. Discrete carbon nanotube blocks or posts (CNT BLOCK) define the active switching region (SW) of the nonvolatile nanotube switches (NV NT SWITCH) delineated by the fine dotted lines. Each NRAM cell in the array, containing the NV NT SWITCH is delineated by the bold dashed line outlining left and right cells.

In those embodiments in which the RL and BL are substantially parallel, as shown in FIGS. 13C-D, selection circuitry such as cell select transistors are used. The cell select transistors shown in the present embodiment are substantially the same as those described above with reference to FIGS. 13A-B.

FIGS. 14A-D illustrate plan views and cross sectional views of NRAM cells having nanotube traces, top and bottom contacts and nanotube-above-bit line configurations, according to certain embodiments of the invention. The structures depicted in FIGS. 14A-D provide detailed views of NRAM arrays having the nanotube switching structure having a nanotube trace, described with reference to FIG. 2.

Figure 14A:
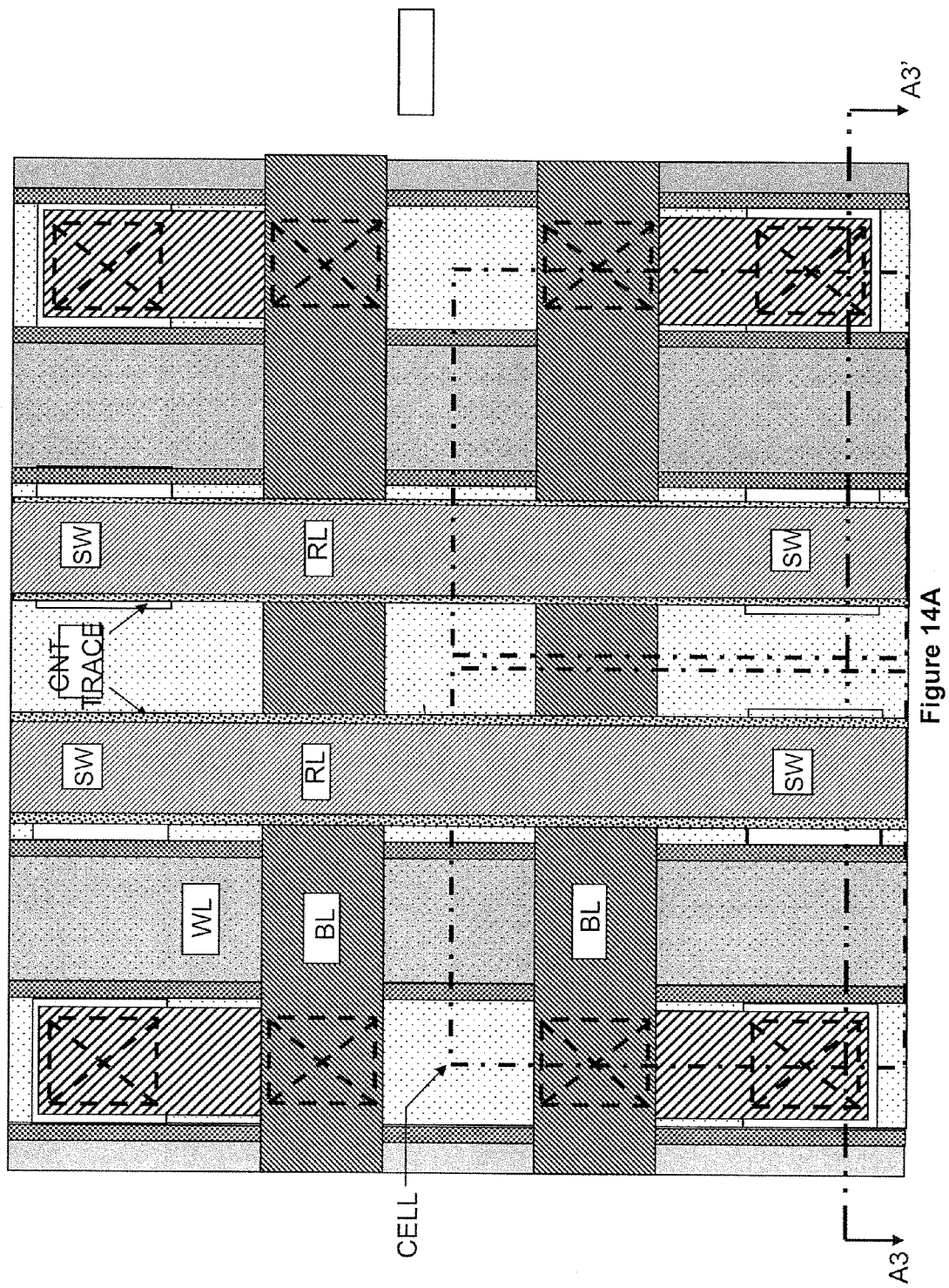
FIGS. 14 A-D illustrate plan views and cross sectional views of NRAM cells having nanotube traces, top and bottom contacts and nanotube-above-bit line configurations, according to certain embodiments of the invention.

FIG. 14A illustrates a plan view of NRAM memory array showing four memory cells that use NV NT trace switches as nonvolatile storage devices at or near the top of the memory array structure. FIG. 14A specifically shows an NRAM cells in an array in which the reference lines (RL) and word lines (WL) are substantially parallel. The bit lines (BL) are substantially perpendicular to the RL and WL, the intersection defining a single NRAM cell in the array, as noted by the bold dashed line outlining left and right bottom cells. Nanotube traces (CNT TRACE) are disposed aligned with and substantially conformal with the RL. The combined RL conductor-on-nanotube traces are disposed above the BL. In each cell, the CNT TRACE has an active switching region (SW), as described with reference to FIGS. 2 and 8.

Figure 14B:
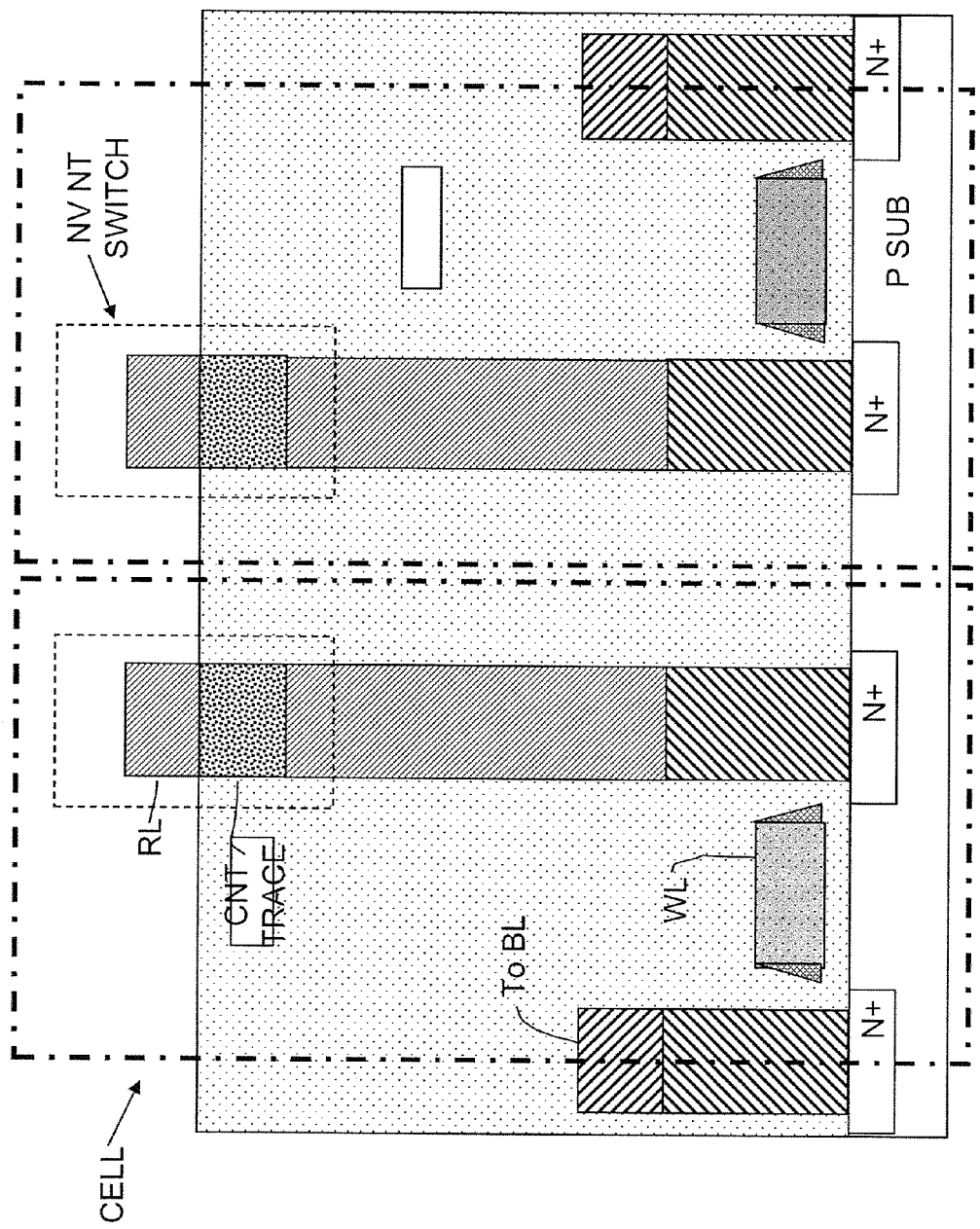

FIG. 14B shows a cross sectional view of the NRAM cell array structure of FIG. 14A. FIG. 14B illustrates corresponding memory array cross section taken along segment A3-A3'. The left and right memory cells and are mirror images of one another. Each memory cell uses insulated NV NT trace switch illustrated in further detail above. The NRAM cells in an array have reference lines (RL) and word lines (WL) that are substantially parallel. The bit lines (BL) are substantially perpendicular to the RL and WL. Nanotube traces (CNT TRACE) are disposed aligned with and substantially conformal with the RL. The combined RL conductor-on-nanotube traces are disposed above the BL. Nanotube traces (CNT TRACE) comprise an active switching region (SW) of the nonvolatile nanotube switches (NV NT SWITCH) delineated by the fine dotted lines. Each NRAM cell in the array, containing the NV NT SWITCH is delineated by the bold dashed line outlining left and right cells.

Figure 14C:
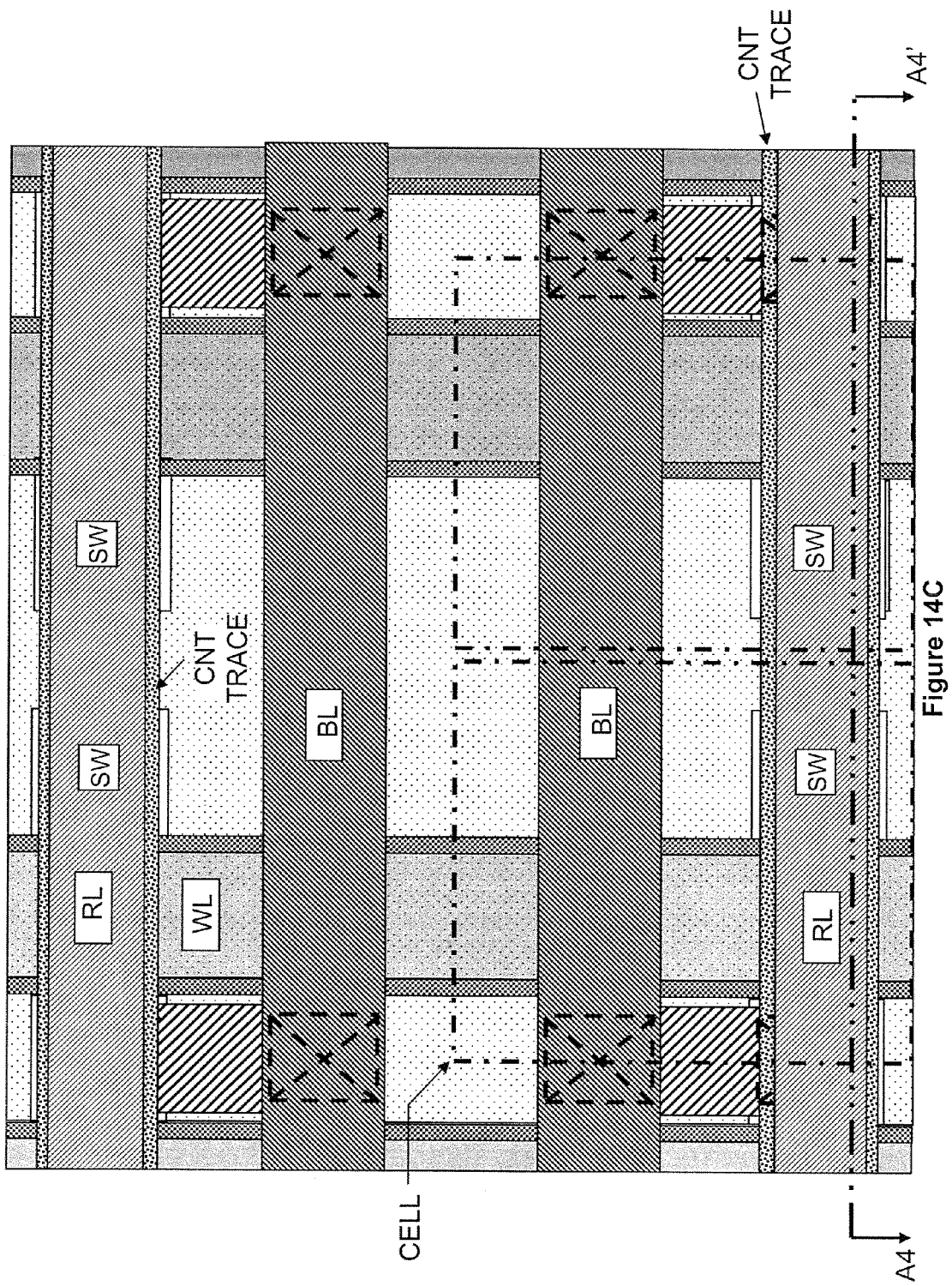

FIG. 14C illustrates a plan view of NRAM memory array showing four memory cells that use NV NT trace switches as nonvolatile storage devices at or near the top of the memory array structure. FIG. 14C specifically shows an NRAM cells in an array in which the reference lines (RL) and bit lines (BL) are substantially parallel. The word lines (WL) are substantially perpendicular to the RL and BL, the intersection defining a single NRAM cell in the array, as noted by the bold dashed line outlining left and right bottom cells. Nanotube traces (CNT TRACE) are disposed aligned with and substantially conformal to the RL, with the RL disposed over the CNT TRACE. The combined RL conductor-on-nanotube traces are disposed above the BL. In each cell, the CNT TRACE has an active switching region (SW), as described with reference to FIGS. 2 and 8.

Figure 14D:
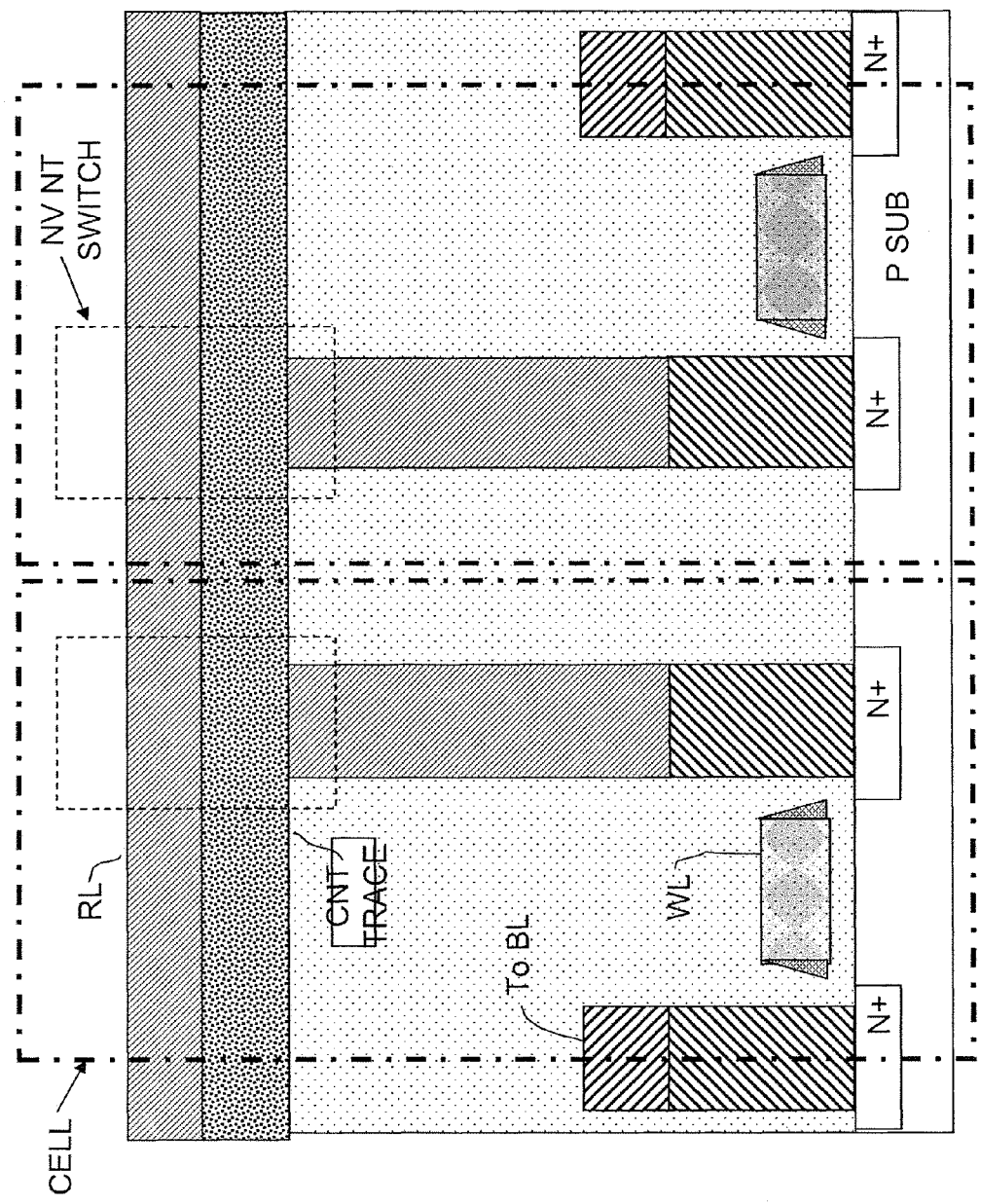

FIG. 14D shows a cross sectional view of the NRAM cell array structure of FIG. 14C. FIG. 14D illustrates corresponding memory array cross section taken along segment A4-A4'. The left and right memory cells and are mirror images of one another. Each memory cell uses insulated NV NT trace switch illustrated in further detail above. The NRAM cells in an array have reference lines (RL) and bit lines (BL) that are substantially parallel. The word lines (WL) are substantially perpendicular to the RL and BL. Nanotube traces (CNT TRACE) are disposed aligned with and substantially conformal to the RL, with the RL layer over the CNT TRACE. The combined RL conductor-on-nanotube traces are disposed above the BL. Nanotube traces (CNT TRACE) comprise an active switching region (SW) of the nonvolatile nanotube switches (NV NT SWITCH) delineated by the fine dotted lines. Each NRAM cell in the array, containing the NV NT SWITCH is delineated by the bold dashed line outlining left and right cells.

FIGS. 15 A-D illustrate plan views and cross sectional views of NRAM cells having nanotube planes, top and bottom contacts and nanotube-above-bit line configurations, according to certain embodiments of the invention. The structures depicted in FIGS. 15A-D provide detailed views of NRAM arrays having the nanotube switching structure having a nanotube trace, described with reference to FIG. 3.

Figure 15A:
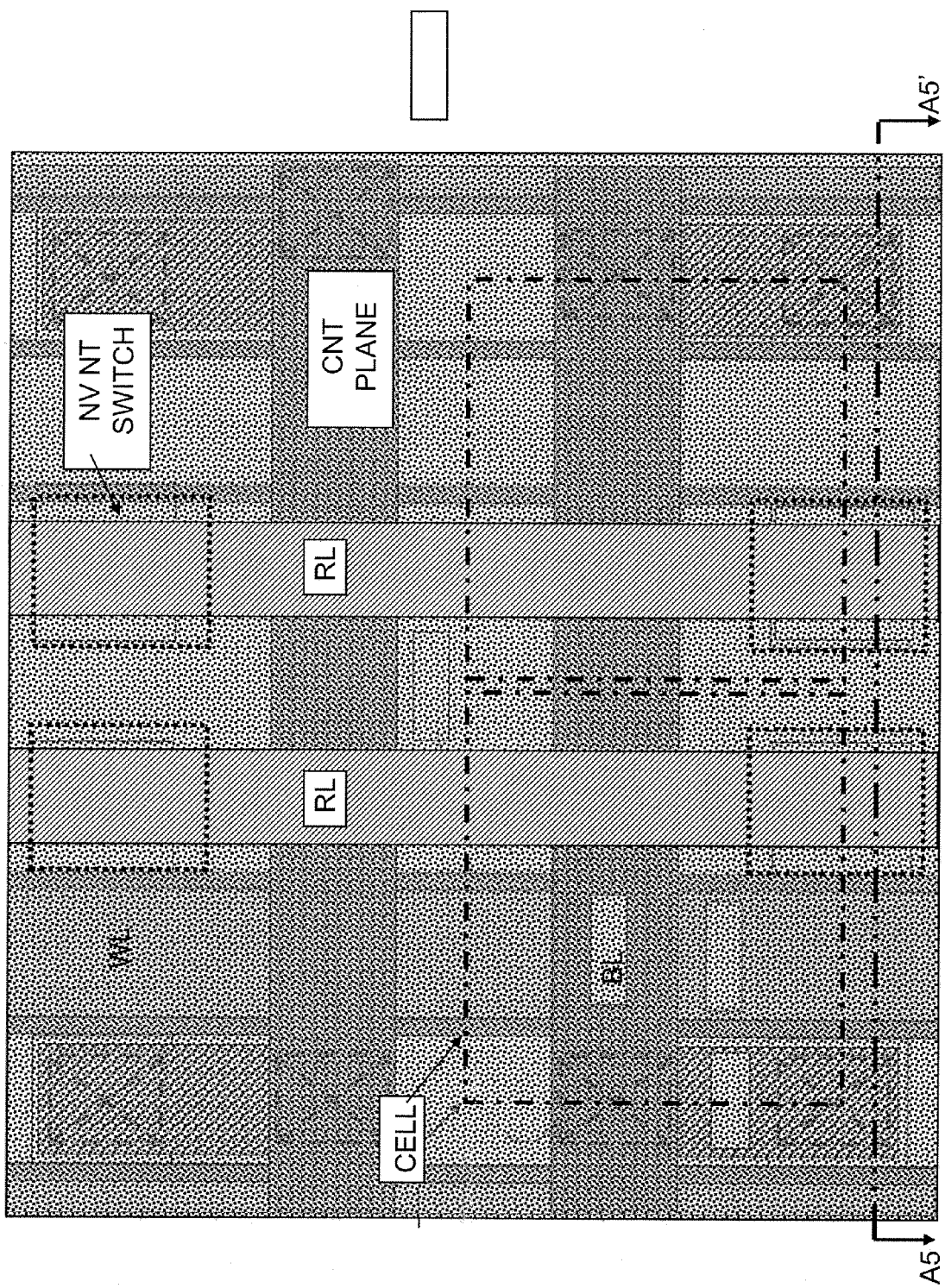
FIGS. 15 A-D illustrate plan views and cross sectional views of NRAM cells having nanotube planes, top and bottom contacts and nanotube-above-bit line configurations, according to certain embodiments of the invention.

FIG. 15A illustrates a plan view of NRAM memory array showing four memory cells that use NV NT trace switches as nonvolatile storage devices at or near the top of the memory array structure. FIG. 15A specifically shows an NRAM cells in an array in which the reference lines (RL) and word lines (WL) are substantially parallel. The bit lines (BL) are substantially perpendicular to the RL and WL, the intersection defining a single NRAM cell in the array, as noted by the bold dashed line outlining left and right bottom cells. A continuous nanotube layer forms a nanotube plane (CNT PLANE) are disposed over the WL and BL. The RL are disposed over the CNT PLANE. In each cell, the CNT PLANE has an active switching region (SW), as described with reference to FIGS. 3 and 8.

Figure 15B:
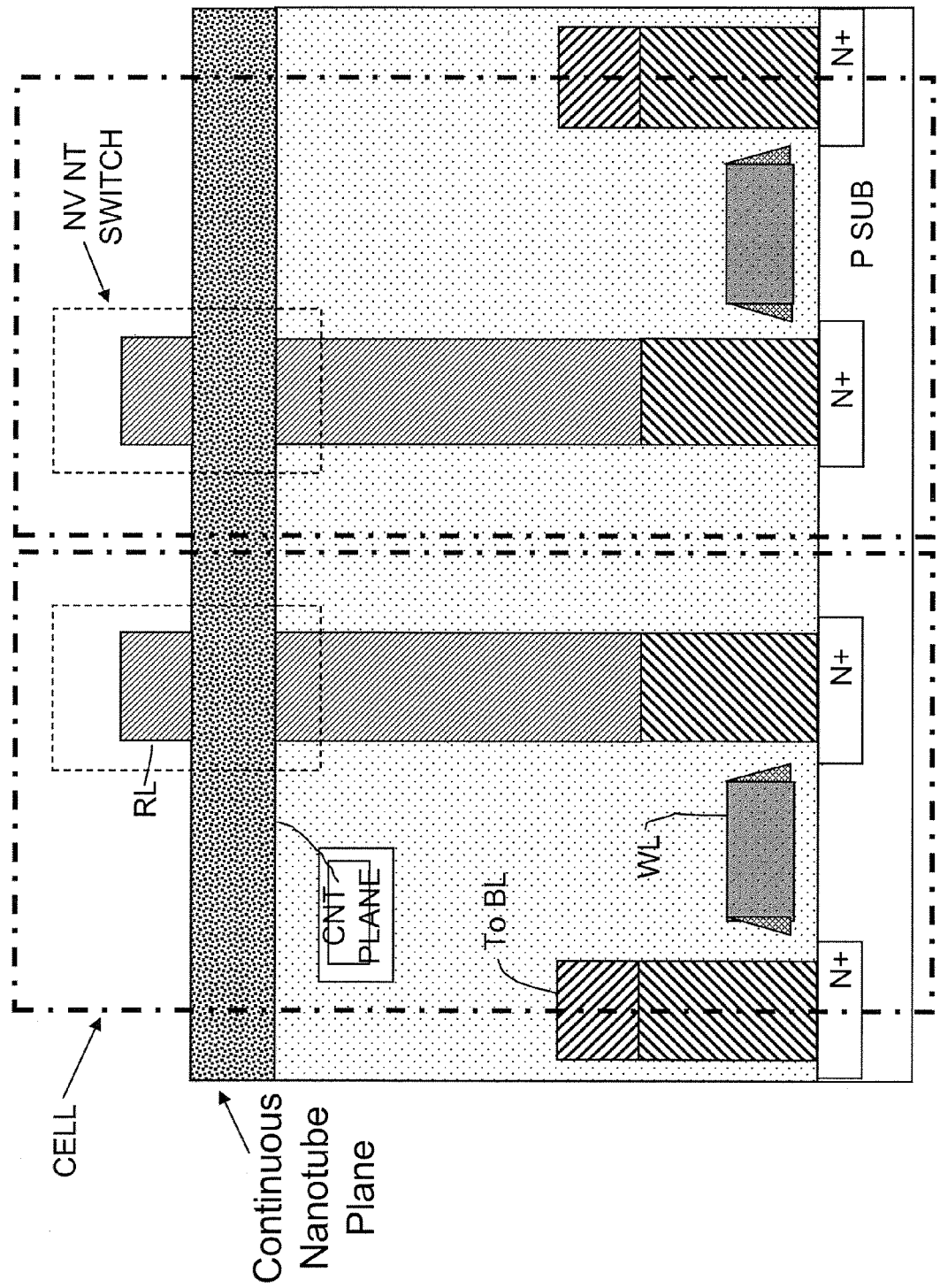

FIG. 15B shows a cross sectional view of the NRAM cell array structure of FIG. 15A. FIG. 15B illustrates corresponding memory array cross section taken along segment A5-A5'. The left and right memory cells and are mirror images of one another. Each memory cell uses insulated NV NT switch illustrated in further detail above. The NRAM cells in an array have reference lines (RL) and word lines (WL) that are substantially parallel. The bit lines (BL) are substantially perpendicular to the RL and WL. The continuous nanotube plane (CNT TRACE) is disposed above the BL and WL and over an upper surface of the substrate (e.g. a dielectric material). The nanotube plane (CNT PLANE) has a plurality of active switching regions (SW), each providing a nonvolatile nanotube switches (NV NT SWITCH) delineated by the fine dotted lines. Each NRAM cell in the array, containing the NV NT SWITCH is delineated by the bold dashed line outlining left and right cells.

Figure 15C:
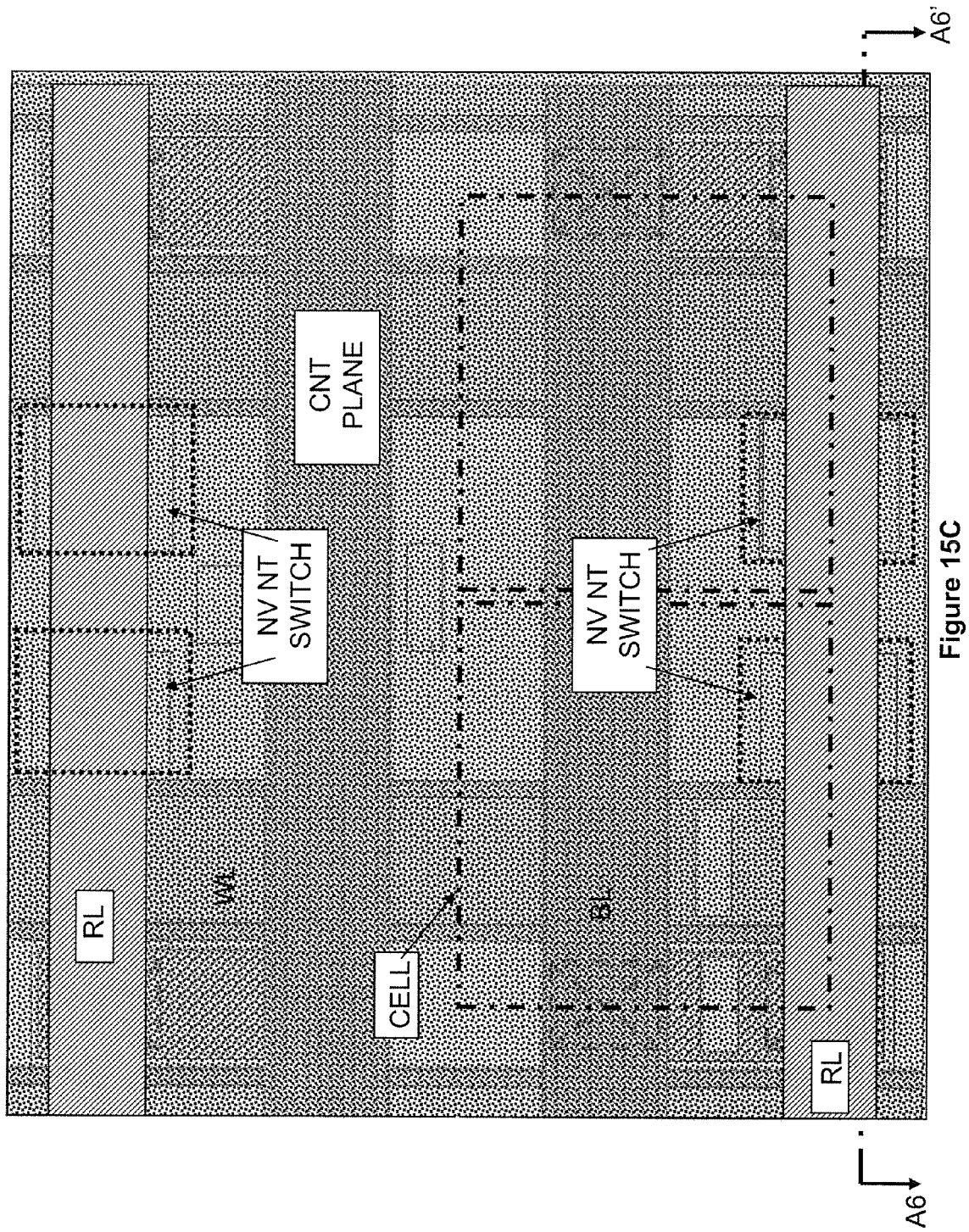

FIG. 15C illustrates a plan view of NRAM memory array showing four memory cells that use NV NT trace switches as nonvolatile storage devices at or near the top of the memory array structure. FIG. 15C specifically shows an NRAM cells in an array in which the reference lines (RL) and bit lines (BL) are substantially parallel. The word lines (WL) are substantially perpendicular to the RL and BL, the intersection defining a single NRAM cell in the array, as noted by the bold dashed line outlining left and right bottom cells. A continuous nanotube layer forms a nanotube plane (CNT PLANE) are disposed over the WL and BL. The RL are disposed over the CNT PLANE. In each cell, the CNT TRACE has an active switching region (SW), as described with reference to FIGS. 3 and 8.

Figure 15D:
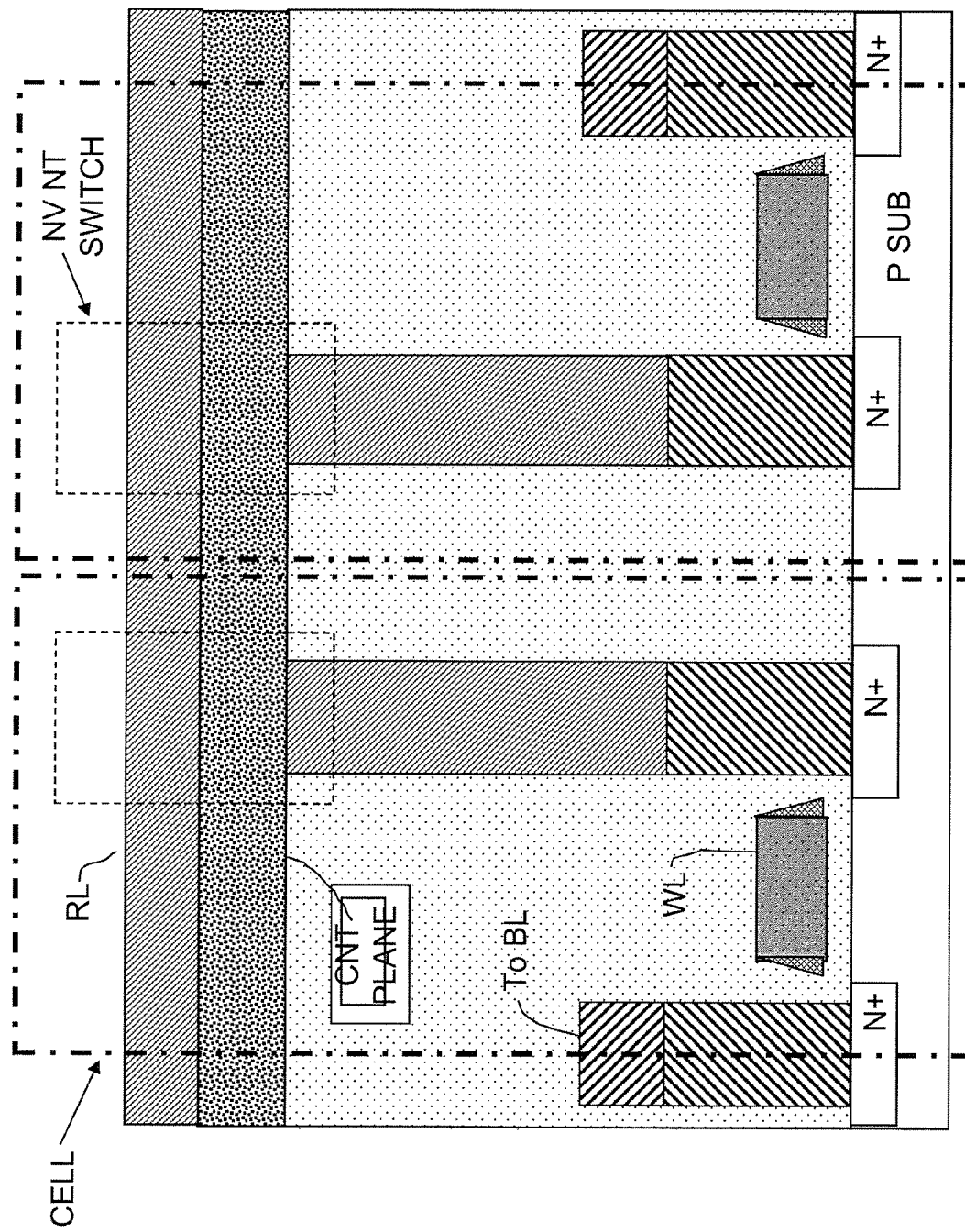

FIG. 15D shows a cross sectional view of the NRAM cell array structure of FIG. 15C. FIG. 15D illustrates corresponding memory array cross section taken along segment A6-A6'. The left and right memory cells and are mirror images of one another. Each memory cell uses insulated NV NT trace switch illustrated in further detail above. The NRAM cells in an array have reference lines (RL) and bit lines (BL) that are substantially parallel. The word lines (WL) are substantially perpendicular to the RL and BL. The continuous nanotube plane (CNT TRACE) is disposed above the BL and WL and over an upper surface of the substrate (e.g. a dielectric material). The nanotube plane (CNT PLANE) has a plurality of active switching regions (SW), each providing a nonvolatile nanotube switches (NV NT SWITCH) delineated by the fine dotted lines. Each NRAM cell in the array, containing the NV NT SWITCH is delineated by the bold dashed line outlining left and right cells.

FIGS. 16 A-B illustrate a plan view and a cross sectional view of NRAM cells having conductor-plane-on-nanotube-plane, top and bottom contacts and nanotube-above-bit line configurations, according to certain embodiments of the invention.

Figure 16A:
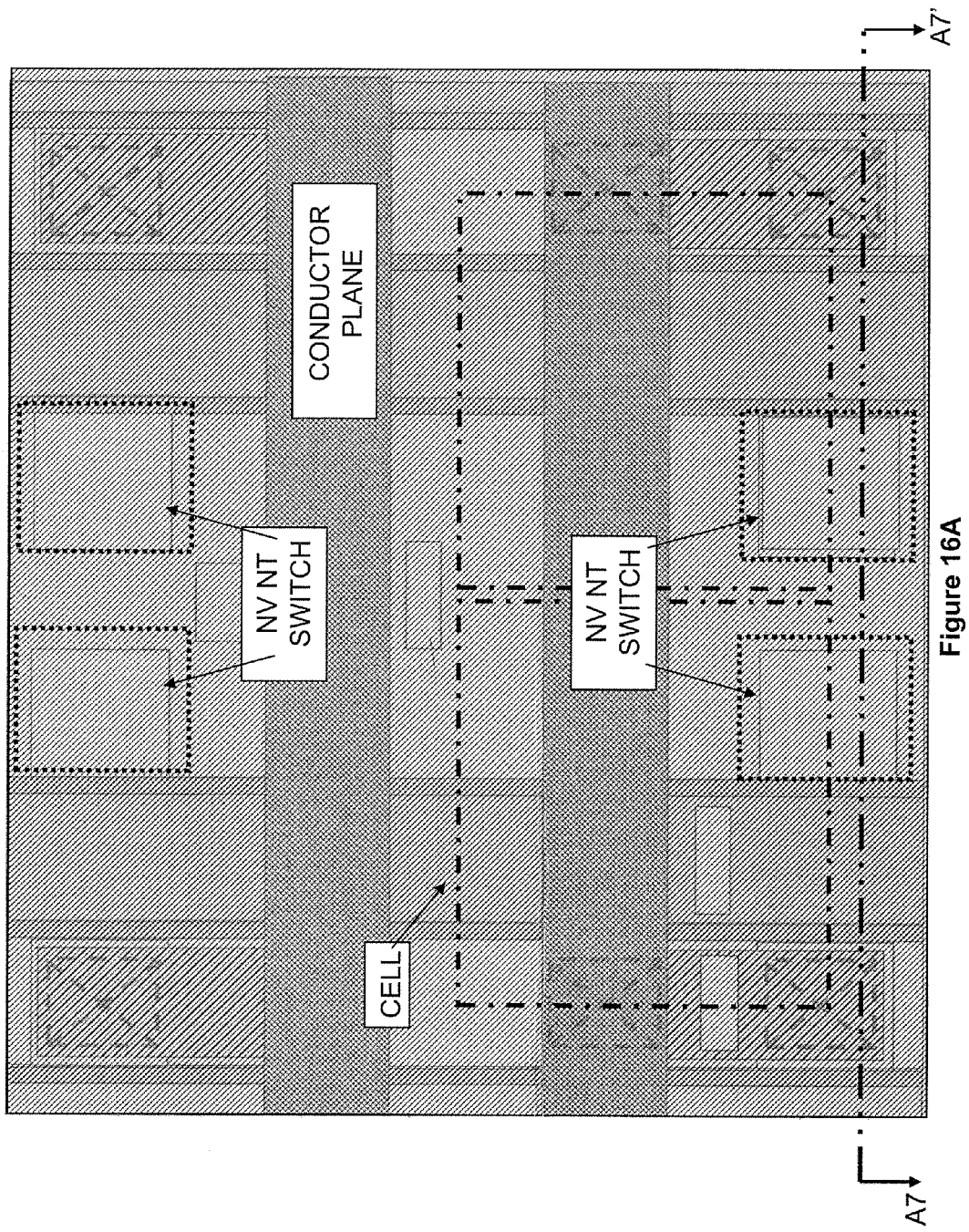
FIGS. 16 A-B illustrate a plan view and a cross sectional view of NRAM cells having conductor-plane-on-nanotube-plane, top and bottom contacts and nanotube-above-bit line configurations, according to certain embodiments of the invention.

FIG. 16A illustrates a plan view of NRAM memory array showing four memory cells that use NV NT trace switches as nonvolatile storage devices at or near the top of the memory array structure. FIG. 16A specifically shows an NRAM cells in an array in which the bit lines (BL) and word lines (WL) are substantially perpendicular. Instead of discrete trace elements providing reference lines (RL), FIG. 16A illustrates the embodiment in which the reference signal is provided via a conductor plane layer (CONDUCTOR PLANE), disposed over (and substantially conformal to) a continuous nanotube plane layer. The intersection of the BL and WL determine a single NRAM cell in the array, as noted by the bold dashed line outlining left and right bottom cells. A continuous nanotube layer forms a nanotube plane (CNT PLANE) are disposed over the WL and BL. The RL are disposed over the CNT PLANE. In each cell, the CNT PLANE has an active switching region (SW), as described with reference to FIG. 11B.

Figure 16B:
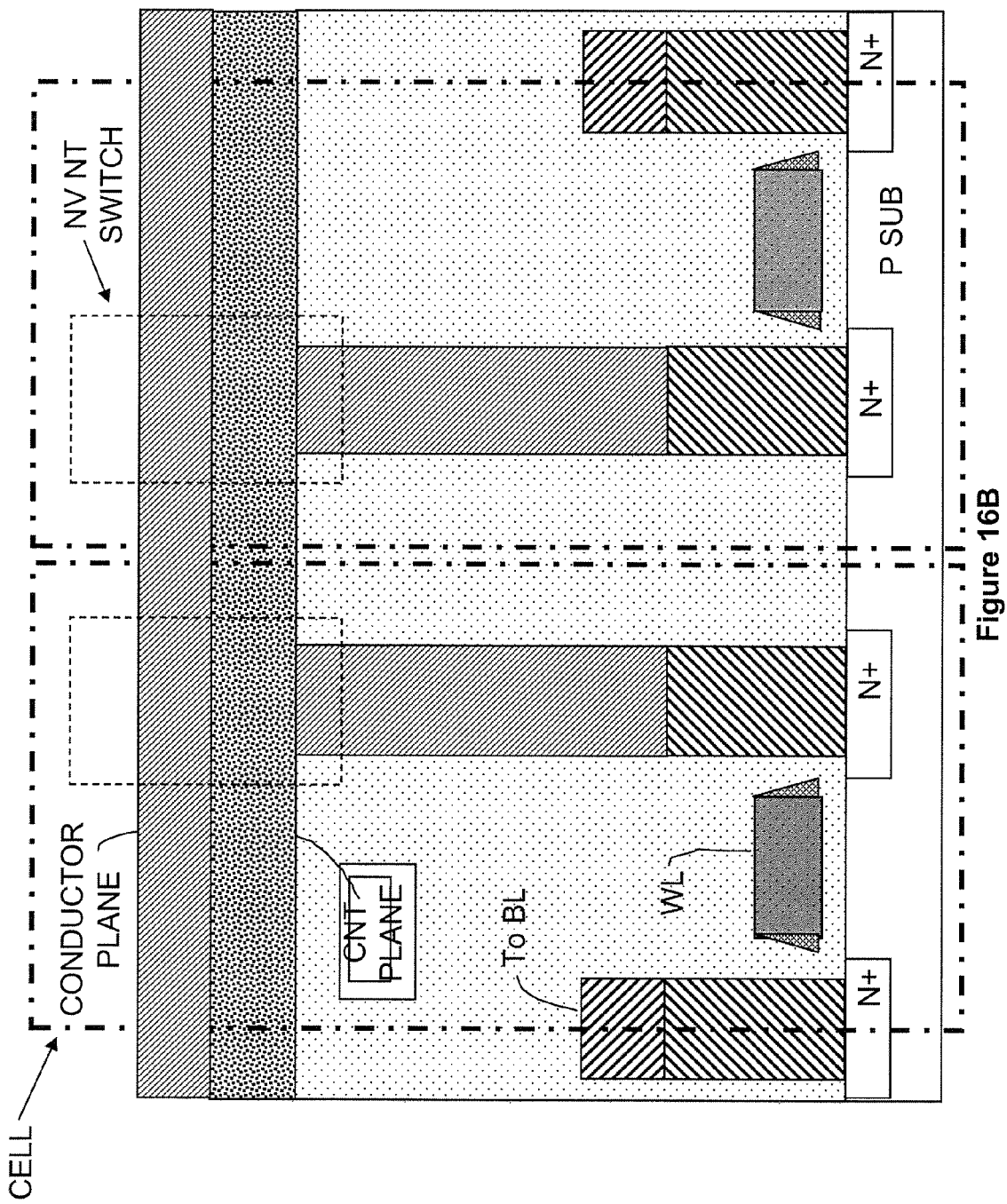

FIG. 16B shows a cross sectional view of the NRAM cell array structure of FIG. 16A. FIG. 16B illustrates corresponding memory array cross section taken along segment A7-A7'. The left and right memory cells and are mirror images of one another. Each memory cell uses insulated NV NT switch illustrated in further detail above. The conductor plane is conformally disposed over the nanotube plane. The CNT PLANE has a plurality of active switching regions (SW), each providing a nonvolatile nanotube switch (NV NT SWITCH) delineated by the fine dotted lines. Each NRAM cell in the array, containing the NV NT SWITCH is delineated by the bold dashed line outlining left and right cells.

In NRAM memory arrays described above with reference to FIGS. 13, 14, 15, and 16, nonvolatile nanotube structures were formed with nanotube blocks etches on all sides, nanotube traces etched on two sides, or a plane of non-etched nanotubes. As described further in U.S. patent application Ser. No. 11/835,865, nanotubes tolerate very high processing temperatures (as high as 800 to 1,000 deg. C.) and may be used at any level of semiconductor process flows. In the type of NRAM cell structures depicted in FIGS. 12-16, the nanotube material is deposited at or near the end of the semiconductor process flow after formation of FET devices, contacts, and metal array lines. An advantage of depositing and forming the nanotube storage elements at or near the end of the process flow is that various nanotube solutions, deposition techniques, geometries, and other characterstics may be tried with rapid turn-around-time (TAT) when optimizing the properties of nanotube storage elements. Rapid TAT is possible because prefabricated wafers may be stockpiled and then selected as needed, and nonvolatile nanotube storage elements are then fabricated with relatively few steps and quickly tested.

In order to achieve rapid TAT times, density of cells and corresponding arrays, described with reference to FIGS. 13-16, are lower because nonvolatile nanotube storage elements were formed after the fabrication of all arrays lines—in these examples, after the array of bit lines which is the top layer. Since array lines were laid out with word and bit lines on orthogonal grids, bit line spacing was nearly doubled to enable a vertical connection between the nanotube storage element and a corresponding N diffusion forming the source of the NRAM cell select FET. However, as has been demonstrated in stacked capacitor DRAM array cells [for example, those "capacitor over bitline" cells utilized for several years by Micron Technology, Samsung, Hynix DRAM technologies], layout techniques enabling $6F^2$ memory cells are possible even with storage elements above array with small deviations from orthogonal word and bit lines with respect to the FET device active area for example. Such techniques are applied to NRAM arrays as illustrated in FIG. 17, below.

FIGS. 17 A-I illustrate planar views of $6F^2$ NRAM cells, according to certain embodiments of the invention.

Figure 17A:
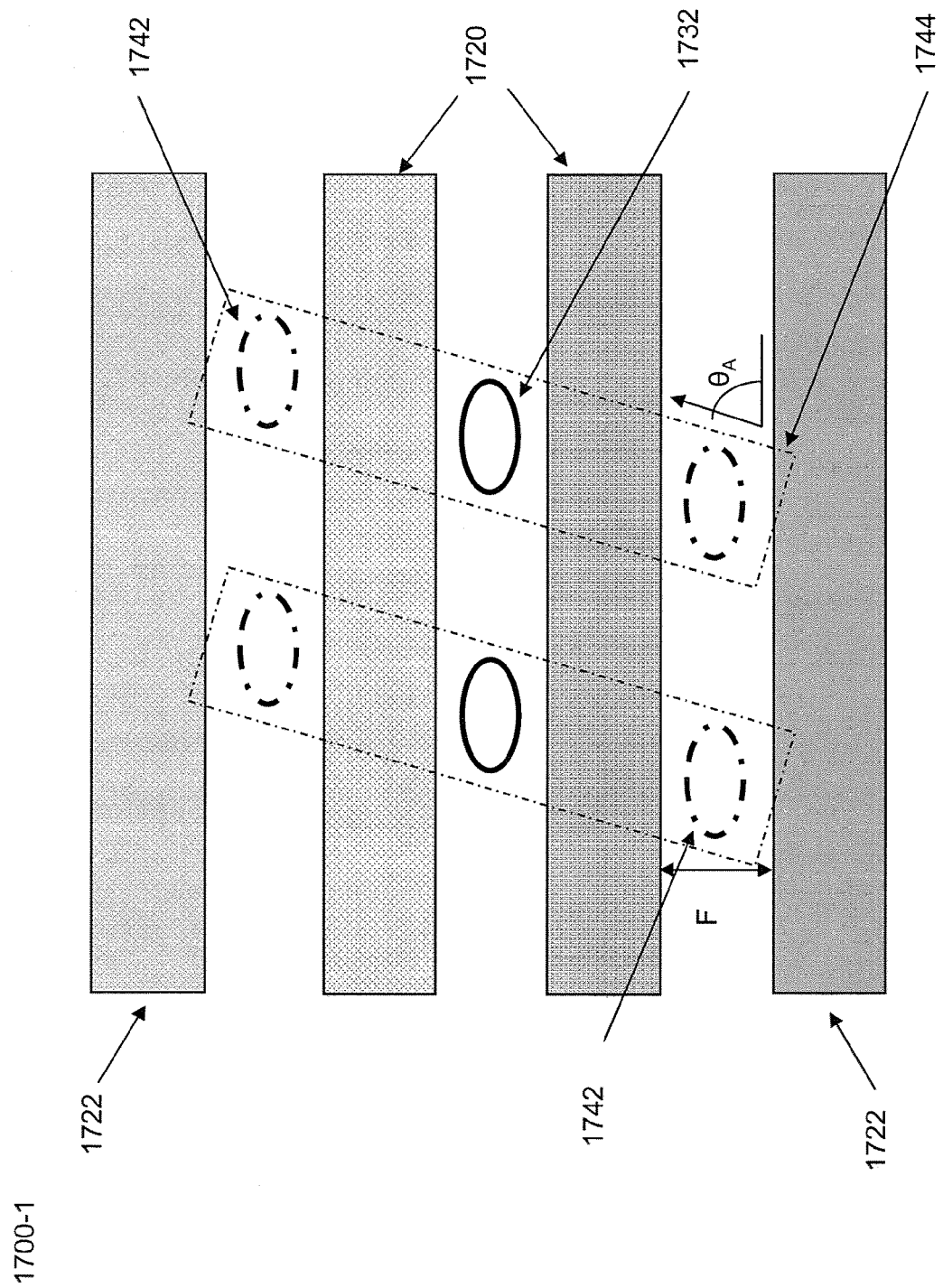
FIGS. 17 A-I illustrate planar views of $6F^2$ NRAM cells, according to certain embodiments of the invention.

FIG. 17A illustrates a planar view of select layers of a $6F^2$ NRAM cell showing word lines, contacts and active areas, with a nanotube-above-bit line configuration. Word lines 1720 are arranged substantially parallel to isolation word lines 1722. Spacing between the word lines and isolation word lines is greater than or equal to minimum fabrication dimension F, well understood in the art to refer to the nominal dimension of minimum features in a memory array, for a given process generation. As an illustration, one example of a minimum fabrication dimension includes F=90 nm, for the 90 nm technology node as defined by the International Technology Roadmap for Semiconductors. This example should not be construed as limiting, as the F dimension is defined by the particular fabrication instruments and process generation. Diffusion nanotube contact studs 1742 and shared diffusion bit line contact studs 1732 are aligned in an active region that intersects the parallel word lines 1720 and isolation word lines 1722. The nanotube layers and bit lines providing the contact studs are depicted in subsequent Figures. These diffusion nanotube contact studs 1742 and shared diffusion bit line contact studs 1732 are self-aligned along an active area region, indicated by the fine dashed lines 1744. In certain embodiments, the active area regions 1744 are disposed parallel to one another and intersecting the word lines at angle $\theta_A$. Angle $\theta_A$ may be selected to provide a dense memory cell arrangement, enabling 6F² NRAM cell—for example, in certain embodiments angle approximately $\theta_A \approx 76$ degrees. Greater or lesser angles are also envisioned. FIG. 17A shows only select portions or layers of the NRAM cell array— subsequent portions and layers are introduced in the ensuing discussion.

Figure 17B:
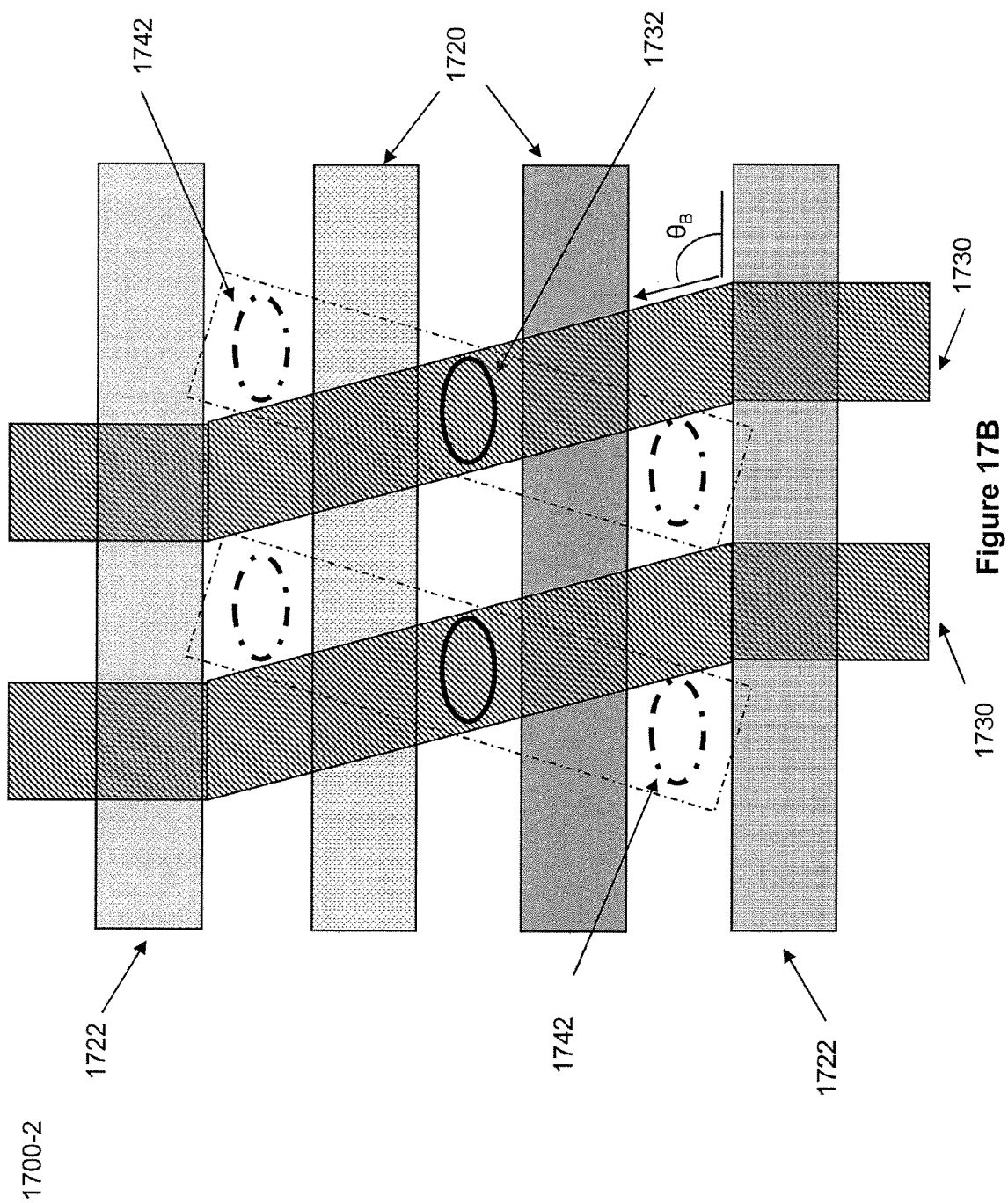

FIG. 17B illustrates a planar view of select layers of a 6F² NRAM cell showing bit lines, word lines, contacts and active areas, with a nanotube-above-bit line configuration. This Figure contains the elements depicted in FIG. 17A and additionally depicts bit lines 1730. Bit lines 1730 are disposed approximately parallel to one another, with at least a portion of each bit line set at angle $\theta_B$ with respect to the word lines and isolation word lines. Angle $\theta_B$ may be selected to provide a dense memory cell arrangement, enabling 6F² NRAM cell—for example, in certain embodiments angle approximately $\theta^B \approx 104$ degrees. Greater or lesser angles are also envisioned In the present embodiments, each isolation word line 1722 is used strictly for isolation purposes to isolate adjacent cell pairs. Isolation wordlines are typically biased to a low voltage (eg: GND) in an NMOS array. This ensures that the field device leakage current between active areas that are adjacent the isolation wordline is minimized which, in turn, eliminates adjacent bit disturb issues. In the present Figures, the word and bit lines provide a cell selection function to uniquely select a diffusion nanotube contact stud 1742 in the array. In each array (or subarray of a large density memory), a single wordline may be activated. In some array architectures, all bitlines may be used to write or read data to all bits accessed by the activated wordline. The nanotube contacts immediately adjacent the activated wordlines are then shorted to the associated bitlines to provide the biases necessary to program or read the cell. In a typical embodiment, the bitline contacts 1732 act as the source of the MOS access devices and the nanotube contacts 1742 act as the drain.

To achieve a 6F² cell layout for NRAM with MOS access devices, various fabrication techniques have been used. At the time of this application, inventors find effective various the fabrication techniques including those for High selectivity self-aligned contact (SAC) etching using etching gases including perfluorocarbon with and without carbon monoxide described in U.S. Pat. No. 7,329,610, incorporated by reference in its entirety. Other fabrication methods may be suitable for certain other embodiments of the invention. To form the word lines and isolation word lines at 1F spacing, self-aligned contact fabrication techniques may be used.

Some of these techniques for fabricating self-aligned contacts are well-known in the art and detailed, for example, in U.S. Pat. No. 7,329,610. Other techniques are described, for example, in "A 78 nm 6F² DRAM Technology for Multigigabit Densities", VLSI Technology Symposium, 1994, and U.S. Pat. No. 7,332,767, the entire contents of which are incorporated by reference. The references detail the 6F² DRAM cell from Micron Technology and high density memory devices having improved channel widths and decreased cell size. Specifically, the references disclose a manufacturable 6F² DRAM technology that results in a small DRAM cell size (0.036 µm²) by utilizing line/space patterning and self-aligned etches to improve process margin. This DRAM embodiment integrates composite high-k dielectric capacitors into the process. The present NRAM technology achieves 6F² cell density by, in some embodiments, using a similar process flow. While the present process flow does not entail the formation of the capacitors, the NRAM process flow is similar to that described in the incorporated references, up through the bitline formation and subsequent thru-contact process steps.

The layers shown in FIG. 17A may be provided to form structure 1700-1 as follows. The word lines are provided and are clad with a nitride spacer. Oxide may subsequently be deposited and planarized down to expose the nitride covering the wordlines. Subsequently, grooves may be patterned in a photoresist, the groove eventually being used to provide a contact wherever oxide is exposed. SAC (Self Aligned Contact) etching steps may be performed, selective to the nitride, removing the exposed oxide down to the surface of the active areas (e.g. oxide, which is disposed between the nitride spacers, is etched away).

The techniques used for processing NRAM structures are largely the same as those techniques widely employed by and well-known in semiconductor processing. However, in NRAM junction leakage is not a critical concern. Thus in certain methods of making the present nanotube structures, salicides may be formed on the source and/or drain regions of the access devices. This will greatly reduce the contact resistances to the access device and enable the use of W-Plugs. In contrast to the present NRAM components, DRAM arrays use non-salicided active areas of access devices and use poly plugs. This combination of components in DRAM structures leads to very high contact resistances but very low junction leakages, the latter of which is typically critical for DRAM retention times. Thus, achieving a low junction leakage in DRAM constrains the material options from which the DRAM cells are constructed. Because junction leakage is not a critical concern in the present NRAM structures, the material options are not similarly constrained.

Following the formation of the SAC's for bitline contacts 1732 and nanotube contacts 1742, the structures may then be filled with a conductor and planarized. Typically, heavily doped polysilicon or a metal such as Ti/TiN/W may be used, although other suitable materials may be substituted. For example, titanium is deposited into the contacts followed by TiN to provide low contact resistance to the active areas. Tungsten is then used to complete filling of the contact holes. After W deposition, the surface metal (W/TiN/T) is run thru chemical mechanical polishing (CMP) processes to expose the SiN and oxide surrounding the metal filled plugs. When this stage is complete, each contact is filled with metal and isolated from other plugs leaving a planar surface of SiN and oxide, with the surface of the metal fill plugs exposed for future processing.

The layers shown in FIG. 17B, to form structure 1700-2, may be subsequently provided. Bitlines 1730 may be formed to connect to the source of the access devices via metal-filled bitline contacts 1732. However, there is minimal to no spacing between the bitlines to be formed and the exposed surface of the metal plugs filling the nanotube contacts 1742. To ensure that nanotube contacts 1742 do not short to the bitlines 1730, a dielectric such as TEOS is deposited. A typical thickness is on the order of 500 Å. Bitline Contacts (but not the nanotube contacts) are then re-patterned and etched to expose the surface of the lower W-Filled bitline contacts 1732. The pattern used (not shown) is a simple circle surrounding the bitline contacts 1732.

Metal bit lines are commonly provided by depositing metal and capping with SiN and patterning it according to well-known techniques. SiN spacers are then formed on the sidewalls of the bitlines to enable another SAC process which will extend the nanotube contacts above the bitlines. The specific steps involved in depositing and patterning metal bit lines are detailed, for example in the following incorporated references: U.S. Pat. Nos. 7,329,610, 7,332,767, and the publication, "A 78 nm $6F^2$ DRAM Technology for Multigigabit Densities", VLSI Technology Symposium, 1994. The processing steps are well-known in the industry. After the SiN spacers are formed on the bitlines, an oxide dielectric is deposited and planarized back to expose the SiN surface of the bitlines, in the same method as that used for the wordlines (described above). The pattern for forming the NT contacts is a simple groove that runs in a parallel orientation to the wordlines and is placed between the isolation wordline and the access device wordline. A SAC etch is then performed. This etch will remove the exposed oxide between the SiN-clad bitlines and above the nanotube contact 1742, thereby exposing the metal plug surface. The plugs are then filled with a conductive material, for example Ti/TiN/W and planarized in the same was as described above. At this point in processing method, the surface is substantially planar with the exposed surface of the nanotube contact plugs ready to accept the application of the carbon nanotube fabric.

Figure 17C:
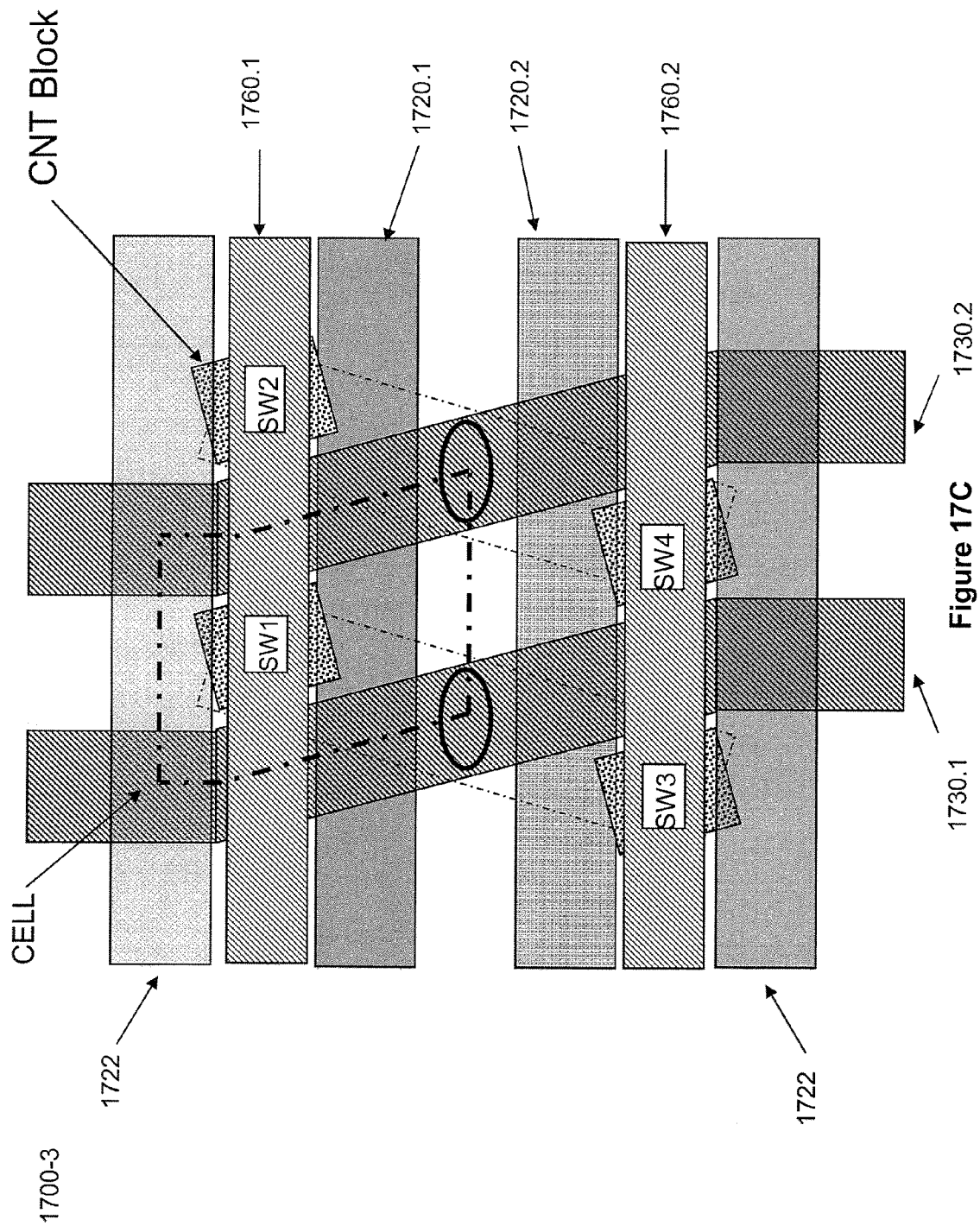

Subsequently, the layers shown in FIG. 17C to form structure 1700-3 may be provided. FIG. 17C shows discrete carbon nanotube blocks (CNT Block) patterned over the diffusion nanotube contact studs 1742. The discrete carbon nanotube blocks may be provided using nanotube deposit and etching techniques describe in detail in the incorporated references (esp. U.S. Pat. No. 6,706,402, U.S. patent application Ser. Nos. 11/835,865 and 11/835,613). Finally, reference lines RL (1760) are patterned over the discrete carbon nanotube blocks, thereby completing the NRAM cells. The reference lines are, in the present embodiment, oriented parallel to and disposed between the word lines and isolation word lines for each cell. Thus FIG. 17C shows one compact NRAM array implementation of the structure depicted in FIG. 1.

FIG. 17C shows the complete $6F^2$ NRAM cell array 1700-3 with discrete block nanotube switches (SW1-4), release lines parallel to word lines, top and bottom contacts, and a nanotube layer-above-bit line orientation. One cell in the NRAM array is delineated by the bold dashed line, which outlines the 6F2 dimensions. The $6F^2$ dimensions may be calculated by the 2F spacing from one bit line to the next (left to right, in the present planar view) and by the 3F spacing from one isolation word line to the region between adjacent word lines (up to down, in the present planar view). The angles $\theta_A$ and $\theta_B$ for the active areas and bit lines, respectively, enable this $6F^2$ dimensions because they allow subsequent layer to be fabricated in offset alignment (e.g. bit lines oriented in 1F spacing between active areas).

FIG. 17C details the first and second reference lines 1760.1, 1760.2, first and second word lines, 1720.1, 1720.2, first and second bit lines 1730.1, 1730.2 and discrete block nanotube switches SW1, SW2, SW3 and SW4. Various operation examples are now discussed. When operating the NRAM cells, the isolation WL is always maintained at a low signal, in order to isolate the cells. When WL1 1720.1 is high, the two top selection devices (transistors) are connected to SW1 and SW2, respectively, enabling the SW1 and SW2 switching states to be changed, according to the selected operation. If a readout operation for SW1 is to be performed, BL1 1730.1 is precharged. If a readout operation for SW2 is to be performed, BL2 1730.2 is precharged. When WL2 1720.2 is low, the two bottom selection devices (transistors) are off thereby isolating SW3 and SW4 from the bitlines.

In certain read and write operations, the bit lines, word lines, and reference lines may be pulsed with signals to control the resistance state of the nanotube block. Details regarding the electrical stimulus applied to switch the resistance state of the nanotube layer (discrete blocks, traces, planes) are explained fully in the incorporated references U.S. patent application Ser. Nos. 11/835,583, and 11/835,612. For those embodiments in which non-volatile nanotube switches are used, a switching state of SW 1-4 is non-volatilely maintained. Various read and write functions (R/W0/W1) may be performed using combinations of signals that depend on the particular architecture of the array in a selected embodiment. For example, in some architectures, an erase function may be achieved using capacitive discharge of the bitline. Read functions may be performed in numerous ways, some such methods minimizing the voltage swings on the array lines to lower power consumption and impact bias conditions. Certain memory array embodiments will entail various signal combinations and bias conditions, and may be selected by one of skill in the art.

Figure 17D:
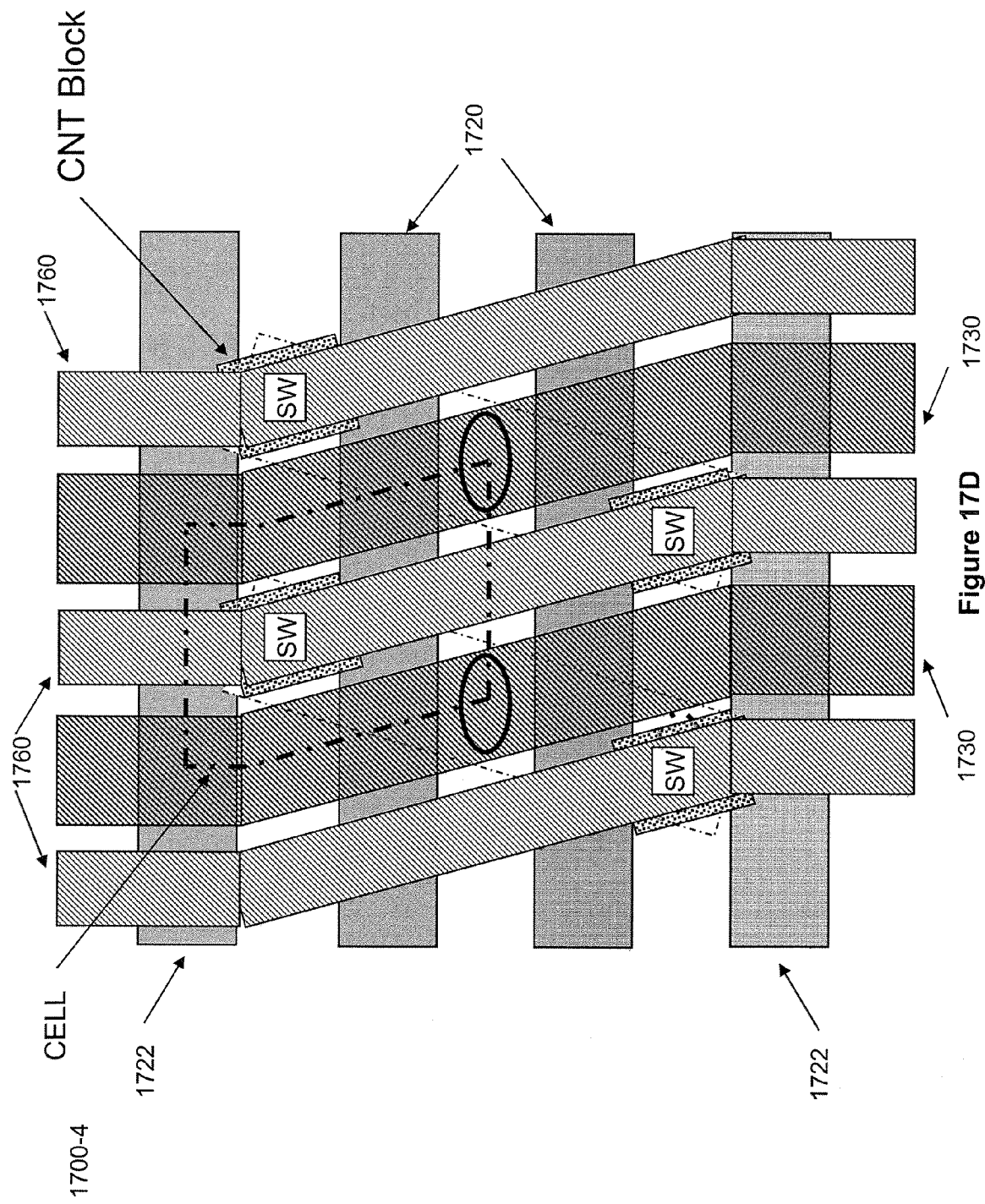

FIG. 17D provides a planar view of a $6F^2$ NRAM cell array 1700-4 in which includes discrete block nanotube switches, top and bottom contacts, nanotube-above-bit line configuration, and reference lines oriented in parallel with bit lines. The structure depicted in FIG. 17D is similar to that structure describe above with reference to FIG. 17C, except that the present embodiment has reference lines oriented in parallel with the bit lines. The fabrication techniques used to provide reference lines over the discrete block nanotube switches and parallel to the bit lines are similar to those techniques detailed above. The present structure achieves the $6F^2$ dimensions as describe above.

The structures depicted in FIGS. 17C (1700-3) and 17D (1700-4) have the advantage of combining array density and a construction wherein the nanotube element is disposed above the bit line. Traditionally, NRAM construction has required a trade-off between density and nanotube-above-bit line construction.

Previously disclosed techniques for creating memory arrays have entailed constructing nanotube layers disposed below the bit lines. By constructing memory cells in this manner, the processing time is reduced and fabrication process flow simplified. Process time is reduced because wafers may be fabricated including all array lines including bit lines with contacts studs for contacting nanotube terminals to the source of corresponding FET devices. These wafers are stored for use as needed to form the final NV NT block structures. For example, the boundaries of the nanotube switching element—in the present example, discrete nanotube blocks—may be dimensionally defined at the end of the process flow in relatively few steps and with short TATs because processing does not have to begin at or near the beginning of the CMOS process. While this technique has certain fabrication advantages in terms of process time, it can compromise the density of the arrays. Previously disclosed techniques for creating dense NRAM memory arrays have entailed constructing cells with nanotube elements disposed below bit lines as illustrated further below in FIG. 18. However, placing NV NT block storage devices below bit lines causes the fabrication process to begin at or near the beginning of the CMOS fabrication process and therefore results in a lengthy fabrication process flow and long turn around times.

Generally, there is a conventional trade-off between cell size and process complexity, with a smaller cell size achieved through a more complex and thereby lengthier process. There are clear incentives to decrease cell size in NRAM and achieve higher memory density. The production of $6F^2$ cells typically entails additional process steps that increase process complexity. Added process steps (modules) include the SiN cladding of wordlines and bitlines and a process step that opens the surface of the plug-filled bitline contacts, prior to bitline metal deposition. These modules are not warranted by larger cell designs (e.g. larger than $6F^2$) which may be fabricated through simpler process flows, well-known in the art. Thus conventional techniques typically entail a trade-off between NRAM cell density and simplicity/expediency of fabrication process flow.

The inventors note that furthermore, conventional techniques often entail a trade-off between complexity of fabrication process flow and yield. This conventional wisdom does not always hold. Added process complexity, through the inclusion of such processing steps, need not always correspond to poorer yield. This is because when the added complexity enables the formation of a smaller die, the overall defects on a given die can be reduced, thereby offsetting yield loss due to the added complexity. As noted in the incorporated references, Micron has produced $6F^2$ cells for DRAM, decreasing the cell size from $8F^2$ in DRAM. The smaller $6F^2$ cell, is advantageous in that it reduces overall die size, and thereby may provide more revenue per wafer. In DRAM, there are accompanying tradeoffs in the use of a $6F^2$ cell. One such tradeoff entails going from an folded bitline architecture ($8F^2$) to an open bitline architecture ($6F^2$).

The structures depicted in FIGS. 17C (1700-3) and 17D (1700-4) overcome the conventional trade-off between memory density and fabrication complexity by increasing density while retaining a comparatively simple process flow. The disclosed structures simultaneously achieving cell density and the nanotube-above-bit line construction, by disposing the active areas and bit lines at selected angles $\theta_A$ and $\theta_B$, respectively. Specifically, the angled bitlines and active areas are a means to enable a $6F^2$ cell with the open bitline architecture. Certain conventional trade-offs that accompany the use of a $6F^2$ cell in DRAM do not apply to a $6F^2$ cell in NRAM. For example, the DRAM array's sensitivity to noise is typically increased by switching from a folded bitline architecture ($8F^2$) to an open bitline architecture ($6F^2$). In contrast the NRAM array's sensitivity to noise is not affected by the open bitline architecture ($6F^2$). Thus, in the depicted embodiments is no clear disadvantage to an open bitline architecture ($6F^2$) for NRAM.

Figure 17E:
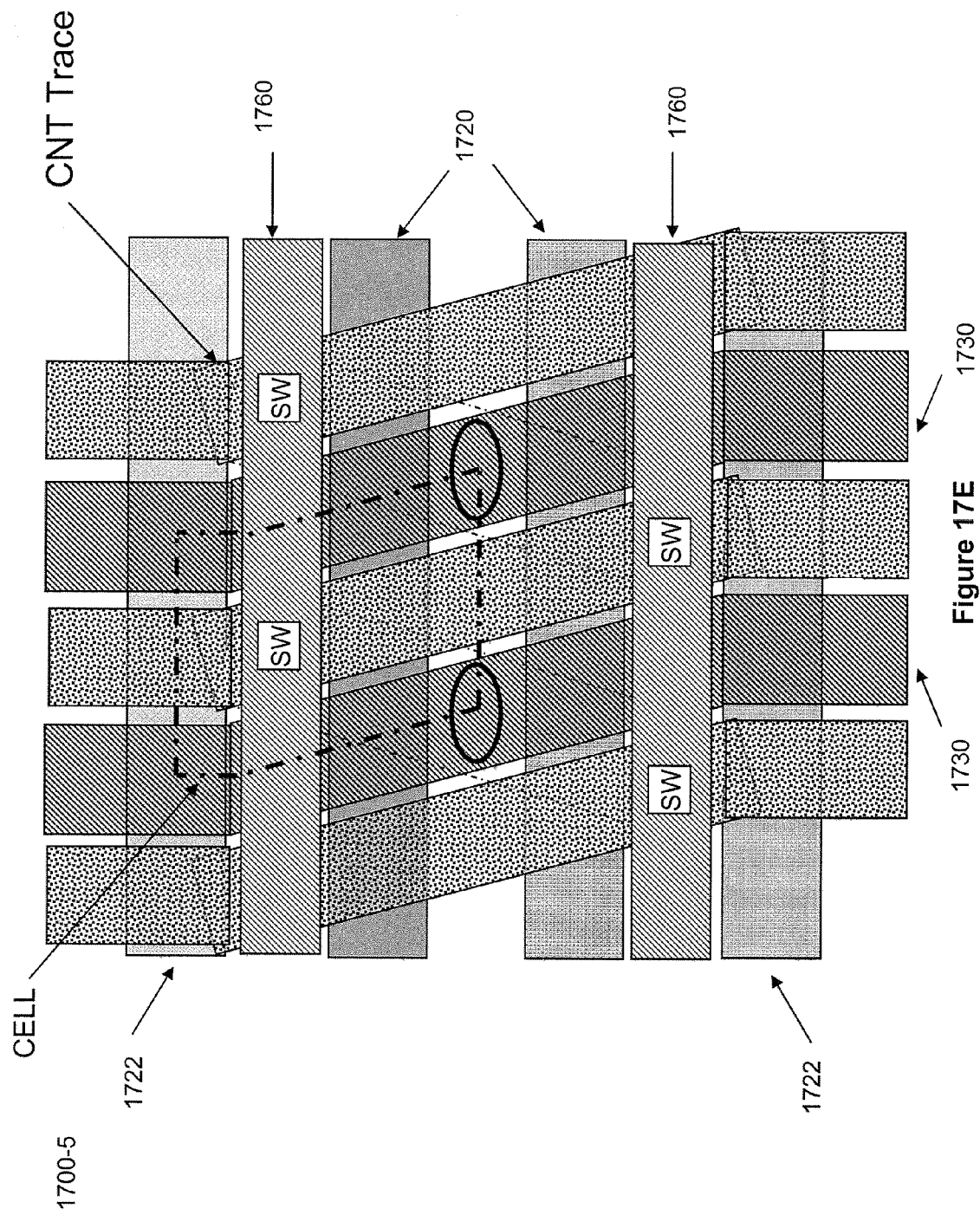

FIG. 17E depicts a planar view of a $6F^2$ NRAM memory array (1700-5) having nanotube traces, reference lines oriented in parallel with word lines, and nanotube-above-bit line construction. The present structure is similar to that depicted in FIG. 17C (1700-3) with the exception that the nanotube elements comprise nanotube traces (CNT Trace) instead of discrete nanotube blocks. The nanotube traces are disposed approximately in parallel with the bit lines and intersect the reference lines to form switches (SW) at the diffusion nanotube contact studs in the active regions. Thus the switches are located in approximately the same location as they were in the FIG. 17C example.

Using continuous nanotube traces in place of discrete nanotube blocks in structure 1700-5, as described with reference to FIG. 17E, has been shown to result in similar switching performance. In certain embodiments, there may be fabrication advantages to creating continuous nanotube traces in place of discrete nanotube blocks. Whereas etching discrete nanotube blocks entails defining the nanotube fabric in two directions (x and y, where z is normal to the planar view of the Figure), etching continuous nanotube traces entails defining the nanotube fabric in only one direction (e.g. y only). When those etching steps define minimum dimensions in a given direction, error control and error prevention is important. Using the present nanotube trace construction may allow for better etching error control and simplify the fabrication process (e.g. alignment) in certain contexts.

In certain embodiments, diffusion of current outside the active region of each switch is substantially minimized and cross-talk between adjacent cells is largely eliminated. In certain other embodiments, however, structures employing discrete nanotube blocks may have performance and fabrication advantages. For example, the structure 1700-3 depicted in FIG. 17C does not have any extraneous nanotube paths over the diffusion nanotube contact studs 1742, whereas the structure 1700-5 depicted in FIG. 17E does. Fabrication of the structure 1700-3 in FIG. 17C may also be simplified, in certain instances, if the reference lines are patterned over and at angle $\theta_B$ to nanotube traces and, subsequently, the nanotube traces are etched to form discrete nanotube blocks.

Figure 17F:
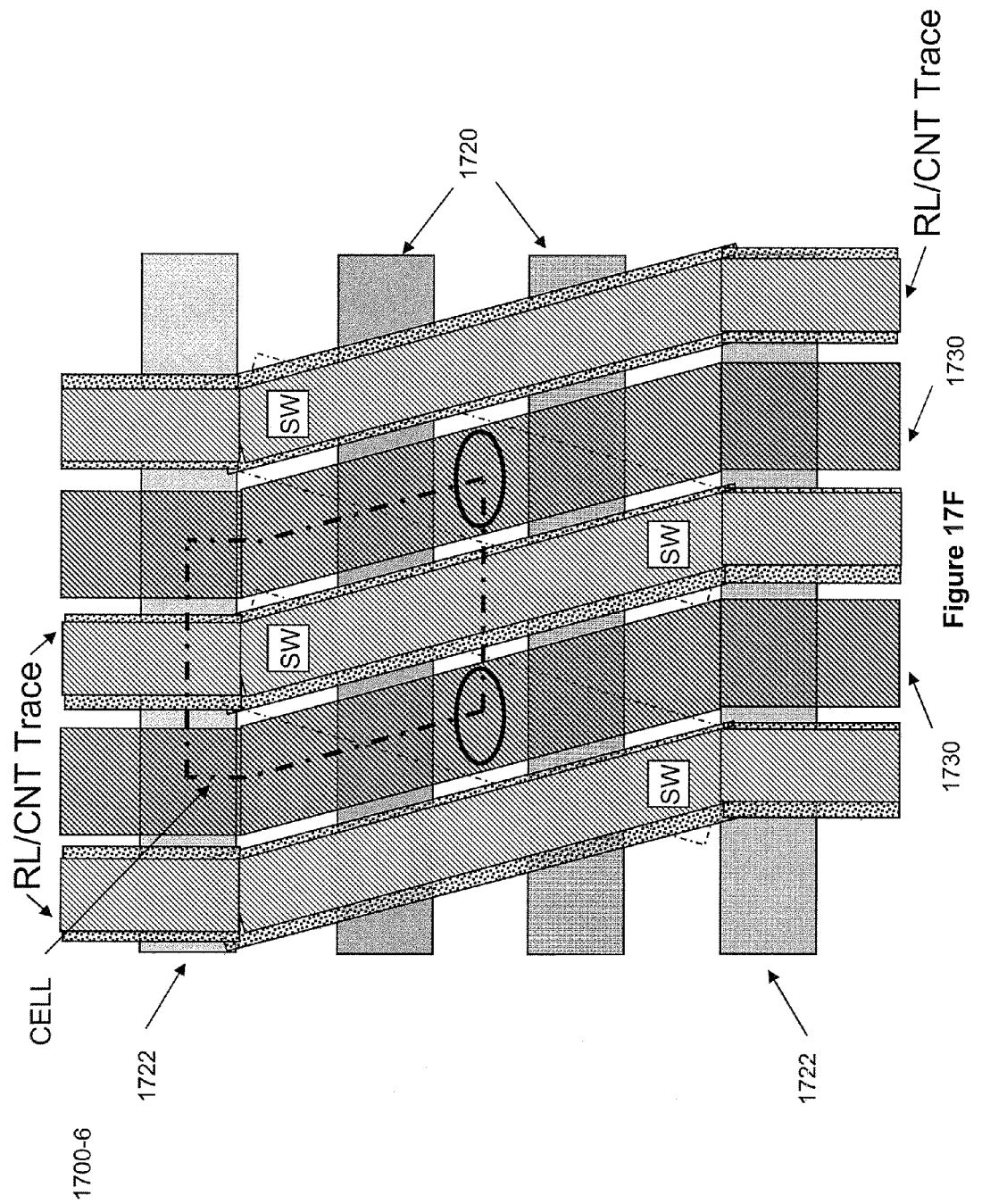

FIG. 17F depicts a planar view of a $6F^2$ NRAM memory array 1700-6 having conductor-on-nanotube trace construction, reference lines oriented in parallel with bit lines, and nanotube-above-bit line construction. The present structure 1700-6 is similar to that depicted in FIG. 17D 1700-4, with the exception that the nanotube elements comprise nanotube traces instead of discrete nanotube blocks. Those nanotube traces are disposed approximately in parallel with the bit lines and are approximately aligned with and conform to the reference lines. The reference lines and nanotube traces jointly form the conductor-on-nanotube trace construction (RL/CNT Trace), detailed in FIG. 2. The RL/CNT Traces intersect word lines and isolation word lines at angle $\theta_B$ and intersect the diffusion nanotube contact studs to form switch SW for each cell. In certain embodiments, the conductor-on-nanotube trace construction simplifies the fabrication process because the nanotube layer and the metal layer for the reference line may be patterned in a single photo-patterning step.

Figure 17G:
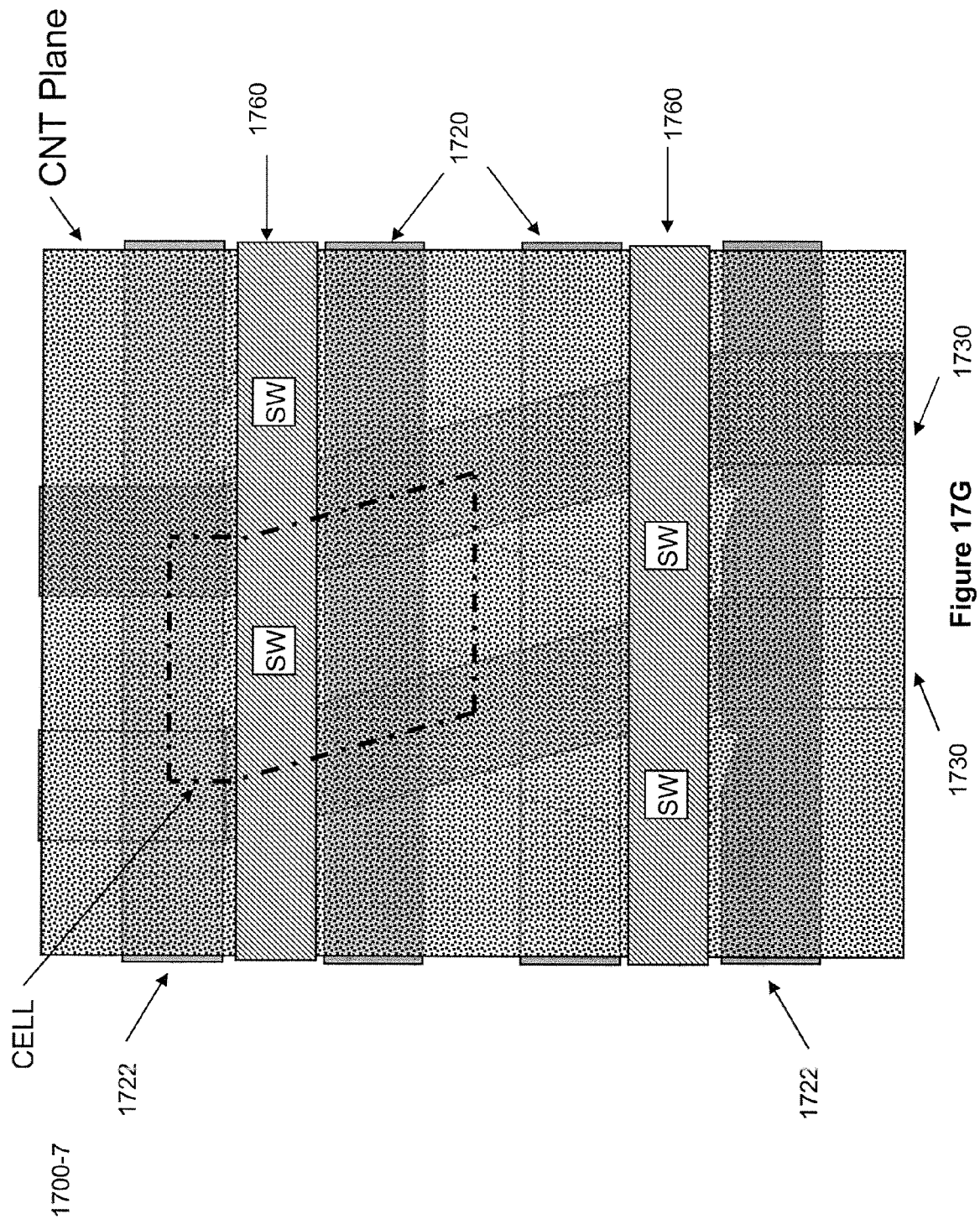

FIG. 17G depicts a planar view of a $6F^2$ NRAM memory array 1700-7 having conductor-on-nanotube plane construction, reference lines oriented in parallel with word lines, and nanotube-above-bit line construction. The present structure 1700-7 is similar to that depicted above in FIGS. 17C and 17E, with the exception that the nanotube element comprises a single, continuous, nanotube plane, instead of discrete blocks or traces. Each cell has a switching region SW of the nanotube layer that is disposed over the corresponding diffusion nanotube contact stud. The flow of electrical current in the nanotube layer is predominantly normal to the nanotube plane (normal to the page in the Figure). Fringing electrical current is controlled and cross-talk among adjacent cells is effectively minimized, as described below with reference to FIG. 19. The conductor-on-nanotube plane construction simplifies the fabrication process, in certain embodiments, because once the nanotube layer is applied, no nanotube patterning step is needed. This construction eliminates some of the alignment constraints involved in patterning nanotube traces and discrete nanotube blocks.

Figure 17H:
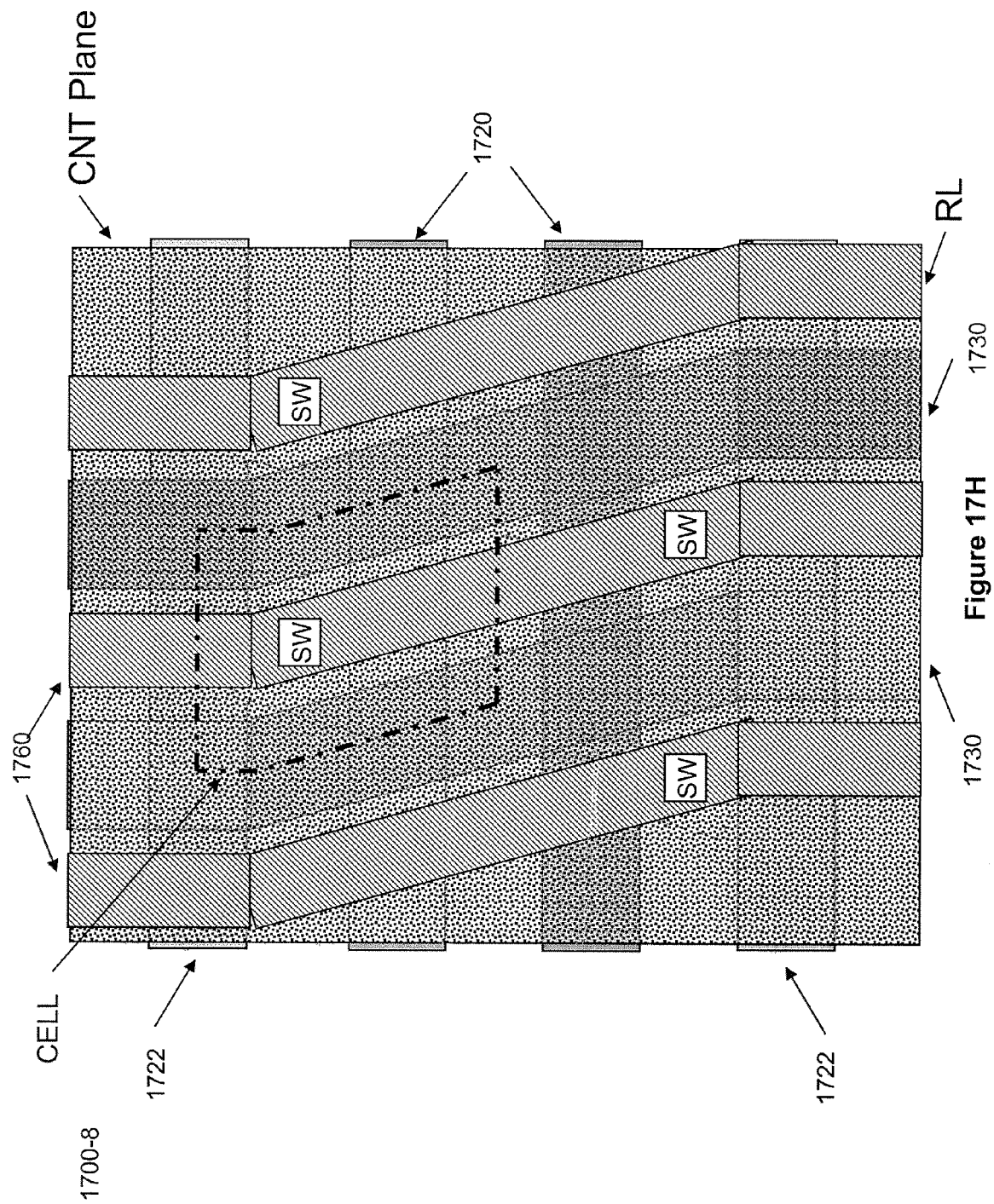

FIG. 17H depicts a planar view of a $6F^2$ NRAM memory array 1700-8 having conductor-on-nanotube plane construction, reference lines oriented in parallel with bit lines, and nanotube-above-bit line construction. The present structure 1800-8 is similar to that depicted above in FIGS. 17D 1700-4 and 17F 1700-6, with the exception that the nanotube element comprises a single, continuous, nanotube plane, instead of discrete blocks or traces. Each cell has a switching region SW of the nanotube layer that is disposed over the corresponding diffusion nanotube contact stud. The flow of electrical current in the nanotube layer is predominantly normal to the nanotube plane (normal to the page in the Figure). The fringing and performance considerations described above with reference to FIG. 17G apply to the present structure. The fabrication considerations described above with reference to FIG. 17G apply to the present structure as well.

Figure 17I:
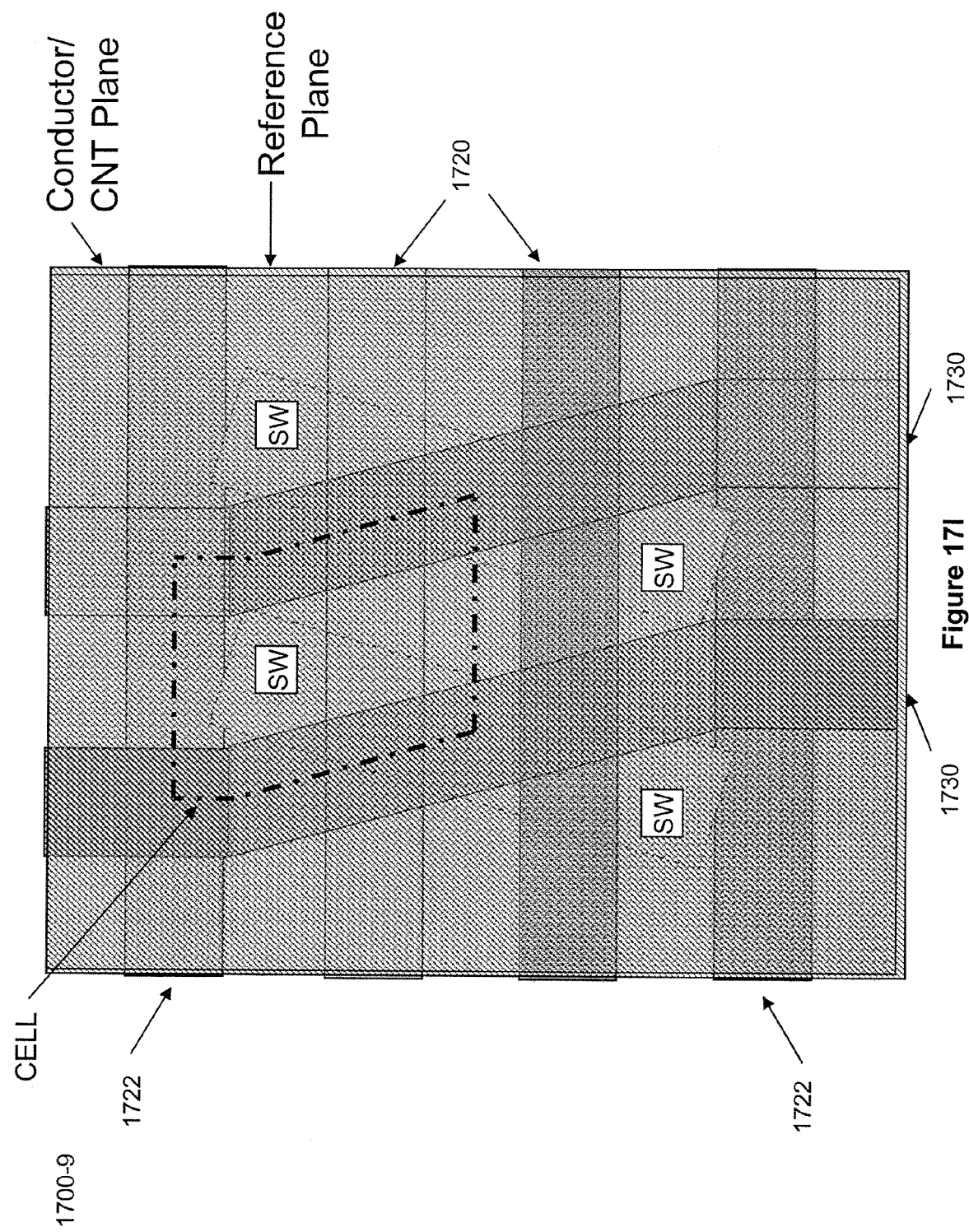

Lastly, FIG. 17I depicts a planar view of a $6F^2$ NRAM memory array 1700-9 having conductor plate-on-nanotube plane construction, and nanotube-above-bit line construction. The present structure comprises a continuous nanotube plane instead of discrete nanotube blocks or nanotube traces. Whereas the structures depicted in FIGS. 17G 1700-7 and 17H 1700-8, include reference lines disposed over the nanotube plane (CNT Plane) the present structure has a conductor plate disposed directly over and conformal to the nanotube plane. This construction yields a conductor plate-on-nanotube plane construction (Conductor/CNT Plane). The conductor plate carries the reference signal and substitutes for discrete reference lines. Accordingly, the active switching region is defined by the positioning of the diffusion nanotube contact studs. Active switching (SW) occurs where conduction through the nanotube plane layer is controlled between the contact stud and the reference conductor plate (normal to the page in the present Figure). The present construction 1700-9 simplifies the fabrication process because no nanotube patterning step is needed, nor is a reference line patterning step needed. Fringing electrical current and cross-talk among adjacent cells is also effectively minimized in the present embodiment.

NRAMs with dense cells, even smaller in area than $6F^2$ in some layouts, are possible with word and bit lines on orthogonal grids, as illustrated in U.S. patent application Ser. No. 11/835,613. For NV NT blocks etched on all sides, the storage elements are formed prior to the completion of array wiring such as prior to the formation of array bit lines, for example. Such dense NRAM arrays may also be formed using nanotube traces (CNT Trace) and nanotube planes (CNT Plane) as illustrated further below in FIG. 18.

Figure 18A:
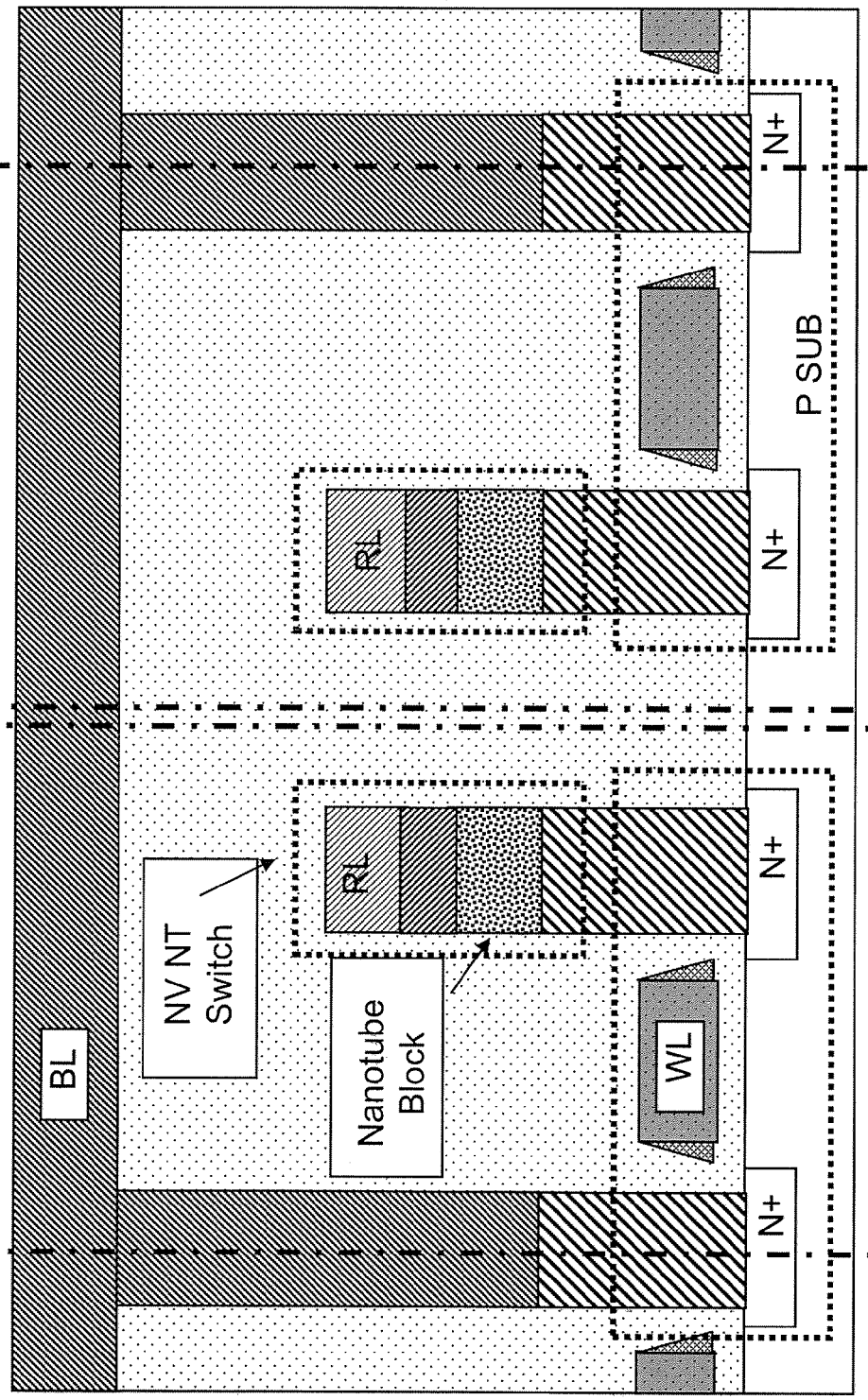
FIGS. 18A-C illustrate cross sectional views of NRAM cells, according to certain embodiments of the invention.
Figure 18B:
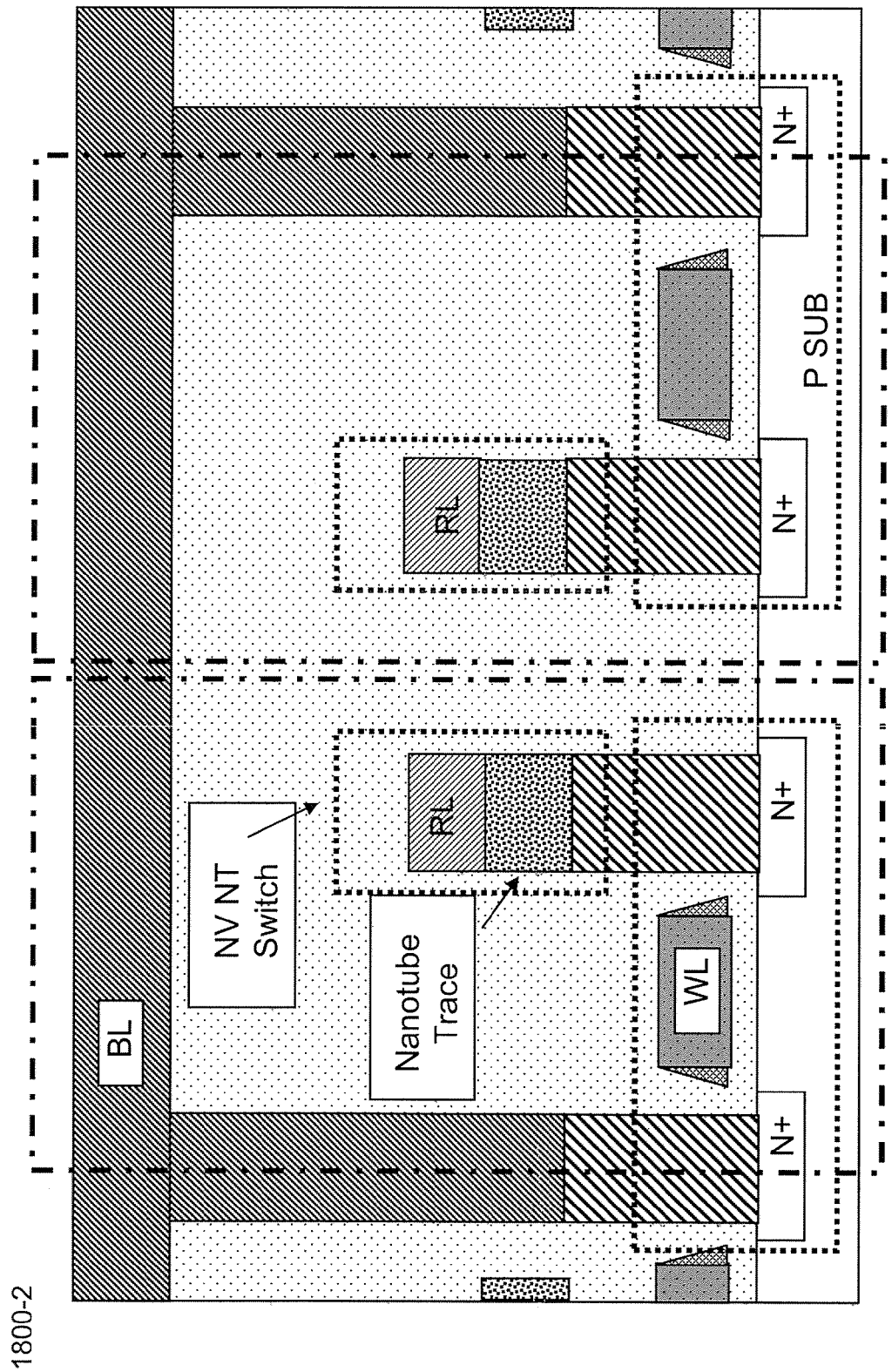
Figure 18C:
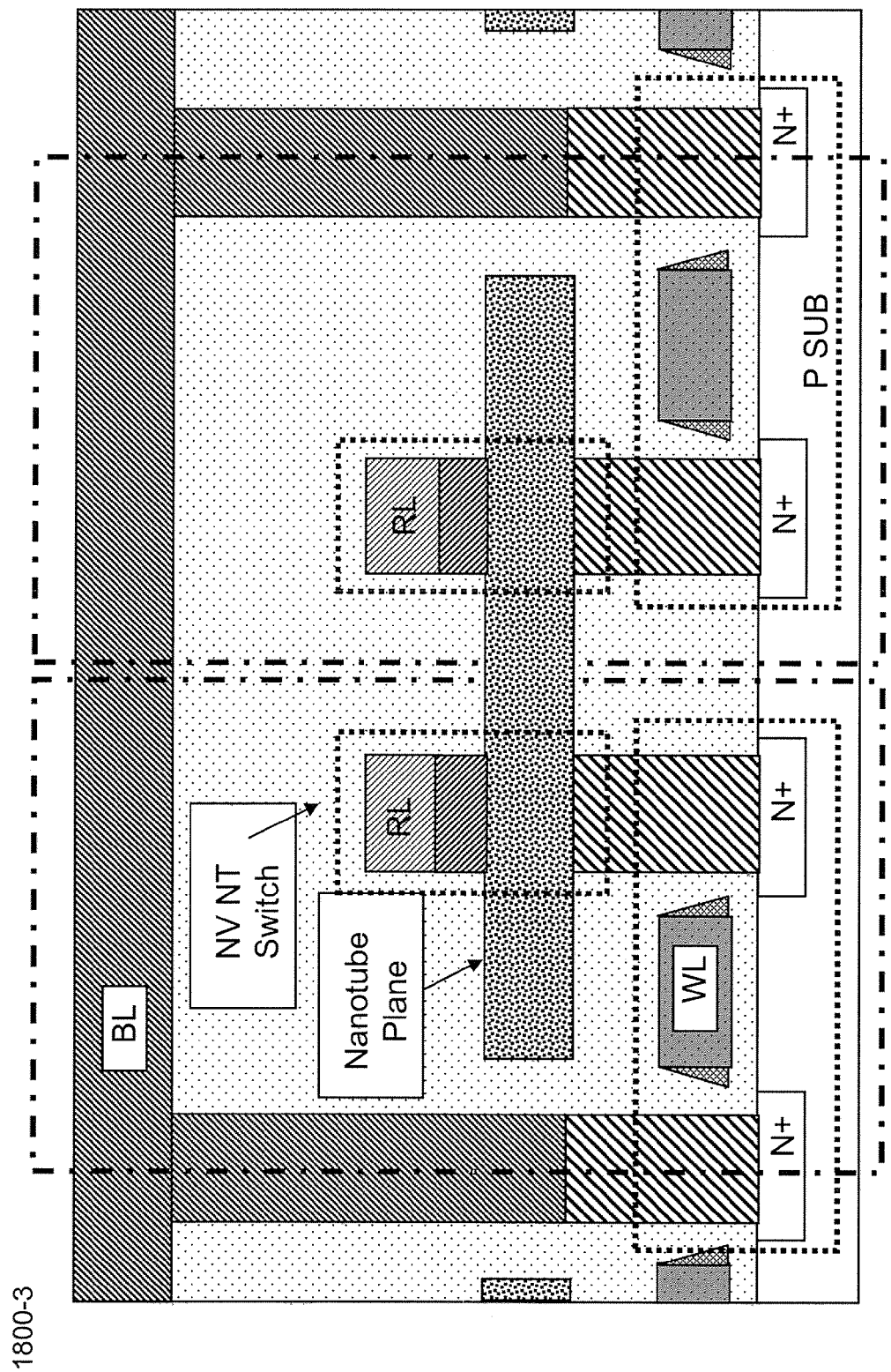

FIGS. 18A-C illustrate cross sectional views of NRAM cells, according to certain embodiments of the invention. FIG. 18A specifically illustrates a cross-sectional view of two adjacent NRAM cells with nonvolatile nanotube blocks (posts) with top and bottom contacts and nanotube below bit line construction. The nanotube-below-bit line construction is described more fully in incorporated reference U.S. patent application Ser. No. 11/835,613.

While FIG. 18A depicts NRAM cross section 1800-1 with discrete nanotube blocks; however nanotube traces could also be used in their place. FIG. 18B specifically illustrates a cross-sectional view 1800-2 of two adjacent NRAM cells with nanotube traces, bottom contacts and top conductor, and nanotube-below-bit line construction. In the present structure, the nanotube traces are arranged to project normally into/out of the surface of the page, parallel with the world lines WL and reference lines RL. In alternate embodiments, the reference line RL could be disposed parallel to the bit line and the nanotube trace could be disposed either parallel to or intersecting with the reference line.

While FIG. 18B depicts nanotube traces, a continuous nanotube plane could be used in their place. FIG. 18C specifically illustrates a cross sectional view 1800-3 of two adjacent NRAM cells with a nanotube plane, bottom contacts and top conductor, and nanotube-below-bit line construction. In the present structure, the nanotube plane is shared between two adjacent bits and extends only partially through the cell. The nanotube plane is broken to allow continuous metal posts on either sides so that the drain of the select transistor may be in electrical communication with the bit lines BL. Other arrangements are also possible. FIG. 18C also illustrates the embodiment in which the reference lines RL and word lines WL are approximately parallel. In other embodiments, the reference line may be arranged to be approximately parallel with the bit lines BL instead.

The present embodiments extend concepts disclosed in the incorporated reference, U.S. patent application Ser. No. 11/835,613, to provide structures having carbon nanotube traces and carbon nanotube planes with orthogonal grid layouts for word and bit lines. These concepts may, furthermore, be extended to obtain memory cell structures that are smaller than $6F^2$ without deviation from the orthogonal grid layout. For example, $5F^2$ cell embodiments are, at the time of this application, possible. At the time of this application, however, the inventors have found that in practice it is extremely difficult to reduce the memory cell size below the $6F^2$ cell area because of tolerances in dimensions and in overlays. Array wiring may place additional limits on the cell size, making structures below the $6F^2$ dimensions impractical. Depending on the embodiment, the TAT advantages of building the nonvolatile nanotube storage device at the end of the process flow may not apply, to certain nanotube-below-bit line structures.

FIG. 19 illustrates an SEM image 1900 of a test structure having a top conductor-on-nanotube layer on bottom conductors, according to certain embodiments of the invention. The SEM image depicts a test structure example of that structure described more generally with reference to FIG. 3. Bottom metal 1 traces (e.g. 320, conductive trace) are disposed in approximately parallel lines. In the present embodiment, the bottom metal 1 traces are inlaid into an oxide substrate. Over the bottom metal traces and substrate is a nanotube fabric layer (e.g. 340, continuous nanotube plane). A top metal 2 trace is disposed over the nanotube fabric layer in an orientation approximately perpendicular to the bottom metal 1 traces, when viewed from above. The top metal 2 traces are patterned using lithographic techniques. Each intersection of bottom metal 1 and top metal 2 traces identifies an active switching region in the nanotube fabric layer, in which the nanotube fabric may be alternately switched between a highly conductive and highly resistive state, between the traces (e.g. along vector normal to image). Testing of the structure has indicated that cell disturbance, between adjacent cells, is largely eliminated, allowing each cell to be independently switched without affecting the state of the adjacent cell.

Figure 20:
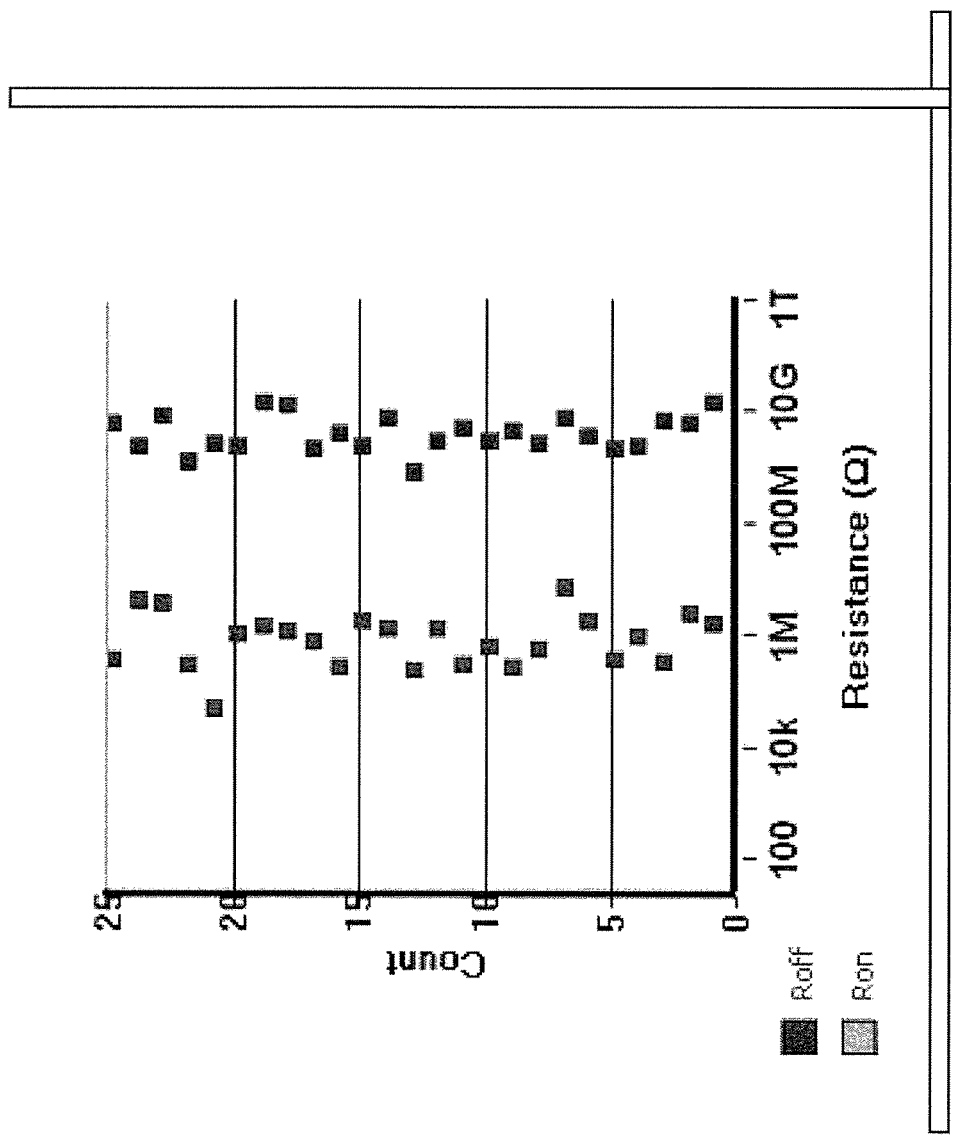
FIG. 20 illustrates a graphical representation of switching characteristics of the structure illustrated in the preceding SEM image, according to certain embodiments of the invention.

FIG. 20 illustrates a graphical representation 2000 of switching characteristics of the structure illustrated in the preceding SEM image, according to certain embodiments of the invention. Test data indicating the switching performance of the test structure illustrated in FIG. 19 confirms that cross-cell disturbance ("cross talk") is largely eliminated. FIG. 20 plots resistance values versus cell count, indicating that each cell is controllably switched between two discrete resistance states. As may be seen in this example, the values denoting an effective ON state cluster around a resistance of 1M-Ohm, as measured between top and bottom traces. And the values denoting an effective OFF state cluster around a resistance of approximately 10 G-Ohm, as measured between top and bottom traces.

Example Fabrication Techniques

Fabrication techniques and processes for forming various NRAM systems, and nanotube blocks are described in great detail in the incorporated references. The following section provides certain variations on these techniques. These techniques are particularly useful for creating the aforementioned high-density structures, in which selected conductor layers (e.g. forming bit lines) are disposed over nanotube planes, traces, and blocks. The fabrication techniques described below may be implemented to form the 6F² density memory cells as well as denser memory structures.

In certain embodiments, an additional material may be used to protect the CNT fabric during fabrication of a nanotube block. Protective materials may be disposed on a surface of a nanotube fabric, permeate a portion of the fabric itself, or provide some combination. In other words, the additional material may be used to protect an exterior surface of a nanotube fabric or may be used to form a CNT composite to preserve or control some features of the CNT fabric during subsequent processing. The additional material may include insulators such as, but not limited to, silicon dioxide, silicon nitride, hafnium oxide, zirconium oxide, and aluminum oxide or sacrificial material such as, but not limited to, amorphous silicon, W, Al, Ti, TiN, Ta, spin-on-glasses (SOGs), thermally decomposed polymers, and photoresists. The additional material may form a composite with the CNTs and be subequently removed such that the original CNT fabric remains. Alternately, this additional material (or a similar additional material) may remain as part of the NV NT block structure. In yet further embodiments, the insulator materials may be used as sacrificial materials and the sacrificial metals may also be used for electrical contacts to the NT Block. The uses of additional materials in the aforementioned ways have several advantages. One advantage is that these techniques provide structural integrity to the CNT layer as dimensions scale. Another advantage is that the techniques may provide performance enhancement to each resultant memory element such as improved yield and/or endurance.

The inventors envision various methods for using this additional material to form a NT NV Block NRAM structures. In one such method, a CNT fabric is deposited and a sacrificial material is applied on top of the fabric and also partially within at least the upper portion of the fabric. Thus the sacrificial material forms an upper layer over the nanotube fabric and partially permeates and upper portion of the fabric. One example of a suitable sacrificial material is amorphous silicon that is conformally deposited by a Plasma Enhanced Chemical Vapor Deposition Technique. To deposit amorphous silicon and achieve this layering, one may, for example, control $SiH_4$ flow between 20-100 sccm, deposition power between 20-100 W, and substrate temperature between 350-450° C. There are other suitable techniques for depositing amorphous silicon.

Any surface material is then removed to expose only the top layers of the CNT fabric. At this point, the additional material primarily remains embedded in the CNT fabric. In certain embodiments, a selective RIE technique that does not alter the properties of the nanotubes may be used. For example, the RIE can entail etching Si selective to CNTs with Chlorine based chemistries or etching Chemical Vapor Deposited (CVD) TiN, CVD W, or Ionized Metal Plasma (IMP) Ti with a $BCl_3/Cl_2$-based chemistry in a capacitively coupled, inductively coupled plasma (ICP), or electron cyclotron resonance (ECR) RIE system.

For the capacitively coupled RIE process, low substrate biases (typically less than 40 W) are generally used to etch the additional material at pressures ranging from several mTorr to hundreds of mTorr. Higher powers will etch the additional material faster; however, the nanotubes are prone to structural, hence, electrical damage. It is well-known in the art that lower pressures will increase the etch rate of the additional material; however, selectivity to nanotubes is improved with higher pressures. For example, amorphous silicon that has been deposited on nanotubes can be etched without damaging the nanotube fabric with a dual step $Cl_2$ etch. The first step employs 45 sccm of $Cl_2$ at 40 W and 100 mTorr to etch most of the silicon. The second step is an over-etch step to finish etching the deposited silicon and remove any residuals through the wafer. This step reduces the RIE bias power to 30 W, drastically reducing the amorphous silicon etch rate. Any potential damage to the NT block fabric can be negated with a high temperature anneal, such as, but not limited to, in a Rapid Thermal Process (RTP) at 600° C. for 1 minute. Variations on the aforementioned techniques are also suitable and envisioned by the inventors.

For the ICP and ECR systems, a critical source power (Ws) to bias power (Wb) ratio is used. Similar to the capacitively coupled systems, low bias powers are desirable; however, source powers between 800-1500 Ws are appropriate for achieving an optimum ion density. An ECR system may provide an additional advantage of increasing the ion density of the etch at similar bias powers to an ICP system. As an example of selective etching in an ICP system, CVD TiN is deposited as the additional material in this embodiment. The upper layer of the CVD TiN is then removed with a selective RIE within the critical source-bias power regime. For this example process, a single etch step is performed at 10 Wb and 800 Ws in 80 sccm $BCl_3$ at 6 mTorr (not a limiting condition). Various other conditions are suitable in certain applications, and are also envisioned. Increased CVD TiN etch rates can be produced by including a $Cl_2$ to the etch chemistry. For etching metals such as CVD W and IMP Ti, a small percentage of a fluorine gas can be incorporated within the etch process.

Next a contact metal is deposited such that it contacts to the exposed CNTs of the NV NT Block. Since certain PVD metal deposition techniques are known to damage CNTs and may not conformally coat the CNTs within the exposed block structure, care must be taken in selecting the appropriate contact metallization. Examples of metallization schemes that do not adversely affect include, but are not limited to, Chemical Vapor Deposited (CVD) TiN, CVD W (non-selective and selective), and Ionized Metal Plasma (IMP) Ti.

The CNT/Metal layer is then patterned and the sacrificial layer may then be removed. For the deposition of CVD TiN, the deposition process requires the alteration of the deposition parameters to reduce or avoid the hydrogen plasma exposure (employed to reduce the organo-metallic precursor) of the CNT fabric. In yet another example, IMP Ti is deposited on the nanotube fabric without damaging the electrical properties of the fabric. With a standard PVD metal deposition process, the bias powers are too high and typically degrade the electrical properties of the CNT fabric. However, adjusting the source to coil power ratio, reducing both the source and coil power, and reducing pressures of an IMP Ti process permits deposition on the CNT fabric.

In another example, CVD W can be deposited selectively or non-selectively on the nanotubes. For a non-selective deposition, a $SiH_4$ soak is performed before exposure to $WF_6$ and once $WF_6$ is introduced into the CVD chamber, either $SiH_4$ or $H_2$ can be employed to deposit W. This process is known in the art. However, a selective CVD W deposition process can be employed that only deposits on the exposed regions of the nanotube fabric and not on the surrounding insulating material. For this processes, the $SiH_4$ soak is not employed or the after the $SiH_4$, the CVD chamber is allowed to pump down to evacuate the $SiH_4$ from the chamber. $WF_6$ plus either $SiH_4$ or $H_2$ is then introduced to selectively deposit CVD W on only the CNT fabric. This process will give a self-aligned metal contact deposition that does not require additional photolithography and etching of the contact metal. A post deposition anneal may also be performed to lower the contact resistance between the metal and CNT fabric and, further, remove any potential structural damage to the CNT fabric which has occurred during processing. The method of metal etching depends on the material and includes techniques well-known in the art. Processing may then continue.

If the additional material is employed as a sacrificial material, then after completing of NV NT block fabrication, the sacrificial material can be removed such as through vapor phase etching of silicon (as described below) or additional dry or wet etch processes to remove the additional material. In yet other embodiments, the inventors envision removing the sacrificial material with a non-etch process such as through thermally decomposing a polymeric sacrificial material such that it outgases thru the dielectric layer or through the formation of intermediate materials such as silicides (as described below).

In another embodiment, an NRAM block structure may be patterned and isolated and an electrical contact to a conducting electrode may be formed without altering the electrical properties of the NRAM block structure. This may be accomplished by depositing a conformal Plasma Enhanced Chemical Vapor Deposition (PECVD) amorphous Si (or poly Si) layer on top of the multilayered nanotube fabric as a hard mask for etching the nanotube fabric and protecting the nanotubes during subsequent processing. To avoid shorting between the upper and lower nanotube contact layers, a high temperature anneal (dependent on the contact electrode) is performed to 1) diffuse the silicon within the multilayered nanotube fabric out of the switching region to form an effective 'void' region for NRAM block switching and 2) form a silicide layer that will electrically contact the nanotube fabric. The void region is an area where essentially no silicon remains within the CNT fabric and the conduction path between contact electrodes is only through the CNT fabric.

It is expected that the deposition of the amorphous Si on top of a nanotube fabric will be highly conformal and may contact the lower electrode through the nanotube fabric, which would short the upper and lower electrodes if the deposited layer is conductive. However, performing an anneal after contacting the silicon with a metal such as W will cause diffusion of the silicon out of the CNT fabric and into the metal layer to form a silicide layer. Note that various other metal contacts may be used to form the silicide layer. Additionally, after deposition and patterning of the amorphous Si and CNT fabric, an insulating layer can be deposited without damaging the electrical properties of the CNT fabric. This is possible because the amorphous Si layer also protects the CNT fabric during the deposition of any insulator materials and/or metal deposited with a CVD or PVD technique. The insulator can then be etched or planarized to permit contact of the amorphous Si to a deposited metal layer. A second metal layer can be deposited to form an interconnect line. After the structure has been formed, an anneal is performed to diffuse the amorphous Si into the W contact to form $WSi_2$, therefore, forming a silicide contact to the nanotube fabric, which may have beneficial properties for reducing the contact resistance of the nanotube fabric because of the high proportion of semiconducting nanotubes in the fabric. It is also envisioned that other contact metals such as, but not limited to, Ti can also be employed to form $TiSi_2$ as long as Si is the diffusing species.

FIG. 21A illustrates an NRAM block structure, according to one embodiment. Structure 2100-1 shows an NRAM block with nanotube fabric 2140 contacting electrodes 2120. Electrodes 2120 are conformally coated with PECVD silicon layer 2145. Metal contact 2130 is deposited on top of silicon layer 2145 and a silicide layer 2150 is formed by an anneal process. During the anneal, conformally coated silicon 2145 diffuses out of nanotube fabric 2140 into metal contact layer 2130. The diffusion of coated silicon layer 2145 creates a void region in the NRAM block that permits switching. Cross-section 2125 of structure 2100-1 is depicted in FIG. 21B.

FIG. 21B illustrates a cross-sectional view of the NRAM block structure depicted in FIG. 21A. Structure 2100-2 is cross-section 2125 which cuts through a single electrode 2140 of NRAM block 2100-1. In structures 2100-1 and 2100-2, the PECVD amorphous silicon is deposited on top of an as-deposited nanotube fabric and is used as a hard mask for patterning the nanotube fabric.

FIG. 22A-B illustrates NRAM block structures, according to another embodiment. In the structures depicted in FIGS. 22A-B, a variation for fabricating the silicide passivated NRAM block is shown, where the nanotube fabric is patterned before deposition of protective silicon layer. In structure 2200-1, patterned nanotube fabric 2240 contacts electrodes 2220. After patterning, protective amorphous silicon contact layer 2245 is deposited over nanotube fabric 2240. Metal contact layer 2230 is then deposited and patterned selective to protective silicon layer 2245. Insulator 2210 is then deposited and planarized, selective to metal contact 2230. Finally, an anneal process is performed to cause diffusion of the silicon layer 2245 into metal layer 2230, forming silicide contact region 2250. The diffusion of coated silicon layer 2245 creates a void in the NRAM block that permits switching Cross section 2225 is depicted in FIG. 22B. FIG. 22B depicts structure 2200-2, corresponding to cross-sectional line 2225 of structure 2200-1.

A benefit of the techniques, described above with referenced to FIGS. 21A-B and 22A-B, is that thinner nanotube layers can be employed when a protective silicon layer is deposited that will form a void in the switching region upon anneal to form the silicide contact. To counter balance any potential shorting between upper and lower contact electrodes and damage to the CNT fabric during the deposition of a contact metal, a >50 nm nanotube fabric is currently used. Typically, it is expected that the upper 20 nm of nanotube fabric will be damaged during metal deposition. In the present embodiment, thin 10-50 nm nanotube fabrics may be deposited because of the protective nature of the conformally deposited silicon. Any shorting of silicon between the upper and lower contact metal will be eliminated during the anneal process to form the void in the switching region and the silicide contacts. Because of the reduced switching length between the contact electrodes, the ON and OFF threshold voltages can be reduced. The resistance of the nanotube fabric will also be reduced because of the drastically reduced conduction length.

The present process utilizes the diffusion of silicon into a metal layer to form a void in the switching region. However, in some designs it is possible to have the metal diffuse into the silicon which will also decrease the dimensions of the NRAM block structure. Various metals may be used. Examples of possible metals are Co to form $CO_2Si$ and Ni to form NiSi or $Ni_2Si$.

In certain embodiments, the voiding behavior at the metal-silicon interface is not expected. This is because only thin layers (<300 Å) of amorphous silicon are sufficient to effectively protect the nanotubes during deposition and etching of insulators and metals. In addition, the thin amorphous silicon layer would be completely consumed during the formation of the silicide and the silicide layer will grow at the expense of the amorphous silicon.

It is expected that the ON Resistance and the ON and OFF threshold voltages for an NRAM block will be drastically reduced with this technique. The threshold voltages are drastically reduced because of the decrease in thickness of the NT block. Because the silicon layer is deposited conformally into the nanotube fabric without damaging the electrical properties of the fabric, the silicon layer can be employed as a protective layer during the deposition of metal contacts and insulator layers. To remove the silicon layer within the NT block, an anneal processes is performed to form a silicide at the contact region, effectively creating a 'void' region in the NT block where only the nanotubes conduct between the contact electrodes.

Insulated Nanotube Blocks

It yet another embodiment, the nanotube fabric of the NT NRAM block can be electrically isolated from close proximity NV NT blocks through the employment of a sacrificial silicon layer and insulator deposition. Similar to the above embodiment, a conformal silicon layer is deposited to protect the nanotube fabric. In contrast to the above embodiment, this process additionally utilizes the silicon layer as a sacrificial material that is eventually removed in part or in its entirety.

FIG. 23A(1) shows a top down view of structure 2300A and FIG. 23A(2) shows a cross-section view of structure 2300A. Structure 2300A may be viewed from above (2300A-1) or viewed cross-sectionally (2300A-2). Structure 2300A includes an NV NT block with lower electrodes 2320 embedded into substrate 2310 and covered with an array of patterned NT blocks 2340 and upper electrodes 2330. The NT-upper metal block 2340 and 2330 has been conformally coated with a thin silicon layer 2350. Typically, silicon layer 2350 will comprise PECVD amorphous silicon layer having a thickness less than or equal to approximately 500 Å. The inventors envision the utilization of other sacrificial layers such as CVD TiN, CVD W, or any material that will conformally coat the CNT fabric without drastically altering the electrical properties of the fabric. For each such material, the thickness of the layer will be modified. It is also possible to deposit the conformal silicon layer 2350 after patterning the nanotube fabric 2340 and before deposition and patterning of the upper electrode 2330. For this case, the silicon layer 2350 protects the nanotube fabric 2340 during deposition of electrode 2330 and a silicide can be formed between 2340 and 2330, as described in the above embodiment.

After the deposition of the conformal, protective silicon layer 2350, the protective and passivating insulator 2315 is deposited. The resulting structure 2300B, after the protective silicon layer and passivating insulator are deposited, is shown in FIG. 23B. FIG. 23B(1) shows a top down perspective of resulting structure 2300B-1 and FIG. 23B(2) shows a cross-sectional perspective of resulting structure 2300B-2. The insulator 2315 may be any insulator such as, but not limited too, silicon dioxide, silicon rich oxide, silicon nitride, and silicon oxynitride. The insulator layer can then be planarized to expose the upper contact metal and portions of the silicon protective layer as shown in FIG. 23C(1) and FIG. 23C(2). Specifically, FIG. 23C(1) shows a top down perspective of structure 2300C-1 and FIG. 23C(2) shows a cross-sectional perspective of structure 2300C-2.

Next, vias 2360 are etched into a second layer of deposited insulator 2317 and the planarized insulator layer 2315. The resulting structure is shown in FIG. 23D. FIG. 23D(1) shows the top down perspective of structure 2300D-1 and FIG. 23D(2) shows a cross-sectional perspective of structure 2300D-2. The vias 2360 are formed by etching down to sacrificial silicon layer 2350. The via patterns can be placed anywhere along the NV NT block array to permit the maximum NV NT block density.

Using either a vapor phase etch such as XeF$_2$ for silicon or a wet etch if other sacrificial materials are utilized, the structure depicted in FIG. 23E may be formed. FIG. 23E(1) shows a top down view of structure 2300E-1 and FIG. 23E(2) shows a cross sectional view of structure 2300E-2. The cross sectional view of structure 2300E-2 shows the removal of the sacrificial material 2350 to form a cavity 2355 surrounding the NV NT block. Once the cavity 2355 is formed, the vias 2360 are backfilled with insulating material 2365. The step of backfilling vias 2360 with insulating material 2365 is demonstrated in FIGS. 23F(1) and 23F(2).

Specifically, FIG. 23F(1) shows a top down view of structure 2300F-1 and a cross-sectional view of structure 2300F-2. The cross-sectional view of structure 2300F-2 illustrates the structure after insulator 2365 is planarized with respect to 2317. As a possible example insulator 2365 consists of silicon dioxide which can be selectively polished to silicon nitride 2317 with a minimal amount of over-polish or dishing.

To form contacts to the upper electrodes, vias 2370 are then etched into insulator 2317, stopping on upper metal 2330. The resultant structure at this stage in the process is depicted in FIG. 23G. Specifically, FIG. 23G(1) shows a top down view of structure 2300G-1 and FIG. 23G(2) shows a cross sectional view of structure 2300G-2 with vias 2370 indicated. An interconnect metal 2375 is then deposited and planarized selective to insulators 2317 and 2365. The resultant structure is illustrated in FIG. 23H. Specifically, FIG. 23H(1) shows a top down view of structure 2300H-1 and FIG. 23H(2) shows a cross sectional view of structure 2300H-2 with planarized interconnect metal 2375. Structures 2300H-1 and 2300H-2B show an NV NT block array that permits a substantially minimum cell size with a substantially maximum cell density. Additionally, the individual NT NV blocks are completely insulated from each other through the deposition of insulator layers on top of a sacrificial material such as amorphous silicon that has been removed to form a cavity around the NV NT blocks in the array.

FIGS. 24A(1) and 24A(2) show top down and cross-section views, respectively, of structures 2400A-1 and 2400A-2. These structures provide yet another embodiment in which nanotube fabric 2440 is disposed over lower electrodes 2420 and insulating substrate 2410. Upper electrodes 2430 may be deposited and patterned on top of nanotube fabric 2440. The inventors also envision the possibility of depositing a blanket conformal amorphous silicon layer before the deposition and patterning of the upper metal electrodes. In this process, the amorphous silicon layer would substantially protect the nanotube fabric during the deposition of the upper metal. The upper metal etch may be performed selective to the amorphous silicon layer. Additionally, the amorphous silicon material can be etched selective to the nanotube fabric without damaging the electrical properties of the nanotube fabric. This may be achieved with a lower bias power chlorine based etch process. After etching of the amorphous silicon layer, a silicide contact can be formed between the NT fabric and metal electrodes, as described above.

To isolate the individual NT blocks, the nanotube areas that are not covered by upper metal electrode 2430 are converted to non-conducting fabric 2445. The resulting structure may be seen in FIG. 24B. FIG. 24B(1) shows a top down view of resulting structure 2400B-1 and FIG. 24B(2) shows a cross-sectional view of resulting structure 2400B-2. In each such view, the converted non-conducting fabric 2445 is illustrated. The conversion of a conducting nanotube fabric to a non-conducting nanotube fabric is described in U.S. patent application Ser. No. 11/398,126, entitled "Nanotube Articles with Adjustable Electrical Characteristics", now U.S. Patent Publ. 2006/0276056, the entire contents of which are herein incorporated by reference.

FIG. 24C shows the completed structure, according to the present embodiment, in which a NV NT block array has been insulated and protected after the deposition and planarization of insulating materials 2415. FIG. 24C(1) shows a top down view of structure 2400C-1 and FIG. 24C(2) shows a cross-sectional view of structure 2400C-2 with planarized insulating material 2415 illustrated. Any encroachment of the insulator material during deposition will only occur in the converted NT fabric region and will not affect the electrical switching of the NV NT blocks.

Amorphous Carbon Layers

In one or more embodiments, an amorphous CNT layer or a high resistance region within the NT Block is used in the construction of NRAM cells to increase the initial resistance of the NV NT Block. In such embodiments, various modifications may be made with the use of the process flow and resultant structures described in detail above and with reference to the preceding figures. NRAM cells may be formed by providing an amorphous carbon layer. Upper metal or dielectric layers may be deposited over the CNT layer and provided such that they do not penetrate into the CNT fabric or have only limited penetration into the CNT fabric. To control the penetration of the metal or dielectric layer into the CNT layer, characteristics of the CNT fabric are controlled.

In certain embodiments, the NV NT blocks may be in the ON state as fabricated. If a substantial population of nanotubes in a given NV NT block directly connect both top and bottom corresponding electrodes, then the initial ON current of that NV NT block may be relatively high. One method of fabricating NV NT blocks reduces the initial as-fabricated ON current. This entails fabricating the NV NT block in at least two separate depositions. Using two or more separate depositions effectively reduces the number of nanotubes that contact both top and bottom electrodes and increases the number of nanotube current flow paths involving nanotube-to-nanotube conduction. This may reduce the after-fabrication current flow and enable an ON-to-OFF transition that does not require current flows in excess of what a steering diode (or a select FET transistor) can deliver during the first ON-to-OFF cycle.

One method of fabricating NV NT blocks reduces the initial as-fabricated ON current. This method entails depositing part of the CNT fabric layer, sacrificial material, and the remainder of the CNT fabric layer in such a fashion that after the removal of the sacrificial layer, a finite gap exists between the first and second parts of the CNT fabric. The gap may range from approximately 1 nm to approximately 20 nm in width. In certain embodiments, that gap may be about 2-5 nm. This fabrication method ensures that the initial state of the memory element after completion of fabrication processing is "open" (or 0). There are certain advantages to ensuring a NRAM cell is fabricated with an initially "open" state. One such advantage of ensuring an open state is that in an initially closed state, the element resistance may be very low. If the access device (MOS or diode or other) has insufficient drive to force the state to "open", then the bit may fail. In typical NRAM elements, more energy is required to go from a closed to open state than from an open to closed state.

The aforementioned gap in the CNT fabric layer may be provided in various ways. One such method entails: depositing the first part of the fabric, subsequently depositing the sacrificial material such that a thin layer remains above the top most CNTs within the fabric, and then depositing the second part of the fabric. A second sacrificial material deposition may be performed at this time if beneficial. For example, it may be beneficial to deposit the second sacrificial material to protect the second part of the fabric during deposition of the upper contact metal and/or during deposition of a protective insulator as described above. Another method entails depositing the first part of the fabric, then depositing the sacrificial material and etching back the surface layers of the sacrificial material to expose the top layers of the CNT fabric. After etching of the lower sacrificial material, a second sacrificial material can be deposited to a controlled thickness. Subsequently, the second part of the CNT fabric is deposited and a top sacrificial material is deposited, if beneficial. The sacrificial materials include those detailed above.

Yet other fabrication methods may be used to reduce the initial as-fabricated ON current of the NV NT blocks. For example, the first part of the CNT fabric may be deposited and then a 'soft' conversion of the upper most layer of the CNT fabric may be performed by exposing with an RIE process (preferably, but not limited too, $Cl_2$, $BCl_3$, $Cl_2/BCl_3$, $CF_4$, $CHF_3$, and $C_4F_8$ chemistries at lower bias powers, high source powers (if applicable), and high pressures). This step effectively functionalizes the CNT fabric, hence, increases the resistance of the exposed portion of the CNT fabric. An etched back sacrificial material can be employed to control the depth of the 'soft' conversion. The etch back and conversion can be performed sequentially, as described, or simultaneously with the appropriate RIE conditions. After the 'soft' conversion, the second part of the fabric is then deposited. The NV NT block should initially be in a higher resistance state (not necessarily in an OFF state); however, upon performing an initial Write cycle, the current flow through the NV NT block removes the functional groups, effectively lowering the resistance of the device.

Individual nanotubes in a NV NT block may be formed using single or multi-walled nanotubes. Nanotube modified surfaces can be derivitized covalently or non-covalently with derivitization molecular or atomic layer or layers. Functional molecular or atomic layer or layers can form a chemical bond to a contact metal such as tungsten and to a carbon atom to reduce resistance values or to enhance reproducible contact resistance values and extend contact life during memory operation. In certain instances it is possible to add a second atomic or molecular layer between tungsten (in this example) and a carbon atom. Functionalization techniques may also be used with other contact materials such as TiN, Ta, etc.

In certain embodiments, a thin oxide layer (thin enough to permit tunneling, for example) may be interposed between a conductor such as tungsten and the nanotubes at or near the NV NT block surface. This thin oxide layer may be used to enhance contact performance and/or yield. In this case, surface functionalization may be achieved using standard chemical surface modification techniques known to those skilled in the art.

Nanotube derivitization may also be used to enhance the switching behavior of the NV NT block. Specifically, nanotube derivitization may be used to modify and control the behavior of the multitude of parallel/series combination of nanoscopic switches that form pathways between top and bottom conductors. Materials described above may be included in the NV NT block to further modify and control the nanoscopic switch behavior.

NV NT blocks and steering diodes may be patterned using commonly used industry methods of masking and trench etching. For scaling to very small dimensions, such as 10 nm or below, approximately parallel nanowires may be used as masks, etching trenches of controlled dimensions. For example, in a memory cell formed with diode steering and a NV NT block storage in series with a vertical orientation, calcium fluoride nanowires deposited on silicon may be used as a mask, etching trenches in a silicon diode and an underlying nanotube layer.

In yet other embodiments, nanowires (nanorods) and nanoparticles of various materials may be used in addition to the carbon nanotubes in NV NT blocks to form insulators and wiring layers, contacts, etc. Examples of nanowires (nanorods) include alumina, bismuth, cadmium, selenide, gallium nitride, gold, gallium phosphide, germanium, silicon, indium phosphide, magnesium oxide, manganese oxide, nickel, palladium, silicon carbide, titanium, zinc oxide and additional mixed nanowires such as silicon germanium or other types which may be coated. Nanowires (nanorods) composed of other materials may also be used. Such nanowires (nanorods) may be included in the NV NT block structure to enhance mechanical strength and/or enhance electrical properties. In yet other embodiments, amorphous carbon may be combined with nanotubes and/or nanowires to provide layers of composite nanomaterials. As described at length in the incorporated references, compositions of nanotube fabrics and layers may be selected to have predominantly one type or a mixed composition of nanotube chirality (metallic and/or semiconducting). Other embodiments are envisioned.

It will be further appreciated that the scope of the present invention is not limited to the above-described embodiments but rather is defined by the appended claims and that these claims will encompass modifications of and improvements to what has been described.

What is claimed is:

1. A nanotube memory array comprising:
   a substrate;
   a first conductor layer disposed on the substrate, the first conductor layer having a defined pattern;
   a nanotube fabric layer disposed over and in electrical communication with the first conductor layer;
   a second conductor layer disposed over, and in electrical communication with the nanotube fabric layer;
   a memory operation circuit including a circuit for generating and applying a select signal on the first and second conductor layers to induce a change in the resistance of the nanotube fabric layer between the first and second conductor layers;
   wherein at least two adjacent memory cells are formed in at least two selected cross sections of the first conductor layer, nanotube fabric layer, and second conductor layer, each memory cell uniquely addressable and programmable by said memory operation circuit, wherein for each memory cell, a change in the resistance between first and second conductor layers corresponds to a change in an informational state of the memory cell;
   wherein the nanotube fabric layer and the second conductor layer are conformally disposed, have a corresponding defined pattern, and form a conductor-on-nanotube trace.

2. The nanotube memory array of claim 1, wherein the first conductor layer comprises a plurality of parallel first conductive traces and the second conductor layer comprises a plurality of parallel second conductive traces.

3. The nanotube memory array of claim 2, wherein the first conductive traces and the second conductive traces are orthogonally disposed with respect to one another.

4. The nanotube memory array of claim 2, wherein the first conductive traces and the second conductive traces are non-orthogonally disposed with respect to another.

5. The nanotube memory array of claim 2, wherein the nanotube fabric layer comprises a plurality of patterned nanotube blocks, each nanotube block interposed between and positioned at a corresponding intersection of one first conductive trace and one second conductive trace.

6. The nanotube memory array of claim 1, wherein the defined pattern of the first conductor layer comprises an array of discrete first electrodes.

7. The nanotube memory array of claim 1, wherein the defined pattern of the first conductor layer comprises a plurality of traces.

8. The nanotube memory array of claim 1, wherein the change in resistance of the nanotube fabric layer comprises a change between a first resistance state and a second resistance state, the first resistance state being a substantially higher resistance than the second resistance state.

9. The nanotube memory array of claim 8, wherein the first resistance state comprises a first information state and the second resistance state comprises a second information state.

10. The nanotube memory array of claim 1, wherein for said at least two adjacent memory cells, a change of resistance in a first memory cell is substantially unaffected by a change of resistance in a second memory cell.

11. The nanotube memory array of claim 1, wherein the nanotube fabric layer comprises a plurality of unaligned nanotubes providing a plurality of conductive pathways through the nanotube fabric layer.

* * * * *